(12) United States Patent
Ohshima et al.

(10) Patent No.: US 9,336,845 B2
(45) Date of Patent: May 10, 2016

(54) REGISTER CIRCUIT INCLUDING A VOLATILE MEMORY AND A NONVOLATILE MEMORY

(75) Inventors: Kazuaki Ohshima, Isehara (JP); Hidetomo Kobayashi, Isehara (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 832 days.

(21) Appl. No.: 13/467,403

(22) Filed: May 9, 2012

(65) Prior Publication Data
US 2012/0294060 A1  Nov. 22, 2012

(30) Foreign Application Priority Data

May 20, 2011  (JP) ................. 2011-114084

(51) Int. Cl.
| | |
|---|---|
| *G11C 5/06* | (2006.01) |
| *G11C 11/00* | (2006.01) |
| *G11C 19/28* | (2006.01) |
| *G11C 11/404* | (2006.01) |

(Continued)

(52) U.S. Cl.
CPC ............ *G11C 11/005* (2013.01); *G11C 11/404* (2013.01); *G11C 14/0009* (2013.01); *G11C 19/287* (2013.01); *H01L 27/1225* (2013.01)

(58) Field of Classification Search
CPC .... G11C 19/287; G11C 19/285; G11C 21/00; G11C 11/412; G11C 11/4125; H01L 27/1104
USPC ............ 365/72, 230.08, 189.06, 189.08, 156, 365/185.08, 189.05
See application file for complete search history.

(56) References Cited

U.S. PATENT DOCUMENTS

| | | | | |
|---|---|---|---|---|
| 3,378,822 A | * | 4/1968 | Kaufman et al. ............. | 365/139 |
| 3,775,693 A | | 11/1973 | Proebsting | |
| 4,328,551 A | | 5/1982 | Yamaura et al. | |

(Continued)

FOREIGN PATENT DOCUMENTS

| | | |
|---|---|---|
| EP | 1447909 A | 8/2004 |
| EP | 1737044 A | 12/2006 |

(Continued)

OTHER PUBLICATIONS

Fortunato.E et al., "Wide-Bandgap High-Mobility ZnO Thin-Film Transistors Produced At Room Temperature,", Appl. Phys. Lett. (Applied Physics Letters) , Sep. 27, 2004, vol. 85, No. 13, pp. 2541-2543.

(Continued)

*Primary Examiner* — Connie Yoha
(74) *Attorney, Agent, or Firm* — Eric J. Robinson; Robinson Intellectual Property Law Office, P.C.

(57) ABSTRACT

A semiconductor device capable of assessing and rewriting data at a desired timing is provided. A semiconductor device includes a register circuit, a bit line, and a data line. The register circuit includes a flip-flop circuit, a selection circuit, and a nonvolatile memory circuit electrically connected to the flip-flop circuit through the selection circuit. The data line is electrically connected to the flip-flop circuit. The bit line is electrically connected to the nonvolatile memory circuit through the selection circuit. The selection circuit selectively stores data based on a potential of the data line or a potential of the bit line in the nonvolatile memory circuit.

12 Claims, 24 Drawing Sheets

(51) Int. Cl.
  *G11C 14/00*   (2006.01)
  *H01L 27/12*   (2006.01)

(56) References Cited

U.S. PATENT DOCUMENTS

| | | | |
|---|---|---|---|
| 4,656,607 A | 4/1987 | Hagiwara et al. | |
| 4,797,576 A | 1/1989 | Asazawa | |
| 4,800,303 A | 1/1989 | Graham et al. | |
| 4,809,225 A | 2/1989 | Dimmler et al. | |
| 5,039,883 A | 8/1991 | On | |
| 5,473,571 A | 12/1995 | Shigematsu et al. | |
| 5,576,997 A * | 11/1996 | Masuda et al. | 365/189.04 |
| 5,726,930 A * | 3/1998 | Hasegawa et al. | 365/145 |
| 5,731,856 A | 3/1998 | Kim et al. | |
| 5,744,864 A | 4/1998 | Cillessen et al. | |
| 5,751,627 A | 5/1998 | Ooishi | |
| 5,980,092 A | 11/1999 | Merryman et al. | |
| 6,049,883 A | 4/2000 | Tjandrasuwita | |
| 6,078,194 A | 6/2000 | Lee | |
| 6,127,702 A | 10/2000 | Yamazaki et al. | |
| 6,204,695 B1 | 3/2001 | Alfke et al. | |
| 6,281,710 B1 | 8/2001 | Poirier et al. | |
| 6,294,274 B1 | 9/2001 | Kawazoe et al. | |
| 6,563,174 B2 | 5/2003 | Kawasaki et al. | |
| 6,573,754 B2 | 6/2003 | Menczigar et al. | |
| 6,576,943 B1 | 6/2003 | Ishii et al. | |
| 6,727,522 B1 | 4/2004 | Kawasaki et al. | |
| 6,738,281 B2 | 5/2004 | Yokozeki | |
| 6,788,567 B2 | 9/2004 | Fujimori | |
| 6,809,952 B2 | 10/2004 | Masui | |
| 6,845,032 B2 | 1/2005 | Toyoda et al. | |
| 6,876,023 B2 | 4/2005 | Ishii et al. | |
| 6,944,045 B2 | 9/2005 | Fujimori | |
| 6,972,986 B2 | 12/2005 | Peng et al. | |
| 7,049,190 B2 | 5/2006 | Takeda et al. | |
| 7,061,014 B2 | 6/2006 | Hosono et al. | |
| 7,064,346 B2 | 6/2006 | Kawasaki et al. | |
| 7,064,973 B2 | 6/2006 | Peng et al. | |
| 7,076,748 B2 | 7/2006 | Kapoor et al. | |
| 7,105,868 B2 | 9/2006 | Nause et al. | |
| 7,211,825 B2 | 5/2007 | Shih et al. | |
| 7,282,782 B2 | 10/2007 | Hoffman et al. | |
| 7,297,977 B2 | 11/2007 | Hoffman et al. | |
| 7,323,356 B2 | 1/2008 | Hosono et al. | |
| 7,385,224 B2 | 6/2008 | Ishii et al. | |
| 7,402,506 B2 | 7/2008 | Levy et al. | |
| 7,411,209 B2 | 8/2008 | Endo et al. | |
| 7,453,065 B2 | 11/2008 | Saito et al. | |
| 7,453,087 B2 | 11/2008 | Iwasaki | |
| 7,462,862 B2 | 12/2008 | Hoffman et al. | |
| 7,468,304 B2 | 12/2008 | Kaji et al. | |
| 7,486,542 B2 | 2/2009 | Sato et al. | |
| 7,501,293 B2 | 3/2009 | Ito et al. | |
| 7,576,582 B2 | 8/2009 | Lee et al. | |
| 7,616,040 B2 | 11/2009 | Motomura | |
| 7,674,650 B2 | 3/2010 | Akimoto et al. | |
| 7,732,819 B2 | 6/2010 | Akimoto et al. | |
| 7,863,611 B2 | 1/2011 | Abe et al. | |
| 8,410,838 B2 | 4/2013 | Kato et al. | |
| 8,432,187 B2 | 4/2013 | Kato et al. | |
| 8,582,349 B2 | 11/2013 | Yamazaki et al. | |
| 8,593,856 B2 | 11/2013 | Koyama et al. | |
| 8,614,916 B2 | 12/2013 | Nagatsuka et al. | |
| 8,787,084 B2 | 7/2014 | Ohmaru | |
| 8,854,867 B2 | 10/2014 | Takemura | |
| 9,076,520 B2 | 7/2015 | Ohmaru | |
| 2001/0046027 A1 | 11/2001 | Tai et al. | |
| 2002/0036529 A1 | 3/2002 | Furusawa et al. | |
| 2002/0056838 A1 | 5/2002 | Ogawa | |
| 2002/0074568 A1 | 6/2002 | Yoshida et al. | |
| 2002/0132454 A1 | 9/2002 | Ohtsu et al. | |
| 2003/0099132 A1 * | 5/2003 | Ooishi et al. | 365/185.09 |
| 2003/0189401 A1 | 10/2003 | Kido et al. | |
| 2003/0218222 A1 | 11/2003 | Wager et al. | |
| 2004/0038446 A1 | 2/2004 | Takeda et al. | |
| 2004/0071039 A1 | 4/2004 | Fujimori | |
| 2004/0127038 A1 | 7/2004 | Carcia et al. | |
| 2004/0164778 A1 | 8/2004 | Toyoda et al. | |
| 2005/0017302 A1 | 1/2005 | Hoffman | |
| 2005/0088869 A1 * | 4/2005 | Kang | 365/145 |
| 2005/0169039 A1 | 8/2005 | Peng et al. | |
| 2005/0169040 A1 | 8/2005 | Peng et al. | |
| 2005/0199959 A1 | 9/2005 | Chiang et al. | |
| 2005/0205921 A1 | 9/2005 | Ishii et al. | |
| 2006/0035452 A1 | 2/2006 | Carcia et al. | |
| 2006/0038582 A1 | 2/2006 | Peeters | |
| 2006/0043377 A1 | 3/2006 | Hoffman et al. | |
| 2006/0091793 A1 | 5/2006 | Baude et al. | |
| 2006/0095975 A1 | 5/2006 | Yamada et al. | |
| 2006/0108529 A1 | 5/2006 | Saito et al. | |
| 2006/0108636 A1 | 5/2006 | Sano et al. | |
| 2006/0110867 A1 | 5/2006 | Yabuta et al. | |
| 2006/0113536 A1 | 6/2006 | Kumomi et al. | |
| 2006/0113539 A1 | 6/2006 | Sano et al. | |
| 2006/0113549 A1 | 6/2006 | Den et al. | |
| 2006/0113565 A1 | 6/2006 | Abe et al. | |
| 2006/0119394 A1 | 6/2006 | Dronavalli | |
| 2006/0169973 A1 | 8/2006 | Isa et al. | |
| 2006/0170111 A1 | 8/2006 | Isa et al. | |
| 2006/0197092 A1 | 9/2006 | Hoffman et al. | |
| 2006/0208977 A1 | 9/2006 | Kimura | |
| 2006/0228974 A1 | 10/2006 | Thelss et al. | |
| 2006/0231882 A1 | 10/2006 | Kim et al. | |
| 2006/0238135 A1 | 10/2006 | Kimura | |
| 2006/0244107 A1 | 11/2006 | Sugihara et al. | |
| 2006/0284171 A1 | 12/2006 | Levy et al. | |
| 2006/0284172 A1 | 12/2006 | Ishii | |
| 2006/0292777 A1 | 12/2006 | Dunbar | |
| 2007/0024187 A1 | 2/2007 | Shin et al. | |
| 2007/0024318 A1 | 2/2007 | Mamidipaka | |
| 2007/0046191 A1 | 3/2007 | Saito | |
| 2007/0052025 A1 | 3/2007 | Yabuta | |
| 2007/0054507 A1 | 3/2007 | Kaji et al. | |
| 2007/0090365 A1 | 4/2007 | Hayashi et al. | |
| 2007/0108446 A1 | 5/2007 | Akimoto | |
| 2007/0152217 A1 | 7/2007 | Lai et al. | |
| 2007/0172591 A1 | 7/2007 | Seo et al. | |
| 2007/0187678 A1 | 8/2007 | Hirao et al. | |
| 2007/0187760 A1 | 8/2007 | Furuta et al. | |
| 2007/0194379 A1 | 8/2007 | Hosono et al. | |
| 2007/0252928 A1 | 11/2007 | Ito et al. | |
| 2007/0272922 A1 | 11/2007 | Kim et al. | |
| 2007/0287296 A1 | 12/2007 | Chang | |
| 2008/0006877 A1 | 1/2008 | Mardilovich et al. | |
| 2008/0038882 A1 | 2/2008 | Takechi et al. | |
| 2008/0038929 A1 | 2/2008 | Chang | |
| 2008/0048744 A1 | 2/2008 | Fukuoka | |
| 2008/0050595 A1 | 2/2008 | Nakagawara et al. | |
| 2008/0073653 A1 | 3/2008 | Iwasaki | |
| 2008/0083950 A1 | 4/2008 | Pan et al. | |
| 2008/0106191 A1 | 5/2008 | Kawase | |
| 2008/0128689 A1 | 6/2008 | Lee et al. | |
| 2008/0129195 A1 | 6/2008 | Ishizaki et al. | |
| 2008/0166834 A1 | 7/2008 | Kim et al. | |
| 2008/0182358 A1 | 7/2008 | Cowdery-Corvan et al. | |
| 2008/0197414 A1 | 8/2008 | Hoffman et al. | |
| 2008/0224133 A1 | 9/2008 | Park et al. | |
| 2008/0254569 A1 | 10/2008 | Hoffman et al. | |
| 2008/0258139 A1 | 10/2008 | Ito et al. | |
| 2008/0258140 A1 | 10/2008 | Lee et al. | |
| 2008/0258141 A1 | 10/2008 | Park et al. | |
| 2008/0258143 A1 | 10/2008 | Kim et al. | |
| 2008/0258789 A1 | 10/2008 | Motomura | |
| 2008/0296568 A1 | 12/2008 | Ryu et al. | |
| 2009/0002044 A1 | 1/2009 | Kobayashi | |
| 2009/0068773 A1 | 3/2009 | Lai et al. | |
| 2009/0073325 A1 | 3/2009 | Kuwabara et al. | |
| 2009/0114910 A1 | 5/2009 | Chang | |
| 2009/0134399 A1 | 5/2009 | Sakakura et al. | |
| 2009/0152506 A1 | 6/2009 | Umeda et al. | |
| 2009/0152541 A1 | 6/2009 | Maekawa et al. | |
| 2009/0210731 A1 | 8/2009 | Lakkapragada et al. | |
| 2009/0278122 A1 | 11/2009 | Hosono et al. | |
| 2009/0280600 A1 | 11/2009 | Hosono et al. | |

(56) References Cited

U.S. PATENT DOCUMENTS

| | | | |
|---|---|---|---|
| 2010/0019839 A1 | 1/2010 | Monden | |
| 2010/0065844 A1 | 3/2010 | Tokunaga | |
| 2010/0092800 A1 | 4/2010 | Itagaki et al. | |
| 2010/0109002 A1 | 5/2010 | Itagaki et al. | |
| 2010/0148171 A1 | 6/2010 | Hayashi et al. | |
| 2011/0010493 A1 | 1/2011 | Kimura et al. | |
| 2011/0024741 A1 | 2/2011 | Abe et al. | |
| 2011/0084731 A1 | 4/2011 | Kawae | |
| 2011/0089975 A1 | 4/2011 | Yamazaki et al. | |
| 2011/0102018 A1 | 5/2011 | Shionoiri et al. | |
| 2011/0121878 A1 | 5/2011 | Kato et al. | |
| 2011/0148463 A1 | 6/2011 | Kato et al. | |
| 2011/0187410 A1 | 8/2011 | Kato et al. | |
| 2012/0243340 A1 | 9/2012 | Kobayashi et al. | |
| 2012/0268164 A1 | 10/2012 | Kobayashi et al. | |
| 2012/0269013 A1 | 10/2012 | Matsuzaki | |
| 2013/0191673 A1 | 7/2013 | Koyama et al. | |
| 2013/0223135 A1 | 8/2013 | Koyama | |
| 2014/0328124 A1 | 11/2014 | Ohmaru | |

FOREIGN PATENT DOCUMENTS

| | | |
|---|---|---|
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 07-154228 A | 6/1995 |
| JP | 08-180672 A | 7/1996 |
| JP | 08-264794 A | 10/1996 |
| JP | 10-078836 | 3/1998 |
| JP | 10-078836 A | 3/1998 |
| JP | 11-505377 | 5/1999 |
| JP | 2000-044236 A | 2/2000 |
| JP | 2000-077982 A | 3/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-305027 A | 11/2007 |
| JP | 2010-282721 A | 12/2010 |
| JP | 2012-257200 A | 12/2012 |
| WO | WO-03/044953 | 5/2003 |
| WO | WO-2004/114391 | 12/2004 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium of Technical Papers, 2004, vol. 35, pp. 860-893.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters), Jun. 26, 2007, vol. 90, No. 26, pp. 262106-1-262106-3.

Takahashi.M et al., "Theoretical Analysis of IgZo Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08: SID International Symposium digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the In2O3—Ga2ZnO4—ZnO system at 1350°C,", Journal of Solid State Chemistry, Aug. 1, 1981, vol. 93, No. 2, pp. 298-315.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (M=7, 8, 9, and 16) in the In2O3—ZnGa2O4—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N. et al., "Crystallization and Reduction of Sol-Gel-Derived Zinc Oxide Films by Irradiation with Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID Digest '09 : SID International Symposium Digest of Technical Papers, May 31, 2009, pp. 184-187.

Nomura.K et al., "Carrier transport in transparent oxide semiconductor with intrinsic structural randomness probed using single-crystalline InGaO3(ZnO)5 films,", Appl. Phys. Lett. (Applied Physics Letters) , Sep. 13, 2004, vol. 85, No. 11, pp. 1993-1995.

Li.C et al., "Modulated Structures of Homologous Compounds InMO3(ZnO)m (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO (Ga2O3—In2O3—ZnO) TFT,", SID Digest '08 : SID International Symposium Digest of Technical Papers, May 20, 2008, vol. 39, pp. 633-636.

Lee.J et al., "World's Largest (15-inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing MOO3 as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium-Gallium-Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

(56) References Cited

OTHER PUBLICATIONS

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back Plane,", SID Digest '09 : SID International Symposium Digest of Technical Papers, May 31, 2009, pp. 280-283.

Lee.M et al., "15.4:Excellent Performance of Indium-Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-in. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium-Gallium-Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by PEALD Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDS,", Journal of the SID, 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 in. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "Suftla Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura.M, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 2, 2002, vol. 1, pp. 64-68.

Kimizuka.N. et al., "Spinel,YBFE2O4, and YB2FE3O7 Types of Structures for Compounds in the In2O3 and Sc2O3—A2O3—Bo Systems [A; Fe, Ga, or Al; B: Mg Mn, Fe, Ni, Cu, or Zn] at Temperatures over 1000°C,", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AMOLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), Oct. 4, 2007, vol. 76, No. 16, pp. 165202-1-165202-22.

Park.J et al., "Electronic Transport Properties of Amorphous Indium-Gallium-Zinc Oxide Semiconductor upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B. (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317, ECS.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

(56) References Cited

OTHER PUBLICATIONS

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Kamiya et al., "Carrier Transport Properties and Electronic Structures of Amorphous Oxide Semiconductors: the present status," Solid State Physics, Sep. 1, 2009, vol. 44, No. 9, pp. 621-633, Agne Gijutsu Center.

Jeon et al., "180nm Gate Length Amorphous InGaZnO Thin Film Transistor for High Density Image Sensor Applications," IEDM 10: Technical Digest of International Electron Devices Meeting, Dec. 6, 2010, pp. 504-507.

Ishii et al., "A Poly-Silicon TFT With a Sub-5-nm Thick Channel for Low-Power Gain Cell Memory in Mobile Applications," IEEE Transactions on Electron Devices, Nov. 1, 2004, vol. 51, No. 11, pp. 1805-1810.

Shukuri, "A Semi-Static Complementary Gain Cell Technology for Sub-1 V Supply DRAM's," IEEE Transactions on Electron Devices, Jun. 1, 1994, vol. 41, No. 6, pp. 926-931.

Kim et al., "An Experimental High-Density DRAM Cell with a Built-in Gain Stage," IEEE Journal of Solid-State Circuits, Aug. 1, 1994, vol. 29, No. 8, pp. 978-981.

Shukuri et al., "A Complementary Gain Cell Technology for Sub-1V Supply DRAMs," IEDM 92: Technical Digest of International Electron Devices Meeting, Dec. 13, 1992, pp. 1006-1008.

* cited by examiner

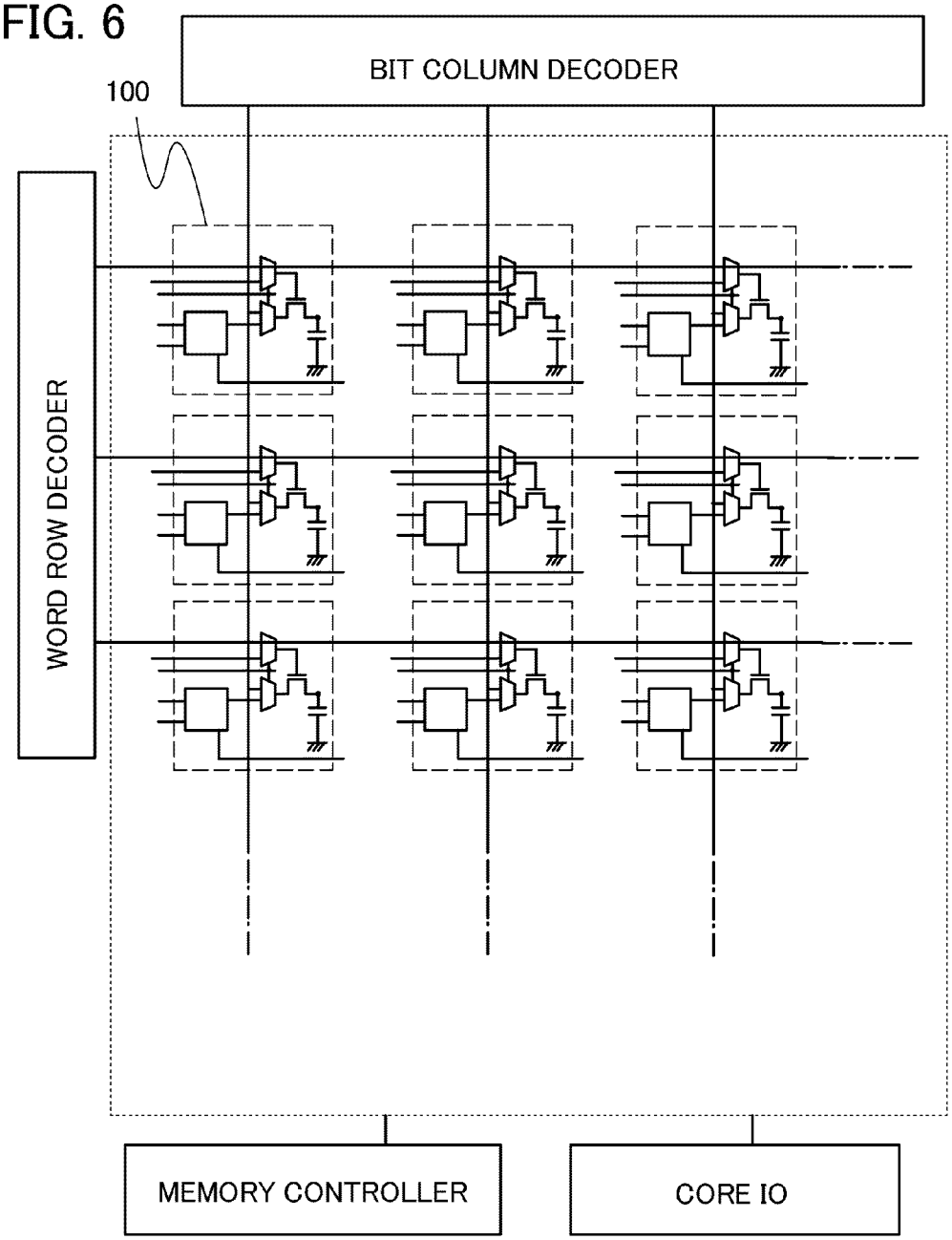

● In
○ Sn
∘ Zn
• O

FIG. 9A
FIG. 9B
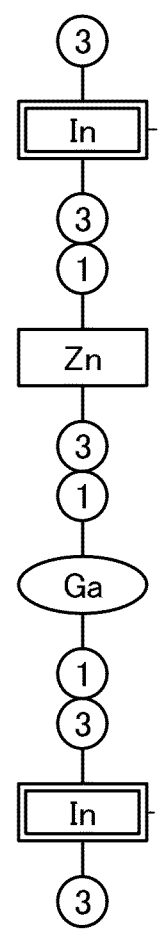
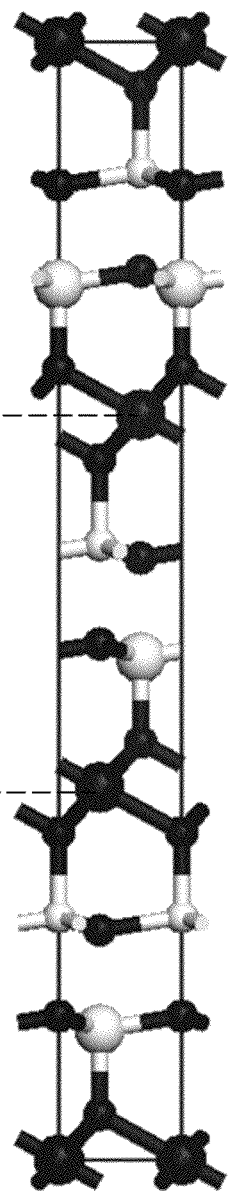
FIG. 9C
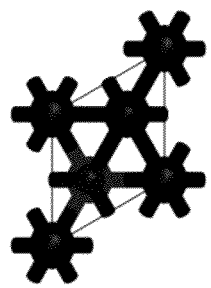
● In
○ Ga
◦ Zn
• O

- In
- Ga or Zn
- O

- In
- Ga
- Zn
- O

REGISTER CIRCUIT INCLUDING A VOLATILE MEMORY AND A NONVOLATILE MEMORY

BACKGROUND OF THE INVENTION

1. Field of the Invention

The present invention relates to a semiconductor device and a method for driving the semiconductor device.

2. Description of the Related Art

Signal processing circuits such as central processing units (CPUs) vary in configuration depending on the intended use. A signal processing circuit generally has a main memory for storing data or program and other memory units such as a register and a cache memory. A register has a function of temporarily holding data for carrying out arithmetic processing, holding a program execution state, or the like. In addition, a cache memory is located between an arithmetic circuit and a main memory in order to reduce access to the main memory and speed up the arithmetic processing.

A memory device such as a register or a cache memory needs to write data at higher speed than a main memory. For this reason, in general, a flip-flop circuit or the like is used as a register, while a static random access memory (SRAM) or the like is used as a cache memory. In other words, a volatile memory circuit is used as such a register, a cache memory, or the like. Data in the volatile memory is lost when supply of a power supply voltage is stopped.

In order to reduce power consumption, a method for temporarily stopping supply of a power supply voltage to a signal processing circuit in a period during which data is not input and output has been suggested. In the method, a nonvolatile memory device is located in the periphery of a volatile memory device such as a register or a cache memory, so that the data is temporarily stored in the nonvolatile memory device. Thus, data stored in the register, the cache memory, or the like can be held even while supply of power supply voltage is stopped in the signal processing circuit (for example, see Patent Document 1).

In addition, in the case where supply of a power supply voltage is stopped for a long time in a signal processing circuit, data in a volatile memory device is transferred to an external memory device such as a hard disk or a flash memory before the supply of the power supply voltage is stopped, so that the data can be prevented from being lost.

REFERENCE

[Patent Document 1] Japanese Published Patent Application No. H10-078836

SUMMARY OF THE INVENTION

As described above, in the case of providing an external memory device for storing data while supply of a power supply voltage is stopped, there is a problem in that it takes time to write data from a signal processing circuit to the external memory device, which is not suitable for a short-time stop of power supply.

In addition, in the case where data in the signal processing circuit has problems, it takes time to assess and rewrite the data, so that the signal processing circuit cannot rapidly return from a state in which the supply of power supply voltage is stopped.

In view of the above, an object is to provide a semiconductor device capable of transferring data of a signal processing circuit to a nonvolatile memory device at high speed, stopping supply of power with high frequency, and therefore reducing the power consumption. Further, another object is to provide a semiconductor device capable of assessing and rewiring data at a desired timing.

A nonvolatile memory circuit is provided for each flip-flop circuit included in a semiconductor device. Data is transmitted and received between the flip-flop circuit and the nonvolatile memory circuit, whereby data can be transferred at high speed. In addition, the nonvolatile memory circuit is provided with a wiring which directly writes and reads data to/from the nonvolatile memory circuit, so that data stored in the semiconductor device can be assessed and rewritten through the wiring at a desired timing.

One embodiment of the present invention is a semiconductor device which includes a register circuit including a flip-flop circuit, a selection circuit, and a nonvolatile memory circuit electrically connected to the flip-flop circuit through the selection circuit; a bit line; and a data line. The data line is electrically connected to the flip-flop circuit. The bit line is electrically connected to the nonvolatile memory circuit through the selection circuit. The selection circuit selectively stores data, which is based on a potential of the data line or a potential of the bit line, in the nonvolatile memory circuit.

Another embodiment of the present invention is a semiconductor device which includes a register circuit including a flip-flop circuit, a selection circuit, and a nonvolatile memory circuit electrically connected to the flip-flop circuit through the selection circuit; a bit line; a data line; a word line; and a memory write enable line. The word line and the memory write enable line are electrically connected to the selection circuit. The data line is electrically connected to the flip-flop circuit. The bit line is electrically connected to the nonvolatile memory circuit through the selection circuit. The selection circuit includes a first switch for determining electrical connection between the nonvolatile memory circuit and the word line or the memory write enable line, and a second switch for determining electrical connection between the nonvolatile memory circuit and the data line or the bit line.

Another embodiment of the present invention is a semiconductor device including a plurality of register circuits provided in a matrix, a bit line, and a data line. Each of the register circuits includes a flip-flop circuit, a selection circuit, and a nonvolatile memory circuit electrically connected to the flip-flop circuit through the selection circuit. The data line is electrically connected to the flip-flop circuit. The bit line is electrically connected to the nonvolatile memory circuit through the selection circuit. The selection circuit selectively stores data, which is based on a potential of the data line or a potential of the bit line, in the nonvolatile memory circuit.

Still another embodiment of the present invention is a semiconductor device including a plurality of register circuits provided in a matrix, a bit line, a data line, a word line, and a memory write enable line. Each of the register circuits includes a flip-flop circuit, a selection circuit, and a nonvolatile memory circuit electrically connected to the flip-flop circuit through the selection circuit. The word line and the memory write enable line are electrically connected to the selection circuit. The data line is electrically connected to the flip-flop circuit. The bit line is electrically connected to the nonvolatile memory circuit through the selection circuit. The selection circuit includes a first switch for determining electrical connection between the nonvolatile memory circuit and the word line or the memory write enable line, and a second switch for determining electrical connection between the nonvolatile memory circuit and the data line or the bit line.

The selection circuit used in the semiconductor device of one embodiment of the present invention selects any of a first operation mode for storing data based on a potential of the data line in the nonvolatile memory circuit through the flip-flop circuit, a second operation mode for inputting data stored in the nonvolatile memory circuit to the flip-flop circuit, a third operation mode for storing data based on the bit line in the nonvolatile memory circuit, and a fourth operation mode for inputting data stored in the nonvolatile memory circuit to the bit line.

The nonvolatile memory circuit used in the semiconductor device of one embodiment of the present invention is a semiconductor device which includes a transistor including an oxide semiconductor in a channel formation region and a capacitor including one electrode electrically connected to a first electrode of the transistor and the other electrode that is grounded. A potential of the data line or a potential of the bit line is stored in a node where the first electrode of the transistor and the one electrode of the capacitor are electrically connected to each other.

A semiconductor device with low power consumption can be provided. In the semiconductor device, a nonvolatile memory circuit is provided for each flip-flop circuit included in a register circuit, and data can be stored even when supply of power is stopped; therefore, power comsumption can be reduced. Further, with a wiring for directly transmitting and receiving data between the nonvolatile memory circuit and an external portion of the register circuit, the semiconductor device can assess and rewrite data at a desired timing.

BRIEF DESCRIPTION OF THE DRAWINGS

FIG. 6 is a diagram of a semiconductor device that is one embodiment of the present invention.

FIGS. 9A to 9C are diagrams of a crystal structure of an oxide material which can be used for a transistor.

DETAILED DESCRIPTION OF THE INVENTION

Figure 1A:
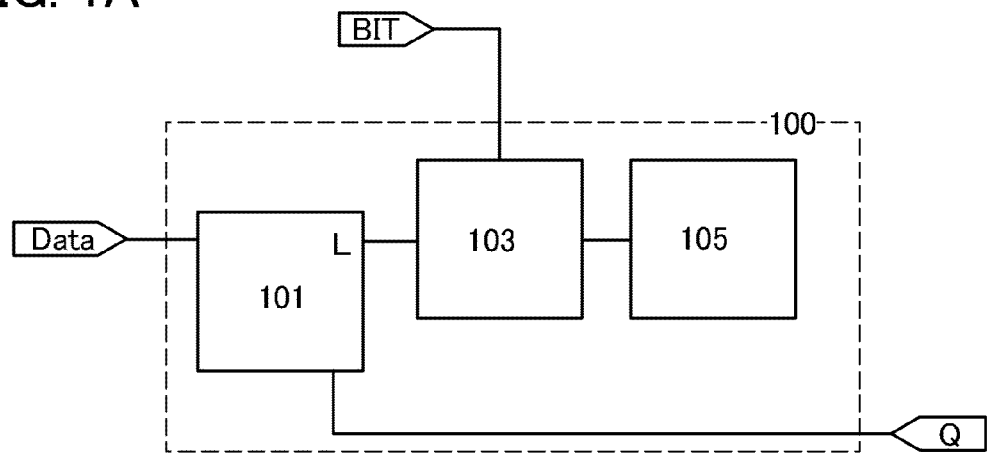
FIGS. 1A and 1B are diagrams of a semiconductor device that is one embodiment of the present invention.

Hereinafter, embodiments of the present invention will be described in detail with reference to the accompanying drawings. Note that the present invention is not limited to the description below, and it is easily understood by those skilled in the art that various changes and modifications can be made without departing from the spirit and scope of the invention. Therefore, the present invention should not be limited to the descriptions of the embodiments below. Note that in structures of the invention described below, the same portions or portions having similar functions are denoted by the same reference numerals in different drawings, and description thereof is not repeated.

Note that in each drawing described in this specification, the size, the layer thickness, or the region of each component is exaggerated for clarity in some cases. Therefore, embodiments of the present invention are not limited to such scales.

Note that in this specification and the like, the term "electrically connected" includes the case where components are connected through an "object having any electric function". There is no particular limitation on an "object having any electric function" as long as electric signals can be transmitted and received between components that are connected through the object. Examples of an "object having any electric function" include a switching element such as a transistor, a resistor, a coil, a capacitor, and an element with a variety of functions in addition to an electrode and a wiring.

Note that voltage generally refers to a difference between potentials at two points (also referred to as a potential difference). However, levels of voltage and potentials are represented using volt (V) in a circuit diagram or the like in some cases, so that it is difficult to discriminate between them. This is why in this specification, a potential difference between a potential at one point and a potential to be the reference (also referred to as the reference potential) is used as voltage at the point in some cases.

Functions of a source and a drain might interchange when a transistor of opposite polarity is used or the direction of current flow is changed in circuit operation, for example. Therefore, the terms "source" and "drain" can interchange in this specification. In this specification and the like, one of a source and a drain of a transistor is referred to as a "first electrode" and the other of the source and the drain is referred to as a "second electrode" in some cases.

Embodiment 1

In this embodiment, a semiconductor device of one embodiment of the present invention will be described.

<Basic Circuit>

First, one mode of a register circuit that is a semiconductor device in this embodiment and the operation thereof will be described. FIG. 1A is a block diagram of the register circuit. A register circuit 100 shown in FIG. 1A includes a flip-flop circuit 101, a selection circuit 103, and a nonvolatile memory circuit 105. In FIG. 1A, a data line (Data) is electrically connected to the flip-flop circuit 101 and a bit line (BIT) is electrically connected to the nonvolatile memory circuit 105 through the selection circuit 103. The flip-flop circuit 101 is electrically connected to an output signal line (Q).

A potential of the data line (Data) is input to the flip-flop circuit 101. The flip-flop circuit 101 stores data corresponding to the input potential as its internal state and outputs the data to an external portion through the output signal line (Q).

Note that data corresponding to a potential means a 1-bit data with a potential corresponding to data "1" or "0". Either of two different potentials is selectively supplied and one of the potentials (e.g., high potential or high level) is made to correspond to data "1" and the other of the potentials (e.g., low potential or low level) is made to correspond to data "0". Further, a potential may be selected from three or more different potentials so that multivalued (multi-bit) data is written, which results in an increase in the memory capacity of the semiconductor device.

In general, a flip-flop circuit includes at least two arithmetic circuits. The flip-flop circuit can have a configuration with a feedback loop in which output of one arithmetic circuit is input to the other arithmetic circuit and output of the other arithmetic circuit is input to the one arithmetic circuit. Thus, the flip-flop circuit is a volatile memory circuit that stores and outputs data corresponding to a potential input from the data line (Data). In the register circuit 100, output of the flip-flop circuit 101 is input to the selection circuit 103.

Output of the flip-flop circuit 101 and a potential of the bit line (BIT) are input to the selection circuit 103. An output terminal of the selection circuit 103 is electrically connected to an input terminal of the nonvolatile memory circuit 105. The nonvolatile memory circuit 105 transmits and receives data to/from the flip-flop circuit 101 or the bit line (BIT) depending on the operation mode selected by the selection circuit 103.

Here, description will be given of the operation modes of the semiconductor device which are selected by the selection circuit 103.

The selection circuit 103 selects one of four operation modes of the semiconductor device. The four operation modes are a first operation mode for storing data based on a potential of the data line (Data) in the nonvolatile memory circuit 105 through the flip-flop circuit 101, a second operation mode for inputting data stored in the nonvolatile memory circuit 105 to the flip-flop circuit 101, a third operation mode for storing data based on the potential of the bit line (BIT) in the nonvolatile memory circuit 105, and a fourth operation mode for inputting data stored in the nonvolatile memory circuit 105 to the bit line (BIT).

The four operation modes are combined to enable a reduction of the power consumption of the semiconductor device. The operation method will be described.

In the semiconductor device of this embodiment, a potential of the data line (Data) is input to the flip-flop circuit 101 and data based on the potential is stored in the flip-flop circuit 101. As described above, since the flip-flop circuit 101 is a volatile memory circuit, supply of power is needed to hold data stored in the flip-flop circuit 101. Thus, continuous power supply is needed in order to hold data stored in the flip-flop circuit 101 even in a period during which the internal state of the flip-flop circuit 101 is not rewritten.

However, in the semiconductor device of this embodiment, each register circuit 100 includes the nonvolatile memory circuit 105 electrically connected to the flip-flop circuit 101. Thus, the internal state of the flip-flop circuit 101 can be held even when supply of power is stopped by storing data in the nonvolatile memory circuit 105 in the period during which the internal state of the flip-flop circuit 101 is not changed. The internal state of the flip-flop circuit 101 can be stored in the nonvolatile memory circuit 105 when the selection circuit 103 selects the first operation mode.

Next, the selection circuit 103 selects the second operation mode so that data stored in the nonvolatile memory circuit 105 is stored in the flip-flop circuit 101, whereby the flip-flop circuit 101 can return to the state before supply of power is stopped.

In addition, the selection circuit combines the four operation modes, so that the semiconductor device can assess the internal state of the flip-flop circuit 101 at a desired timing. The operation method will be described.

The selection circuit 103 selects the first operation mode, whereby the internal state of the flip-flop circuit 101 is stored in the nonvolatile memory circuit 105. In this state, the selection circuit 103 selects the fourth operation mode so that the data stored in the nonvolatile memory circuit 105 is input to the bit line (BIT); thus, a potential based on the internal state of the flip-flop circuit 101 is input to the bit line (BIT). Consequently, the internal state of the flip-flop circuit 101 can be assessed by reading the potential input to the bit line (BIT).

Further, in the case where the internal state of the flip-flop circuit 101 is assessed and problems are founded, the internal state of the flip-flop circuit 101 can be easily rewritten in the semiconductor device of this embodiment. The operation methods will be described.

In order to rewrite the internal state of the flip-flop circuit 101, first, the third operation mode is selected by the selection circuit 103. In the third operation mode, a potential based on data to be rewritten is input to the bit line (BIT) and data based on the potential of the bit line (BIT) is stored in the nonvolatile memory circuit 105.

Next, the second operation mode is selected by the selection circuit 103, so that a potential based on the data stored in the nonvolatile memory circuit 105 is input to the flip-flop circuit 101. Thus, the data to be rewritten which is input from the bit line (BIT) is input to the flip-flop circuit 101.

In the semiconductor device of this embodiment, data of the flip-flop circuit 101 is stored in the nonvolatile memory circuit 105, and therefore can be directly written and read through the bit line (BIT); consequently, the internal state of the flip-flop circuit 101 can be assessed and rewritten at a desired timing A register circuit 200 in which more specific configurations of the selection circuit 103 and the nonvolatile memory circuit 105 are shown will be described. The register circuit 200 is shown in FIG. 1B.

Figure 1B:
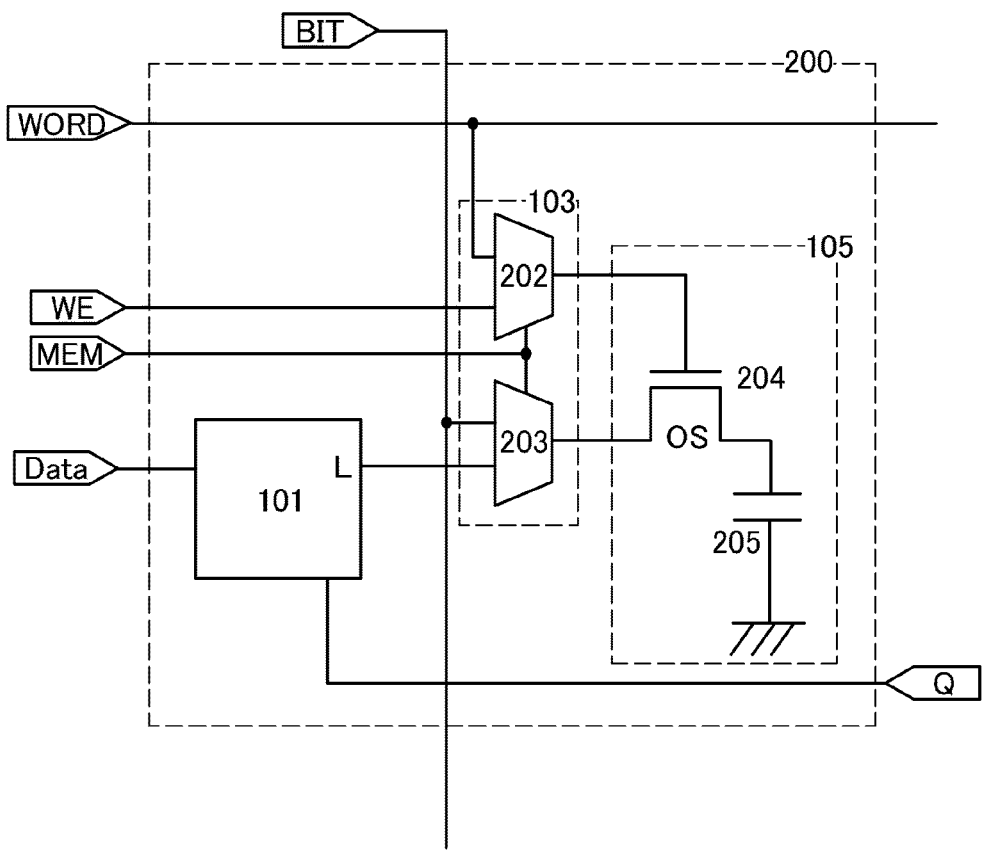

As shown in FIG. 1B, a circuit including a first switch 202 and a second switch 203 can form the selection circuit 103.

The first switch 202 is electrically connected to a word line (WORD) and a write enable line (WE). Output of the first switch 202 is input to the nonvolatile memory circuit 105. The first switch 202 is a switch that outputs a potential of the word line (WORD) or a potential of the write enable line (WE) to the nonvolatile memory circuit 105.

The second switch 203 is electrically connected to an output terminal of the flip-flop circuit 101 and a bit line (BIT). Output of the second switch 203 is input to the nonvolatile memory circuit 105. The second switch 203 is a switch that outputs a potential based on the internal state of the flip-flop circuit 101 or a potential of the bit line (BIT) to the nonvolatile memory circuit 105. The second switch 203 determines electrical connection between the nonvolatile memory circuit 105 and the flip-flop circuit 101 or the bit line (BIT).

The nonvolatile memory circuit 105 shown in FIG. 1B includes a transistor 204 and a capacitor 205. A first electrode of the transistor 204 is electrically connected to one electrode of the capacitor 205 and the other electrode of the capacitor 205 is grounded. Data is stored in a node where the first electrode of the transistor 204 and the one electrode of the capacitor 205 are electrically connected to each other (hereinafter also simply denoted as a node).

A gate electrode of the transistor 204 is electrically connected to the first switch 202 included in the selection circuit 103 and a potential of the word line (WORD) or a potential of the write enable line (WE) is input to the gate electrode of the transistor 204. That is, the transistor 204 switches between on and off depending on the potentials of the word line (WORD) and the write enable line (WE).

A second electrode of the transistor 204 is electrically connected to the second switch 203 included in the selection circuit 103. When the transistor 204 is on, a potential based on the internal state of the flip-flop circuit 101 or a potential of the bit line (BIT) is input from the second switch 203 and input to the node where the first electrode of the transistor 204 and the one electrode of the capacitor 205 are electrically connected to each other.

A transistor with small off-state current is used as the transistor 204. In the case of using a transistor with small off-state current as the transistor 204, data stored in the node can be held for a long time by turning off the transistor 204 even when supply of power is stopped.

To write data to the nonvolatile memory circuit 105, a charge corresponding to either of two different potentials (hereinafter a charge supplying a low potential is referred to as a charge $Q_L$ and a charge supplying a high potential is referred to as a charge $Q_H$) is selectively supplied to the capacitor 205, for example. One of $Q_L$ and $Q_H$ is made to correspond to data "1" and the other is made to correspond to data "0", so that 1-bit data can be written to the nonvolatile memory circuit 105. Note that a charge may be selected from charges corresponding to three or more different potentials, which results in an increase in the memory capacity of the nonvolatile memory circuit 105.

Note that the transistor with small off-state current that is used for the transistor 204 can be a transistor including an oxide semiconductor material (a transistor in which a channel is formed in an oxide semiconductor layer), for example. Since the off-state current of the transistor including an oxide semiconductor material is one hundred thousandth parts of that of a transistor in which a channel is formed in silicon, it is possible to neglect the loss of charges accumulated in the capacitor 205 caused by the leakage of charges from the transistor 204 which is turned off. Thus, a potential stored in the node can be held for a long time. In FIG. 1B, "OS" is written beside the transistor 204 in order to indicate that the transistor 204 is a transistor including an oxide semiconductor.

With the nonvolatile memory circuit 105 having the above configuration, in the case of writing new data, erasing of the written data is not needed and the written data can be directly rewritten by writing another data. Thus, a decrease in operation speed due to erasing of data can be suppressed. In other words, the semiconductor device can be operated at high speed.

Further, the semiconductor device of the disclosed invention does not have a problem of deterioration of a gate insulating layer (a tunnel insulating layer), which has been a problem of a conventional floating-gate transistor. That is, the problem of deterioration of a gate insulating layer due to injection of electrons into a floating gate, which has been regarded as a problem, can be solved. This means that there is no limit on the number of times of writing in principle. Furthermore, a high voltage needed for writing or erasing in the conventional floating gate transistor is not necessary.

Figure 2:
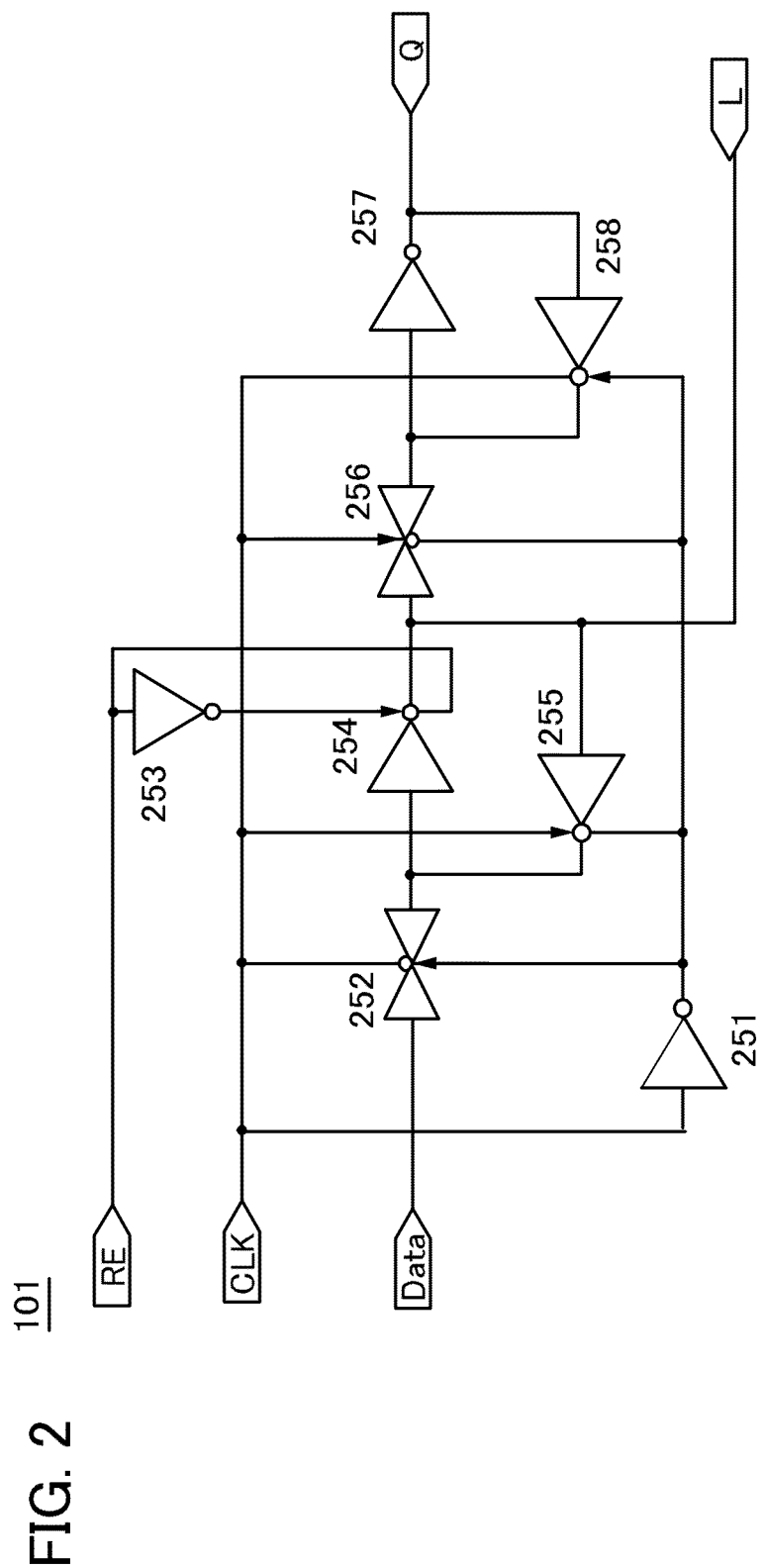
FIG. 2 is a diagram of a flip-flop circuit included in a semiconductor device that is one embodiment of the present invention.

The operation of the register circuit 200 shown in FIG. 1B will be described in detail with reference to a timing chart. First, a specific circuit configuration of a flip-flop circuit used to describe the operation of the register circuit 200 shown in FIG. 1B will be described. FIG. 2 shows the flip-flop circuit 101 used in the register circuit 200. Note that the configuration of a flip-flop circuit that can be used in the semiconductor device of this embodiment is not limited to the configuration in FIG. 2.

The flip-flop circuit 101 shown in FIG. 2 includes an inverter circuit 251, a switch circuit 252, an inverter circuit 253, a clocked inverter circuit 254, a clocked inverter circuit 255, a switch circuit 256, a clocked inverter circuit 257, and a clocked inverter circuit 258.

A potential of a data line (Data) is input to the flip-flop circuit 101. The potential of the data line (Data) is input to the clocked inverter circuit 254 through the switch circuit 252. The potential of the data line (Data) is inverted by the clocked inverter circuit 254 and input to a signal line (L) and the switch circuit 256. Note that the potential input to the signal line (L) is read out as the internal state of the flip-flop circuit 101. The potential input to the switch circuit 256 is inverted again by the clocked inverter circuit 257 and becomes equal to the potential of the data line (Data) and is output from an output signal line (Q). The potential of the output signal line (Q) is an output potential of the flip-flop circuit 101 and is a potential obtained by inverting the potential of the internal state of the flip-flop circuit 101.

The conducting states of the switch circuit 252 and the switch circuit 256 are controlled by a clock signal (CLK). A clock signal inverted by the inverter circuit 251 is input to the switch circuit 252 and a clock signal is directly input to the switch circuit 256, so that when one of the switch circuit 252 and the switch circuit 256 is opened, the other thereof is closed. Here, the switch circuit 252 is closed and the switch circuit 256 is opened when a low-level potential is input to a clock signal line (CLK) and the switch circuit 252 is opened and the switch circuit 256 is closed when a high-level potential is input to the clock signal line (CLK).

A latch circuit with a feedback loop in which output of the clocked inverter circuit 254 is input to the clocked inverter circuit 255 and output of the clocked inverter circuit 255 is input to the clocked inverter circuit 254 is formed. Output of the clocked inverter circuit 254 is input to the clocked inverter circuit 255 and output of the clocked inverter circuit 255 is input to the clocked inverter circuit 254; thus, data can be held in the latch circuit.

A clock signal (CLK) is input to the clocked inverter circuit 255 and the clocked inverter circuit 255 operates only when the clock signal (CLK) is at a high level. Thus, when the switch circuit 252 is opened and the switch circuit 256 is closed by input of a high-level potential as the clock signal (CLK), the clocked inverter circuit 255 operates and the latch circuit including the clocked inverter circuit 254 and the clocked inverter circuit 255 holds the potential.

A latch circuit with a feedback loop in which output of the clocked inverter circuit 257 is input to the clocked inverter circuit 258 and output of the clocked inverter circuit 258 is input to the clocked inverter circuit 257 is formed. Output of the clocked inverter circuit 257 is input to the clocked inverter circuit 258 and output of the clocked inverter circuit 258 is input to the clocked inverter circuit 257; thus, data can be held in the latch circuit.

A clock signal inverted by the inverter circuit 251 is input to the clocked inverter circuit 258 and the clocked inverter circuit 258 operates only when the clock signal is at a low level. Thus, when the switch circuit 252 is closed and the switch circuit 256 is opened by input of a low-level potential as the clock signal (CLK), the clocked inverter circuit 258 operates and the latch circuit including the clocked inverter circuit 257 and the clocked inverter circuit 258 holds the potential.

A potential of a read enable line (RE) is input to the clocked inverter circuit 254 through the inverter circuit 253. When a high-level potential is input to the read enable line (RE), a low-level potential inverted by the inverter circuit 253 is input to the clocked inverter circuit 254 and the operation of the clocked inverter circuit 254 is stopped. Thus, when a high-level potential is input to the read enable line (RE), the latch circuit including the clocked inverter circuit 254 and the clocked inverter circuit 255 does not hold data.

The above is the configuration and operations of the flip-flop circuit 101 shown in FIG. 2. Next, the operation of the register circuit 200 in FIG. 1B will be described. The case of using the flip-flop circuit 101 in FIG. 2 as the flip-flop circuit 101 will be described here. FIG. 3, FIGS. 4A and 4B, and FIGS. 5A and 5B show timing charts of the register circuit 200.

In the timing charts shown in FIG. 3, FIGS. 4A and 4B, and FIGS. 5A and 5B, MEM shows the potential of a selection signal line; BIT, the potential of the bit line; WORD, the potential of the word line; RE, the potential of the read enable line; WE, the potential of the write enable line; CLK, the potential of the clock signal; Data, the potential of the data line; L, the potential of the signal line; Q, the potential of the output signal line of the flip-flop circuit; and MEM_D, the potential of data stored in the nonvolatile memory circuit 105 (the data stored in the node of the nonvolatile memory circuit 105).

Figure 3:
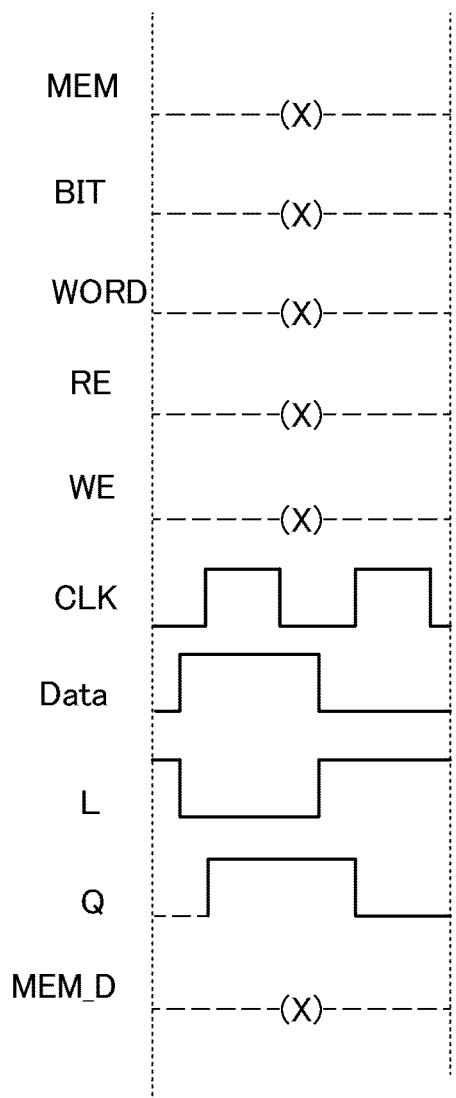
FIG. 3 is a timing chart of operation of a semiconductor device that is one embodiment of the present invention.

First, a timing chart of the normal operation of the flip-flop circuit in the register circuit will be described. The timing chart in FIG. 3 shows the normal operation of the flip-flop circuit. In the normal operation of the flip-flop circuit, the selection circuit 103 may select any operation modes. Thus, the potential of each of the selection signal line (MEM), the bit line (BIT), the word line (WORD), the read enable line (RE), and the write enable line (WE) can be a given potential. In the timing chart, a given potential is shown by a dashed line and denoted by the symbol (X).

When the clock signal (CLK) is at a low level, in the flip-flop circuit 101, the switch circuit 252 is closed, so that data based on the potential of the data line (Data) is input to the clocked inverter circuit 254. The data based on the potential of the data line (Data) is inverted by the clocked inverter circuit 254 and transmitted to the signal line (L). Then, when the clock signal (CLK) is at a high level, the switch circuit 252 is opened and the clocked inverter circuit 255 operates, so that the potential of the signal line (L) is held in the latch circuit including the clocked inverter circuit 254 and the clocked inverter circuit 255.

Further, when the clock signal (CLK) is at a high level, the switch circuit 256 is closed, so that data inverted by the clocked inverter circuit 254 is input to the clocked inverter circuit 257. When the inverted data is input to the clocked inverter circuit 257, the data is inverted again by the clocked inverter circuit 257 and is output through the output signal line (Q) of the flip-flop circuit 101.

Then, when the clock signal (CLK) is at a low level, the switch circuit 256 is opened and the clocked inverter circuit 258 operates, so that the potential of the output signal line (Q) of the flip-flop circuit is held in the latch circuit including the clocked inverter circuit 257 and the clocked inverter circuit 258.

Next, description will be given of the operation for storing data based on the data line (Data) in the nonvolatile memory circuit 105 through the flip-flop circuit 101 when the selection circuit 103 selects the first operation mode.

Figure 4A:
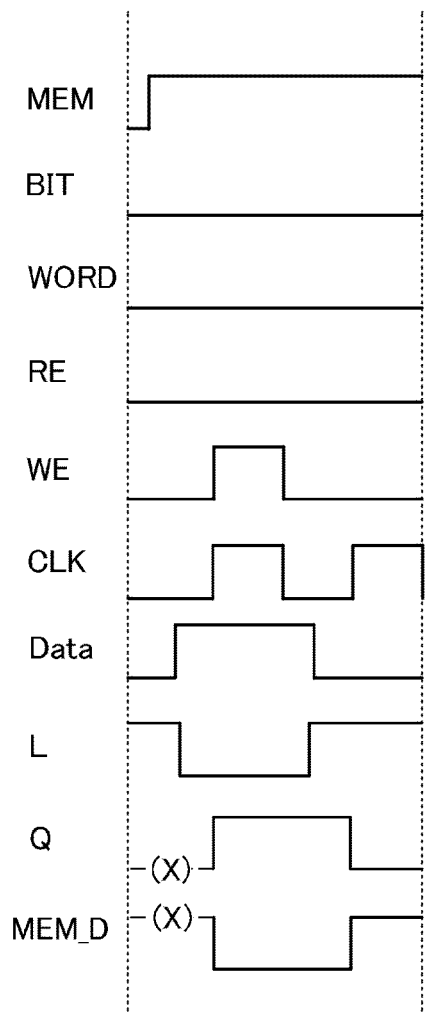
FIGS. 4A and 4B are timing charts of operation of a semiconductor device that is one embodiment of the present invention.

FIG. 4A shows a timing chart of the first operation mode. The potential of the selection signal line (MEM) is set at a high level so that the selection circuit 103 selects the first operation mode. When the selection signal line (MEM) is at the high level, the gate electrode of the transistor 204 is electrically connected to the write enable line (WE) through the first switch 202. In addition, the output terminal of the flip-flop circuit 101 is electrically connected to the second electrode of the transistor 204 through the second switch 203.

When the clock signal (CLK) is at a low level while the first operation mode is selected by the selection circuit 103, the potential of the data line (Data) is inverted by the clocked inverter circuit 254 and is input to the signal line (L). Then, when the clock signal (CLK) is at a high level, the switch circuit 252 is opened, so that the potential of the signal line (L) is held in the clocked inverter circuit 254 and the clocked inverter circuit 255. In addition, the switch circuit 256 is closed, so that a potential (the potential of the data line (Data)) that is the potential of the signal line (L) inverted by the clocked inverter circuit 257 is output to the output signal line (Q).

At this time, the write enable line (WE) is set at a high level, whereby a high-level potential is input to the gate electrode of the transistor 204 to turn on the transistor 204. Consequently, the internal state of the flip-flop circuit 101 is stored in the node of the nonvolatile memory circuit 105. Then, the write enable line (WE) is set at a low level, whereby the transistor 204 is turned off. Since the off-state current of the transistor 204 is extremely small, the potential stored in the node can be held for an extremely long time by turning off the transistor 204.

Through the above operation, the internal state of the flip-flop circuit 101 can be stored in the nonvolatile memory circuit 105; thus, the semiconductor device can hold the internal state of the flip-flop circuit 101 even when supply of power is stopped.

In the semiconductor device of this embodiment, the nonvolatile memory circuit capable of storing data even when supply of power is stopped is provided for each flip-flop circuit; therefore, supply of power can be stopped when the internal state of the flip-flop circuit is not changed, which results in a reduction in the power consumption.

Figure 4B:
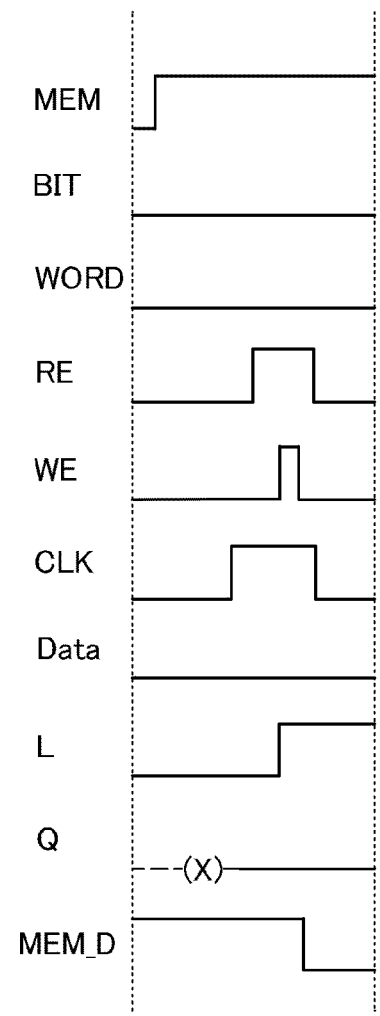

Next, description will be given of the operation for inputting data stored in the nonvolatile memory circuit 105 to the flip-flop circuit 101 when the second operation mode is selected by the selection circuit 103. FIG. 4B shows a timing chart of the second operation mode.

The potential of the selection signal line (MEM) is set at a high level so that the selection circuit 103 selects the second operation mode. When the selection signal line (MEM) is at the high level, the gate electrode of the transistor 204 is electrically connected to the write enable line (WE) through the first switch 202. In addition, the output terminal of the flip-flop circuit 101 is electrically connected to the second electrode of the transistor 204 through the second switch 203.

When the clock signal (CLK) is at a low level in the second operation mode, the potential of the data line (Data) is input to the clocked inverter circuit 254 and the potential of the data line (Data) which is inverted is input to the signal line (L).

Here, when the clock signal (CLK) is at a high level, the latch circuit including the clocked inverter circuit 254 and the clocked inverter circuit 255 operates and the potential of the signal line (L) is held. In addition, the switch circuit 256 is closed, so that data inverted by the clocked inverter circuit 254 is input to the clocked inverter circuit 257. The data input to the clocked inverter circuit 257 is inverted by the clocked inverter circuit 257 and is output from the output terminal of the flip-flop circuit 101.

At this time, when the read enable line (RE) is set at a high level, the operation of the clocked inverter circuit 254 is stopped and the operation of the latch circuit including the clocked inverter circuit 254 and the clocked inverter circuit 255 is stopped.

When the write enable line (WE) is set at a high level to turn on the transistor 204 while the operation of the latch circuit including the clocked inverter circuit 254 and the clocked inverter circuit 255 is stopped, the potential stored in the node between the transistor 204 and capacitor 205 (MEM_D) is input to the clocked inverter circuit 255 through the signal line (L).

The potential stored in the node is held in the signal line (L) even when the potential of the write enable line (WE) is returned to the low level after the above operation. Thus, when the read enable line (RE) is set at a low level to restart the operation of the clocked inverter circuit 254 and the operation of the latch circuit including the clocked inverter circuit 254 and the clocked inverter circuit 255, the potential stored in the node is held in the latch circuit.

Then, when the clock signal (CLK) is at a low level, the switch circuit 252 is closed and the potential of the data line (Data) is input to the clocked inverter circuit 254, so that the normal operation of the flip-flop circuit 101 is restarted.

Note that in the semiconductor device of this embodiment, a transistor including an oxide semiconductor material (a transistor in which a channel is formed in an oxide semiconductor layer) is used as the transistor 204. A transistor including an oxide semiconductor material has a characteristic of extremely small off-state current. Hence, the potential of the capacitor 205 can be held for an extremely long time by turning off the transistor 204.

Next, description will be given of the operation for storing data based on the potential of the bit line (BIT) in the nonvolatile memory circuit 105 when the selection circuit 103 selects the third operation mode.

Figure 5A:
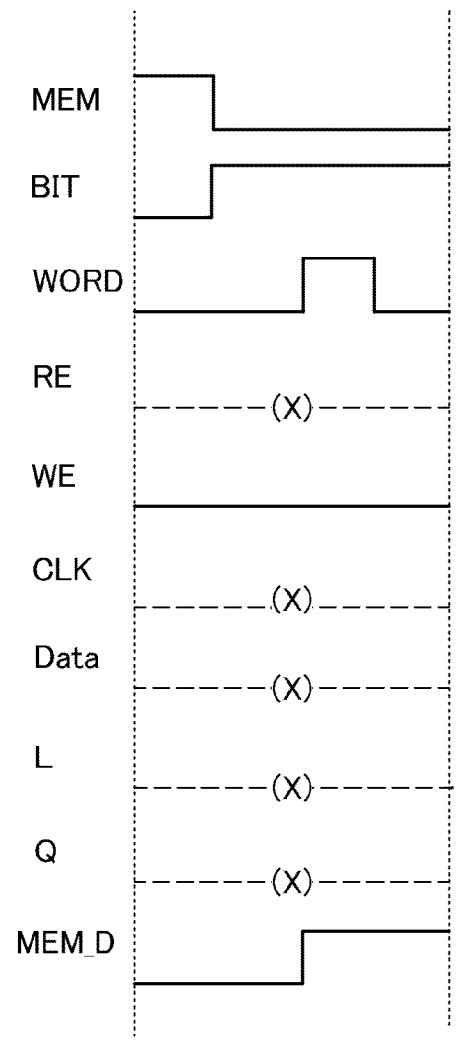
FIGS. 5A and 5B are timing charts of operation of a semiconductor device that is one embodiment of the present invention.

FIG. 5A shows the third operation mode. The selection signal line (MEM) is set at a low level so that the selection circuit 103 selects the third operation mode. When the selection signal line (MEM) is at the low level, the gate electrode of the transistor 204 is electrically connected to the word line (WORD) through the first switch 202. In addition, the bit line (BIT) is electrically connected to the second electrode of the transistor 204 through the second switch 203.

Note that in the third operation mode, output of each of the read enable line (RE), the clock signal line (CLK), the data line (Data), the signal line (L), and the flip-flop circuit can be a given potential.

In the third operation mode, the word line (WORD) is set at a high level, so that the transistor 204 is turned on and the potential based on the potential of the bit line (BIT) is stored in the node where the first electrode of the transistor 204 and the one electrode of the capacitor 205 are electrically connected to each other. The timing of inputting the potential to be stored in the nonvolatile memory circuit 105 to the bit line (BIT) is before the word line (WORD) is set at the high level and the potential of the bit line (BIT) is input to the node.

Figure 5B:
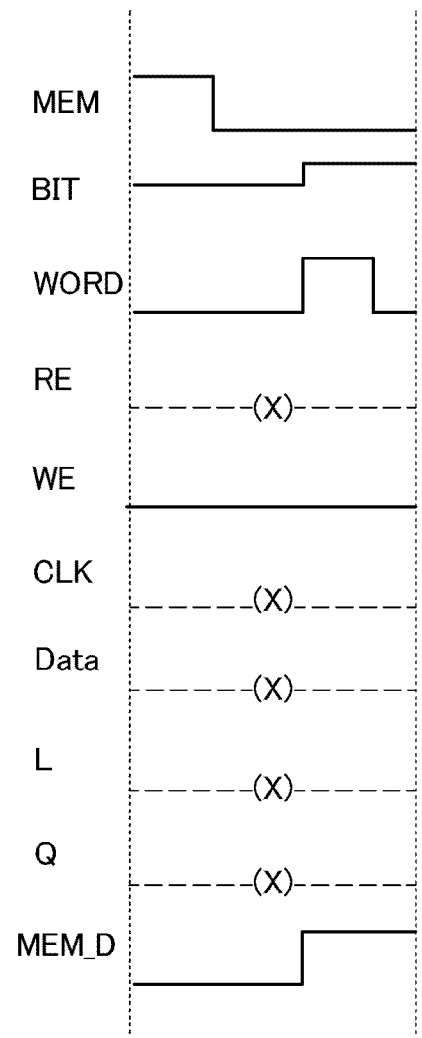

Next, description will be given of the operation for inputting the potential stored in the nonvolatile memory circuit 105 to the bit line (BIT) when the fourth operation mode is selected by the selection circuit 103. FIG. 5B shows the fourth operation mode. The selection signal line (MEM) is set at a low level so that the selection circuit 103 selects the fourth operation mode. When the selection signal line (MEM) is at the low level, the gate electrode of the transistor 204 is electrically connected to the word line (WORD) through the first switch 202. In addition, the bit line (BIT) is electrically connected to the second electrode of the transistor 204 through the switch 203.

In the fourth operation mode, a middle-level potential is input to the bit line (BIT). Then, the word line (WORD) is set at a high level to turn on the transistor 204, so that the potential stored in the node between the transistor 204 and the capacitor 205 is input to the bit line (BIT). At this time, the potential of the bit line (BIT) rises from the middle level to a high level in the case where the potentials stored in the transistor 204 and the capacitor 205 are at high levels. In the case where the potentials stored in the transistor 204 and the capacitor 205 are at low levels, the potential of the bit line (BIT) does not rise.

Thus, the potential stored in the nonvolatile memory circuit 105 can be read by identifying the level of the potential of the bit line (BIT). For example, a level shifter is connected to a tip of the bit line (BIT), in which case the potential of the bit line (BIT) that is close to the high-level potential can be fixed to the high level, so that the potential can be read completely.

Given combination of the four operation modes makes it possible to stop supply of power when the internal state of the flip-flop circuit is not changed, which results in a reduction in the power consumption. Further, the potential of the nonvolatile memory circuit is directly read out from an external portion of the register circuit, whereby the internal state of the flip-flop circuit can be assessed at a desired timing. Furthermore, the internal state of the flip-flop circuit can be easily rewritten.

Application Example

Next, a semiconductor device including a plurality of register circuits that is described above and the operations thereof will be described. FIG. 6 shows a semiconductor device of one embodiment of the present invention, which includes a plurality of register circuits that is described above and provided in a matrix.

The semiconductor device in FIG. 6 includes the register circuits arranged in a matrix of m (rows) and n (columns), n bit lines, m word lines, a memory controller, a bit column decoder, a word row decoder, and a core (CORE IO).

The register circuits in FIG. 6 each have a configuration similar to that of the register circuit 100 shown in FIG. 1B. That is, each of the register circuits includes a flip-flop circuit, a selection circuit, and a nonvolatile memory circuit. In addition, each of the selection circuits includes a first switch and a second switch, and each of the nonvolatile memory circuits includes a transistor with small off-state current (e.g., a transistor including an oxide semiconductor) and a capacitor. The register circuits in one column share one bit line electrically connected to each of the selection circuits and the register circuits in one row share one word line.

In this embodiment, the nonvolatile memory circuits included in the plurality of register circuits are not connected to each other in series and each of the nonvolatile memory circuits is connected to the bit line and the word line; however, a method for arranging the register circuits in a matrix is not limited to this.

Note that a write enable line (WE), a selection signal line (MEM), a data line (Data), a clock signal line (CLK), and the like can have configurations similar to those in FIG. 1B, and thus are not shown in FIG. 6.

The n bit lines are electrically connected to the bit column decoder, and the bit line in a k-th column (k is an integer greater than or equal to 1 and less than or equal to n) is electrically connected to the selection circuit and the second switch which are included in the register circuit in the k-th column.

The m word lines are electrically connected to the word row decoder, and the word line in a q-th row (q is an integer greater than or equal to 1 and less than or equal to m) is electrically connected to the selection circuit and the first switch which are included in the register circuit in the q-th row.

The memory controller determines the register circuit to/from which data is written or read depending on the internal state of the core or an arithmetic result. For example, when the memory controller determines the register circuit to which data is written, the selection circuit selects the third operation mode and a predetermined potential is input to the bit column decoder and the word row decoder from the memory controller.

For example, an address data of the register circuit to/from which data is written or read is transmitted to the word row decoder. Then, the word row decoder inputs a predetermined potential to the word lines in response to the address data, so that the register circuit which writes and reads data is in an active state.

Data to be written to the register circuit is transmitted to the bit column decoder. Then, a potential corresponding to the data to be written is input from the bit column decoder to the bit lines. The potential supplied from the bit column decoder is stored in the register circuit which is made to be in the active state by the word row decoder.

An input terminal and an output terminal of the flip-flop circuit included in the register circuit are connected to a logic operation circuit, a main memory, or the like, and the flip-flop circuits arranged in a matrix form a signal processing circuit. In the signal processing circuit, the flip-flop circuit has a function of carrying out arithmetic processing or temporarily holding a program execution state.

In the semiconductor device of the present invention, since the nonvolatile memory circuit is provided for each flip-flop circuit, data can be read out at high speed even a plurality of register circuits is provided. Further, data can be directly written to or read from the nonvolatile memory circuit, so that the internal state of the signal processing circuit can be easily assessed and rewritten.

This embodiment can be combined with any of the other embodiments as appropriate.

Embodiment 2

A transistor with small off-state current included in the nonvolatile memory circuit described in Embodiment 1 will be described. As the transistor with small off-state current, a transistor including an oxide semiconductor material is given.

Structures of transistors in this embodiment will be described with reference to FIGS. 23A to 23D. Note that FIGS. 23A to 23D are schematic cross-sectional views each showing an example of the structure of the transistor.

Figure 23A:
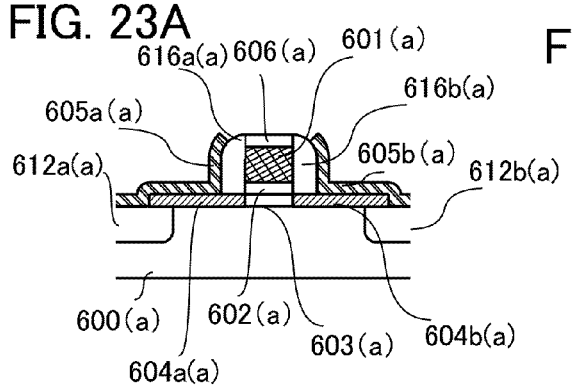
FIGS. 23A to 23D are cross-sectional views of transistors.

A transistor shown in FIG. 23A is provided over an insulating layer 600(*a*) and embedded insulators 612*a*(a) and 612*b*(a) which are formed to be embedded in the insulating layer 600(*a*).

The transistor shown in FIG. 23A includes a gate electrode 601(*a*), a gate insulating layer 602(*a*), an oxide semiconductor layer 603(*a*), a source electrode 605*a*(a), and a drain electrode 605*b*(a).

The oxide semiconductor layer 603(*a*) includes an impurity region 604*a*(a) and an impurity region 604*b*(a). The impurity region 604*a*(a) and the impurity region 604*b*(a) are apart from each other and dopants (impurities) are imparted thereto. A region between the impurity region 604*a*(a) and the impurity region 604*b*(a) serves as a channel formation region. The oxide semiconductor layer 603(*a*) is provided over the insulating layer 600(*a*). The impurity region 604*a*(a) and the impurity region 604*b*(a) are not necessarily provided. Note that in the transistor shown in FIG. 23A, the impurity region 604*a*(a) and the impurity region 604*b*(a) are semiconductor regions having $n^+$-type conductivity.

A sidewall insulator 616*a*(a) and a sidewall insulator 616*b*(a) are provided on both side surfaces of the gate electrode 601(*a*), and an insulating layer 606(*a*) is provided in an upper portion of the gate electrode 601(*a*) to prevent short circuit of the gate electrode 601(*a*) and another wiring.

The source electrode 605*a*(a) and the drain electrode 605*b*(a) are provided over the oxide semiconductor layer 603(*a*) and electrically connected to the oxide semiconductor layer 603(*a*).

The source electrode 605*a*(a) overlaps with part of the impurity region 604*a*(a). When the source electrode 605*a*(a) overlaps with part of the impurity region 604*a*(a), resistance between the source electrode 605*a*(a) and the impurity region 604*a*(a) can be low.

The drain electrode 605*b*(a) overlaps with part of the impurity region 604*b*(a). When the drain electrode 605*b*(a) overlaps with part of the impurity region 604*b*(a), resistance between the drain electrode 605*b*(a) and the impurity region 604*b*(a) can be low.

The gate insulating layer 602(*a*) is provided over the oxide semiconductor layer 603(*a*).

The gate electrode 601(*a*) overlaps with the oxide semiconductor layer 603(*a*) with the gate insulating layer 602(*a*) provided therebetween. A region in the oxide semiconductor layer 603(*a*), which overlaps with the gate electrode 601(*a*) with the gate insulating layer 602(*a*) provided therebetween serves as the channel formation region.

Figure 23C:
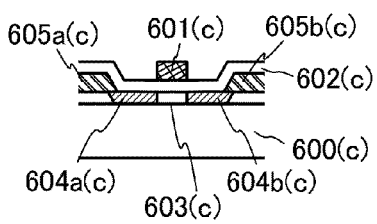
Figure 23B:
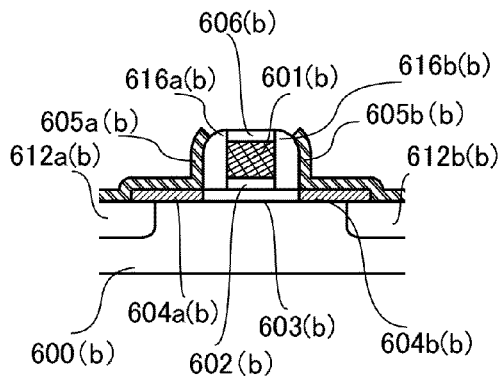

A transistor shown in FIG. 23B is formed over an insulating layer 600(*b*) and embedded insulators 612*a*(b) and 612*b*(b) which are formed to be embedded in the insulating layer 600(*b*).

The transistor shown in FIG. 23B includes a gate electrode 601(*b*), a gate insulating layer 602(*b*), an oxide semiconductor layer 603(*b*), a source electrode 605*a*(b), and a drain electrode 605*b*(b).

The oxide semiconductor layer 603(*b*) includes an impurity region 604*a*(b) and an impurity region 604*b*(b). The impurity region 604*a*(b) and the impurity region 604*b*(b) are apart from each other and dopants (impurities) are imparted thereto. A region between the impurity region 604*a*(b) and the impurity region 604*b*(b) serves as a channel formation region. The oxide semiconductor layer 603(*b*) is provided over the insulating layer 600(*b*). Note that the impurity region 604*a*(b) and the impurity region 604*b*(b) are not necessarily provided. Note that in the transistor shown in FIG. 23B, the impurity region 604a(b) and the impurity region 604b(b) are semiconductor regions each having n+-type conductivity.

A sidewall insulator 616a(b) and a sidewall insulator 616b(b) are provided on both side surfaces of the gate electrode 601(b), and an insulating layer 606(b) is provided in an upper portion of the gate electrode 601(b) to prevent short circuit of the gate electrode 601(b) and another wiring.

The source electrode 605a(b) and the drain electrode 605b(b) are provided over the oxide semiconductor layer 603(b) and electrically connected to the oxide semiconductor layer 603(b).

The source electrode 605a(b) overlaps with the impurity region 604a(b). When the source electrode 605a(b) overlaps with the impurity region 604a(b), resistance between the source electrode 605a(b) and the impurity region 604a(b) can be low.

The drain electrode 605b(b) overlaps with the impurity region 604b(b). When the drain electrode 605b(b) overlaps with part of the impurity region 604b(b), resistance between the drain electrode 605b(b) and the impurity region 604b(b) can be low.

The gate insulating layer 602(b) is provided over the oxide semiconductor layer 603(b).

The gate electrode 601(b) overlaps with the oxide semiconductor layer 603(b) with the gate insulating layer 602(b) provided therebetween. A region in the oxide semiconductor layer 603(b), which overlaps with the gate electrode 601(b) with the gate insulating layer 602(b) provided therebetween serves as the channel formation region.

In the transistor shown in FIG. 23A, the impurity region 604a(a) and the impurity region 604b(a) are provided to overlap with the sidewall insulator 616a(a) and the sidewall insulator 616b(a), respectively. On the other hand, in the transistor shown in FIG. 23B, the impurity region 604a(b) and the impurity region 604b(b) are provided not to overlap with the sidewall insulator 616a(b) and the sidewall insulator 616b(b), respectively.

The transistor shown in FIG. 23C includes a gate electrode 601(c), a gate insulating layer 602(c), an oxide semiconductor layer 603(c), a source electrode 605a(c), and a drain electrode 605b(c).

The oxide semiconductor layer 603(c) includes an impurity region 604a(c) and an impurity region 604b(c). The impurity region 604a(c) and the impurity region 604b(c) are apart from each other and dopants (impurities) are imparted thereto. A region between the impurity region 604a(c) and the impurity region 604b(c) serves as a channel formation region. The oxide semiconductor layer 603(c) is provided over the insulating layer 600(c). Note that the impurity region 604a(c) and the impurity region 604b(c) are not necessarily provided.

The source electrode 605a(c) and the drain electrode 605b(c) are provided over the oxide semiconductor layer 603(c) and electrically connected to the oxide semiconductor layer 603(c). Side surfaces of the source electrode 605a(c) and the drain electrode 605b(c) are tapered.

The source electrode 605a(c) overlaps with part of the impurity region 604a(c); however, this embodiment is not limited thereto. When the source electrode 605a(c) overlaps with part of the impurity region 604a(c), resistance between the source electrode 605a(c) and the impurity region 604a(c) can be low. An entire region of the oxide semiconductor layer 603(c) which overlaps with the source electrode 605a(c) may be the impurity region 604a(c).

The drain electrode 605b(c) overlaps with part of the impurity region 604b(c); however, this embodiment is not limited thereto. When the drain electrode 605b(c) overlaps with part of the impurity region 604b(c), resistance between the drain electrode 605b(c) and the impurity region 604b(c) can be low. An entire region of the oxide semiconductor layer 603(c) which overlaps with the drain electrode 605b(c) may be the impurity region 604b(c).

The gate insulating layer 602(c) is provided over the oxide semiconductor layer 603(c), the source electrode 605a(c), and the drain electrode 605b(c).

The gate electrode 601(c) overlaps with the oxide semiconductor layer 603(c) with the gate insulating layer 602(c) provided therebetween. A region in the oxide semiconductor layer 603(c), which overlaps with the gate electrode 601(c) with the gate insulating layer 602(c) provided therebetween serves as the channel formation region.

Figure 23D:
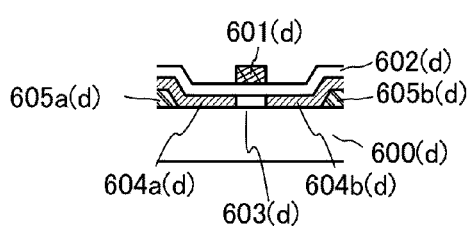

A transistor shown in FIG. 23D includes a gate electrode 601(d), a gate insulating layer 602(d), an oxide semiconductor layer 603(d), a source electrode 605a(d), and a drain electrode 605b(d).

The source electrode 605a(d) and the drain electrode 605b(d) are provided over an insulating layer 600(d). The side surfaces of the source electrode 605a(d) and the drain electrode 605b(d) are tapered.

The oxide semiconductor layer 603(d) includes an impurity region 604a(d) and an impurity region 604b(d). The impurity region 604a(d) and the impurity region 604b(d) are apart from each other and dopants are imparted thereto. A region between the impurity region 604a(d) and the impurity region 604b(d) serves as a channel formation region. For example, the oxide semiconductor layer 603(d) is provided over the source electrode 605a(d), the drain electrode 605b(d), and the insulating layer 600(d), and is electrically connected to the source electrode 605a(d) and the drain electrode 605b(d). Note that the impurity region 604a(d) and the impurity region 604b(d) are not necessarily provided.

The impurity region 604a(d) is electrically connected to the source electrode 605a(d).

The impurity region 604b(d) is electrically connected to the drain electrode 605b(d).

The gate insulating layer 602(d) is provided over the oxide semiconductor layer 603(d).

The gate electrode 601(d) overlaps with the oxide semiconductor layer 603(d) with the gate insulating layer 602(d) provided therebetween. A region in the oxide semiconductor layer 603(d), which overlaps with the gate electrode 601(d) with the gate insulating layer 602(d) provided therebetween serves as the channel formation region.

Further, components shown in FIGS. 23A to 23D will be described.

As each of the insulating layers 600(a) to 600(d), an insulating oxide, a substrate having an insulating surface, or the like can be used, for example. Further, a layer over which an element is formed in advance can be used as each of the insulating layers 600(a) to 600(d).

Each of the gate electrodes 601(a) to 601(d) has a function of a gate of the transistor. Note that a layer having a function of a gate of the transistor can be called a gate wiring.

As the gate electrodes 601(a) to 601(d), a layer of a metal such as molybdenum, magnesium, titanium, chromium, tantalum, tungsten, aluminum, copper, neodymium, or scandium or an alloy containing any of these metals as a main component can be used, for example. Alternatively, the gate electrodes 601(a) to 601(d) can be formed by stacking layers of any of materials that can be used for the gate electrodes 601(a) to 601(d).

Each of the gate insulating layers 602(a) to 602(d) can be, for example, a silicon oxide layer, a silicon nitride layer, a silicon oxynitride layer, a silicon nitride oxide layer, an aluminum oxide layer, an aluminum nitride layer, an aluminum oxynitride layer, an aluminum nitride oxide layer, a hafnium oxide layer, or a lanthanum oxide layer. Each of the gate insulating layers 602(a) to 602(d) can be formed by stacking layers of any of materials that can be used for the gate insulating layers 602(a) to 602(d).

Alternatively, the gate insulating layers 602(a) to 602(d), an insulating layer of a material containing, for example, an element that belongs to Group 13 in the periodic table and oxygen can be used. When the oxide semiconductor layers 603(a) to 603(d) contain an element that belongs to Group 13, the use of insulating layers each containing an element that belongs to Group 13 as insulating layers in contact with the oxide semiconductor layers 603(a) to 603(d) makes the state of interfaces between the insulating layers and the oxide semiconductor layers favorable.

Examples of the material containing an element that belongs to Group 13 include gallium oxide, aluminum oxide, aluminum gallium oxide, and gallium aluminum oxide. Note that aluminum gallium oxide refers to a substance in which the amount of aluminum is larger than that of gallium in atomic percent, and gallium aluminum oxide refers to a substance in which the amount of gallium is larger than or equal to that of aluminum in atomic percent. As the gate insulating layers 602(a) to 602(d), a material represented by $Al_2O_x$ (x=3+α, where α is larger than or equal to 0 and smaller than 1), $Ga_2O_x$ (x=3+α, where α is larger than 0 and smaller than 1), or $Ga_xAl_{2-x}O_{3+\alpha}$, (x is larger than 0 and smaller than 2 and α is larger than 0 and smaller than 1) can be used, for example.

Each of the gate insulating layers 602(a) to 602(d) can be formed by stacking layers of any of materials which can be used for the gate insulating layers 602(a) to 602(d). For example, the gate insulating layers 602(a) to 602(d) can be formed by stacking layers containing gallium oxide represented by $Ga_2O_x$. Alternatively, the gate insulating layers 602(a) to 602(d) may be a stack of layers of an insulating layer containing gallium oxide represented by $Ga_2O_x$ and an insulating layer containing aluminum oxide represented by $Al_2O_x$.

The gate insulating layers 602(a) to 602(d) each contain oxygen at least in a portion in contact with the oxide semiconductor layer and are each preferably formed using an insulating oxide from which part of oxygen is eliminated by heating. When the portion of the gate insulating layers 602(a) to 602(d) each of which is in contact with the oxide semiconductor layer are each formed using silicon oxide, oxygen can be diffused to the oxide semiconductor layer and a reduction in the resistance of the transistor can be prevented.

Note that the gate insulating layers 602(a) to 602(d) may be formed using a high-k material such as hafnium silicate (Hf-$SiO_x$), hafnium silicate to which nitrogen is added (HfSi$_x$-$O_yN_z$), hafnium aluminate to which nitrogen is added (HfAl$_x$-$O_yN_z$), hafnium oxide, yttrium oxide, or lanthanum oxide, whereby gate leakage current can be reduced. Here, gate leakage current refers to leakage current which flows between a gate electrode and a source or drain electrode. In addition, a layer formed using the high-k material and a layer formed using silicon oxide, silicon oxynitride, silicon nitride, silicon nitride oxide, aluminum oxide, aluminum oxynitride, or gallium oxide may be stacked. Note that even in the case where the gate insulating layers 602(a) to 602(d) each have a stacked-layer structure, the portion in contact with the oxide semiconductor layer is preferably formed using an insulating oxide.

Further, when the channel length of the transistor is 30 nm, the thickness of each of the oxide semiconductor layers 603(a) to 603(d) may be approximately 5 nm, for example. In this case, if the oxide semiconductor layers 603(a) to 603(d) are oxide semiconductor layers of CAAC-OS films (described later), a short channel effect in the transistor can be suppressed.

Dopants (impurities) imparting n-type or p-type conductivity are added to the impurity regions 604a(a) to 604a(d) and the impurity regions 604b(a) to 604b(d), and each of the impurity regions serves as a source region or a drain region of the transistor.

As the dopants, for example, one or more of elements of Group 13 in the periodic table (e.g., boron), of Group 15 in the periodic table (e.g., one or more of nitrogen, phosphorus, and arsenic), and of rare gas (e.g., one or more of helium, argon, and xenon) can be used.

Here, the dopant may be added by an ion implantation method or an ion doping method. Alternatively, the dopant may be added by performing plasma treatment in an atmosphere of a gas containing the dopant.

By addition of the dopants to the impurity regions 604a(a) to 604a(d) and the impurity regions 604b(a) to 604b(d), connection resistance between the impurity region and the source electrode or the drain electrode can be reduced, resulting in miniaturization of the transistor.

The source electrodes 605a(a) to 605a(d) and the drain electrodes 605b(a) to 605b(d) function as the source or the drain of the transistor. Note that a layer functioning as a source of the transistor is also referred to as a source electrode or a source wiring, and a layer functioning as a drain of the transistor is also referred to as a drain electrode or a drain wiring.

Each of the source electrodes 605a(a) to 605a(d) and the drain electrodes 605b(a) to 605b(d) can be formed using, for example, a metal such as aluminum, magnesium, chromium, copper, tantalum, titanium, molybdenum, or tungsten; or an alloy which contains any of the above metals as a main component. For example, each of the source electrodes 605a(a) to 605a(d) and the drain electrodes 605b(a) to 605b(d) can be formed using a stacked-layer structure including a layer of an alloy containing copper, magnesium, and aluminum. Alternatively, each of the source electrodes 605a(a) to 605a(d) and the drain electrodes 605b(a) to 605b(d) can be formed by stacking layers of any of materials that can be used for the source electrodes 605a(a) to 605a (d) and the drain electrodes 605b(a) to 605b(d). For example, each of the source electrodes 605a(a) to 605a(d) and the drain electrodes 605b(a) to 605b(d) can be formed using a stacked-layer structure including a layer of an alloy containing copper, magnesium, and aluminum and a layer containing copper.

Further, a layer containing a conductive metal oxide can be used for each of the source electrodes 605a(a) to 605a(d) and the drain electrodes 605b(a) to 605b(d). Examples of the conductive metal oxide include indium oxide, tin oxide, zinc oxide, indium oxide-tin oxide, and indium oxide-zinc oxide. Note that the conductive metal oxide that can be used for each of the source electrodes 605a(a) to 605a(d) and the drain electrodes 605b(a) to 605b(d) may contain silicon oxide.

The source electrodes 605a(a) to 605a(d) and the drain electrodes 605b(a) to 605b(d) may be selectively formed in such a manner that, for example, a conductive film (e.g., a metal film or a silicon film to which an impurity element imparting one conductivity type is added) is formed by a sputtering method, an etching mask is formed over the conductive film, and etching is performed. Alternatively, an ink-jet method may be used. The conductive film serving as the source electrodes 605a(a) to 605a(d) and the drain electrodes 605b(a) to the 605b(d) may be formed to have a single-layer structure or a stacked-layer structure. For example, the conductive film is formed to have a three-layer structure in which an Al layer is sandwiched between Ti layers.

Each of the insulating layers 600(a) to 600(d) can be formed by stacking layers of any of materials that can be used for the gate insulating layers 602(a) to 602(d), for example. Further, the insulating layers 600(a) to 600(d) may be formed by stacking layers of any of materials that can be used for the gate insulating layers 602(a) to 602(d). For example, the insulating layers 600(a) to 600(d) formed by stacking an aluminum oxide layer and a silicon oxide layer can prevent elimination of oxygen contained in the insulating layers 600(a) to 600(d) through the oxide semiconductor layers 603(a) to 603(d).

A single layer or a stack of layers of any of materials that can be used for the gate insulating layers 602(a) to 602(d) can be used for the insulating layer 606(a), the insulating layer 606(b), the embedded insulator 612a(a), the embedded insulator 612b(a), the embedded insulator 612a(b), the embedded insulator 612b(b), the sidewall insulator 616a(a), the sidewall insulator 616b(a), the sidewall insulator 616a(b), and the sidewall insulator 616b(b).

When the insulating layer which is in contact with each of the oxide semiconductor layers 603(a) to 603(d) contains oxygen excessively, the oxide semiconductor layers 603(a) to 603(d) are easily supplied with oxygen. As a result, an oxygen defect in the oxide semiconductor layers 603(a) to 603(d) or at an interface between each of the oxide semiconductor layers 603(a) to 603(d) and the insulating layer can be reduced, which results in further reduction in the carrier concentration in each of the oxide semiconductor layers 603(a) to 603(d). Without limitation thereon, in the case where the oxide semiconductor layer 603(a) contains oxygen excessively by the manufacturing steps, elimination of oxygen from the oxide semiconductor layer 603(a) can be prevented by the insulating layer in contact with the oxide semiconductor layer 603(a).

A base insulating layer may be provided between the oxide semiconductor layers 603(a) to 603(d) and the insulating layers 600(a) to 600(d). The base insulating layer contains oxygen at least in its surface and may be formed using an insulating oxide in which part of the oxygen is eliminated by heat treatment. As an insulating oxide in which part of oxygen is eliminated by heat treatment, a material containing more oxygen than that in the stoichiometric proportion is preferably used. This is because an oxide semiconductor layer in contact with the base insulating layer can be supplied with oxygen by the heat treatment.

As an insulating oxide containing more oxygen than that in the stoichiometric proportion, silicon oxide represented by $SiO_x$ where x>2 can be given, for example. Note that there is no limitation thereon, and the base insulating layer may be formed using silicon oxide, silicon oxynitride, silicon nitride oxide, aluminum oxynitride, gallium oxide, hafnium oxide, yttrium oxide, or the like.

The base interlayer insulating layer may be a stack of a plurality of films. The base insulating layer may have a stacked-layer structure in which a silicon oxide film is formed over a silicon nitride film, for example.

In an insulating oxide containing more oxygen than that in the stoichiometric proportion, part of oxygen is easily eliminated by heat treatment. The amount of eliminated oxygen (the value converted into that of oxygen atoms) obtained by TDS analysis when part of oxygen is easily eliminated by heat treatment is greater than or equal to $1.0 \times 10^{18}$ atoms/cm$^3$, preferably greater than or equal to $1.0 \times 10^{20}$ atoms/cm$^3$, more preferably greater than or equal to $3.0 \times 10^{20}$ atoms/cm$^3$.

The base insulating layer may be formed by a sputtering method, a CVD method, or the like. The base insulating layer is preferably formed by a sputtering method. In the case where a silicon oxide film is formed as the base insulating layer, a quartz (preferably, synthesized quartz) target may be used as a target, and an argon gas may be used as a sputtering gas. Alternatively, a silicon target and a gas containing oxygen may be used as a target and a sputtering gas, respectively. As the gas containing oxygen, a mixed gas of an argon gas and an oxygen gas may be used or only an oxygen gas may be used.

After the base insulating layer is formed, a first heat treatment is performed before an oxide semiconductor layer serving as the oxide semiconductor layers 603(a) to 603(d) is formed. The first heat treatment is performed to remove water and hydrogen contained in the base insulating layer. The temperature of the first heat treatment is higher than or equal to a temperature at which water and hydrogen contained in the base insulating layer are eliminated (a temperature at which the amount of eliminated water and hydrogen has a peak) and lower than a temperature at which the substrate is changed in quality, preferably higher than or equal to 400° C. and lower than or equal to 750° C. For example, it is sufficient that the temperature of the first heat treatment is lower than the temperature of a second heat treatment performed later.

Then, the second heat treatment is performed after the oxide semiconductor layer is formed. The second heat treatment is performed to supply oxygen to the oxide semiconductor layer from the base insulating layer which serves as a source of oxygen. The timing of the second heat treatment is not limited to this timing, and the second heat treatment may be performed after the oxide semiconductor layer is processed.

Note that it is preferable that the second heat treatment be performed in a nitrogen gas atmosphere or a rare gas atmosphere including helium, neon, argon, or the like and the atmosphere do not contain hydrogen, water, a hydroxyl group, hydride, and the like. Alternatively, the purity of a nitrogen gas or a rare gas such as helium, neon, or argon that is introduced into a heat treatment apparatus is preferably higher than or equal to 6N (99.9999%), more preferably higher than or equal to 7N (99.99999%) (that is, the impurity concentration be lower than or equal to 1 ppm, preferably lower than or equal to 0.1 ppm).

In some cases, the oxide semiconductor layer may be crystallized into a microcrystalline oxide semiconductor layer or a polycrystalline oxide semiconductor layer, depending on the conditions of the second heat treatment or the material of the oxide semiconductor layer. For example, the oxide semiconductor layer may be crystallized into a microcrystalline oxide semiconductor layer having a degree of crystallization of greater than or equal to 90%, or greater than or equal to 80%. Further, the oxide semiconductor layer may be an amorphous oxide semiconductor layer without containing a crystalline component, depending on the conditions of the second heat treatment or the material of the oxide semiconductor layer. Furthermore, a microcrystal (the grain size of the crystal is greater than or equal to 1 nm and less than or equal to 20 nm) is contained in the amorphous layer in some cases.

In the case of a crystalline oxide semiconductor layer, the average surface roughness ($R_a$) of a surface where the oxide semiconductor film is formed is preferably greater than or equal to 0.1 nm and less than 0.5 nm. The oxide semiconductor film may be formed over a surface with the average surface roughness ($R_a$) of less than or equal to 1 nm, preferably less than or equal to 0.3 nm, more preferably less than or equal to 0.1 nm.

Note that here, the average surface roughness ($R_a$) is obtained by three-dimensional expansion of arithmetic mean surface roughness ($R_a$) which is defined by JIS B 0601:2001 (ISO 4287:1997) so that $R_a$ can be applied to a curved surface, and is an average value of the absolute values of deviations from a reference surface to a specific surface.

Here, the arithmetic mean surface roughness ($R_a$) is shown by the following formula (1) assuming that a portion of a roughness curve is withdrawn in a length corresponding to an evaluation length $L_o$, the direction of the mean line of the roughness curve of the picked portion is represented by an x-axis, the direction of longitudinal magnification (direction perpendicular to the x-axis) is represented by a y-axis, and the roughness curve is expressed as y=f(x).

[Formula 1]

$$Ra = \frac{1}{L_0} \int_0^{L_0} |f(x)| dx \quad (1)$$

When a curved surface obtained by cutting off a long-wavelength component from a measured surface is expressed as $Z_0$=f(x,y), the average surface roughness ($R_a$) is an average value of the absolute values of deviations from the reference surface to the specific surface and is shown by the following formula (2).

[Formula 2]

$$Ra = \frac{1}{S_0} \int_{y_1}^{y_2} \int_{x_1}^{x_2} |f(x, y) - Z_0| dx dy \quad (2)$$

Here, the specific surface is a surface which is a target of roughness measurement, and is a quadrilateral region which is surrounded by four points represented by the coordinates $(x_1,y_1,f(x_1,y_1))$, $(x_1,y_2,f(x_1,y_2))$, $(x_2,y_1,f(x_2,y_1))$, and $(x_2, y_2, f(x_2,y_2))$. $S_0$ represents the area of the specific surface when the specific surface is flat ideally.

In addition, the reference surface is a surface parallel to an x-y plane at the average height of the specific surface. That is, when the average value of the height of the specific surface is expressed as $Z_0$, the height of the reference surface is also expressed as $Z_0$.

Chemical mechanical polishing (CMP) treatment may be performed so that the average surface roughness of a surface where the oxide semiconductor layer is formed can be greater than or equal to 0.1 nm and less than 0.5 nm. The CMP treatment may be performed before formation of the oxide semiconductor layer but is preferably performed before the first heat treatment.

The CMP treatment may be performed at least once. When the CMP treatment is performed in plural times, it is preferable that the first polishing step be performed at a high polishing rate and be followed by a final polishing step at a low polishing rate.

Instead of the CMP treatment, dry etching or the like may be performed in order to planarize the surface where the oxide semiconductor layer is formed. As an etching gas, a chlorine-based gas such as a chlorine gas, a boron chloride gas, a silicon chloride gas, or a carbon tetrachloride gas, a fluorine-based gas such as a carbon tetrafluoride gas, a sulfur fluoride gas, or a nitrogen fluoride gas, or the like can be used as appropriate.

Instead of the CMP treatment, plasma treatment or the like may be performed in order to planarize the surface where the oxide semiconductor layer is formed. A rare gas may be used in the plasma treatment. In the plasma treatment, a surface to be processed is irradiated with ions of an inert gas, and minute projections and depressions on the surface to be processed are planarized by a sputtering effect. Such plasma treatment is also referred to as reverse sputtering.

Note that any of the above treatments may be employed in order to planarize the surface where the oxide semiconductor layer is formed. For example, only reverse sputtering may be performed. Alternatively, dry etching may be performed after the CMP treatment. Note that it is preferable that dry etching or reverse sputtering be used so that water can be prevented from entering the surface where the oxide semiconductor layer is formed. In particular, in the case where planarization treatment is performed after the first heat treatment, dry etching or reverse sputtering is preferably used.

The oxide semiconductor layer preferably contains at least indium (In) or zinc (Zn). In particular, both In and Zn are preferably contained. In addition, gallium (Ga) is preferably contained. When gallium (Ga) is contained, variations in the transistor characteristics can be reduced. Such an element capable of reducing variations in the transistor characteristics is referred to as a stabilizer. As a stabilizer, tin (Sn), hafnium (Hf), or aluminum (Al), can be given.

As another stabilizer, a lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), and lutetium (Lu) can be given. One or a plurality of these elements can be contained.

As the oxide semiconductor, for example, any of the following can be used: indium oxide; tin oxide; zinc oxide; a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide; a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; or a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Note that here, for example, an "In—Ga—Zn-based oxide" means an oxide containing In, Ga, and Zn as its main component and there is no particular limitation on the ratio of In:Ga:Zn. The In—Ga—Zn-based oxide may contain a metal element other than the In, Ga, and Zn.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or any of oxides whose composition is in the neighborhood of the above compositions can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/

2), or In:Sn:Zn=2:1:5 (=1/4:1/8:5/8), or any of oxides whose composition is in the neighborhood of the above compositions may be used.

However, the oxide semiconductor layer which can be used in one embodiment of the present invention is not limited to those described above, and an oxide semiconductor film including an appropriate composition may be used in accordance with needed semiconductor characteristics (the mobility, the threshold voltage, the variation, and the like). In accordance with needed transistor characteristics (semiconductor characteristics), the carrier density, the impurity concentration, the defect density, the atomic ratio of a metal element and oxygen, the interatomic distance, the density, and the like may be appropriately adjusted.

For example, relatively high mobility can be obtained with the use of an In—Sn—Zn-based oxide. However, mobility can be increased by reducing the defect density in a bulk also in the case of using an In—Ga—Zn-based oxide.

Note that for example, the expression "the composition of an oxide including In, Ga, and Zn at the atomic ratio, In:Ga:Zn=a:b:c (a+b+c=1), is in the neighborhood of the composition of an oxide containing In, Ga, and Zn at the atomic ratio, In:Ga:Zn=A:B:C (A+B+C=1)" means that a, b, and c satisfy the following relation: $(a-A)^2+(b-B)^2+(c-C)^2 \leq r^2$, and r may be 0.05, for example.

The oxide semiconductor may be either single crystal or non-single-crystal. In the case where the oxide semiconductor is non-single-crystal, the oxide semiconductor may be either amorphous or polycrystalline. Further, the oxide semiconductor may have a structure including a crystal part in an amorphous part. Alternatively, the oxide semiconductor may be non-amorphous.

Note that the metal oxide preferably contains oxygen in excess of the stoichiometric proportion. When excess oxygen is contained, generation of carriers due to oxygen deficiency in the oxide semiconductor layer to be formed can be prevented.

Note that for example, in the case where the oxide semiconductor layer is formed using an In—Zn-based metal oxide, the atomic ratio of In/Zn is 1 to 100, preferably 1 to 20, more preferably 1 to 10 in an atomic ratio. When the atomic ratio of In to Zn is in the above preferred range, the field-effect mobility can be improved. Here, when the atomic ratio of the metal oxide is In:Zn:O=X:Y:Z, it is preferable to satisfy the relation of Z>1.5X+Y so that excess oxygen is contained.

The packing ratio of a sitering body used for the target of the target is greater than or equal to 90% and less than or equal to 100%, preferably greater than or equal to 95% and less than or equal to 100%. With the target having a high filling factor, a dense oxide semiconductor layer can be formed.

Note that the energy gap of a metal oxide which can be applied to the oxide semiconductor layer is preferably 2 eV or more, more preferably 2.5 eV or more, still more preferably 3 eV or more. In this manner, the off-state current of a transistor can be reduced by using a metal oxide having a wide band gap.

Note that the oxide semiconductor layer contains hydrogen. Note that the hydrogen may be contained in the oxide semiconductor layer in the form of a hydrogen molecule, water, a hydroxyl group, or hydride in some cases, in addition to a hydrogen atom. It is preferable that hydrogen contained in the oxide semiconductor film be as little as possible.

Note that the concentrations of an alkali metal and an alkaline earth metal in the oxide semiconductor layer are preferably low, and these concentrations are preferably lower than or equal to $1 \times 10^{18}$ atoms/cm$^3$, more preferably lower than or equal to $2 \times 10^{16}$ atoms/cm$^3$. When an alkali metal and an alkaline earth metal are bonded to an oxide semiconductor, carriers may be generated, which causes increase in the off-state current of the transistor.

Note that there is no particular limitation on the formation method and the thickness of the oxide semiconductor layer, and they can be determined in consideration of the size or the like of a transistor to be manufactured. Examples of the formation method of the oxide semiconductor layer include a sputtering method, a molecular beam epitaxy method, a coating method, a printing method, a pulsed laser deposition method, and the like. The thickness of the oxide semiconductor layer is preferably 3 nm or more and 50 nm or less. This is because the transistor might be normally on when the oxide semiconductor layer has a large thickness of 50 nm or more. In a transistor having a channel length of 30 nm, when the oxide semiconductor film has a thickness of 5 nm or less, a short-channel effect can be suppressed.

Here, as a preferable example, a method for forming the oxide semiconductor layer by a sputtering method using an In—Ga—Zn-based metal oxide target will be described. A rare gas (e.g., an argon gas), an oxygen gas, or a mixed gas of a rare gas and an oxygen gas may be used as a sputtering gas.

It is preferable that a high-purity gas from which hydrogen, water, a hydroxyl group, or hydride is removed be used as the sputtering gas for the formation of the oxide semiconductor layer. In order to keep the high purity of a sputtering gas, it is preferable that a gas adsorbed on the inner wall or the like of a process chamber be removed, and a surface where the oxide semiconductor layer is formed be subjected to heat treatment before the formation. In addition, a high-purity sputtering gas may be introduced to the treatment chamber. In that case, the purity of an argon gas may be 9N (99.9999999%) or higher, the dew point thereof may be −121° C. or less, the concentration of water may be 0.1 ppb or less, and the concentration of hydrogen may be 0.5 ppb or less. The purity of an oxygen gas may be 8N (99.999999%) or higher, the dew point thereof may be −112° C. or less, the concentration of water may be 1 ppb or less, and the concentration of hydrogen may be 1 ppb or less. The oxide semiconductor layer is formed while the surface where the oxide semiconductor layer is formed is heated and temperature is kept high, whereby the concentration of impurities such as water contained in the oxide semiconductor layer can be reduced. In addition, with the use of a sputtering method, damage to the oxide semiconductor layer can be reduced.

Further, oxygen may be supplied by ion implantation in order to contain oxygen excessively in the oxide semiconductor layer.

Here, description will be given of a c-axis aligned crystalline oxide semiconductor (CAAC-OS) film that is one mode of a structure of an oxide semiconductor.

The CAAC-OS film is not completely single crystal nor completely amorphous. The CAAC-OS film is an oxide semiconductor film with a crystal-amorphous mixed phase structure where crystal parts and amorphous parts are included. Note that in most cases, the crystal part fits inside a cube whose one side is less than 100 nm. From an observation image obtained with a transmission electron microscope (TEM), a boundary between an amorphous part and a crystal part in the CAAC-OS film is not clear. Further, with the TEM, a grain boundary in the CAAC-OS film is not found. Thus, in the CAAC-OS film, a reduction in electron mobility due to the grain boundary is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystal parts is not necessarily uniform. For example, in the formation process of the CAAC-OS film, in the case where crystal growth occurs from a surface side of the oxide semiconductor film, the ratio of crystal parts in the vicinity of the surface of the oxide semiconductor film is higher than that in the vicinity of the surface where the oxide semiconductor film is formed in some cases. Further, when an impurity or the like is added to the CAAC-OS film, the crystal part in a region to which the impurity is added becomes amorphous in some cases.

Since the c-axes of the crystal parts included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film, drifting in the electric characteristics of a transistor due to irradiation with visible light or ultraviolet light can be reduced. Thus, a highly reliable transistor can be fabricated.

An example of a crystalline structure included in the CAAC-OS film will be described in detail with reference to FIGS. 7A to 7E, FIGS. 8A to 8C, FIGS. 9A to 9C, and FIGS. 10A and 10B. In FIGS. 7A to 7E, FIGS. 8A to 8C, FIGS. 9A to 9C, and FIGS. 10A and 10B, the vertical direction corresponds to the c-axis direction and a plane perpendicular to the c-axis direction corresponds to the a-b plane, unless otherwise specified. When the expressions "an upper half" and "a lower half" are simply used, they refer to an upper half above the a-b plane and a lower half below the a-b plane (an upper half and a lower half with respect to the a-b plane). Furthermore, in FIGS. 7A to 7E, O surrounded by a circle represents a tetracoordinate O atom and a double circle represents a tricoordinate O atom.

Figure 7A:
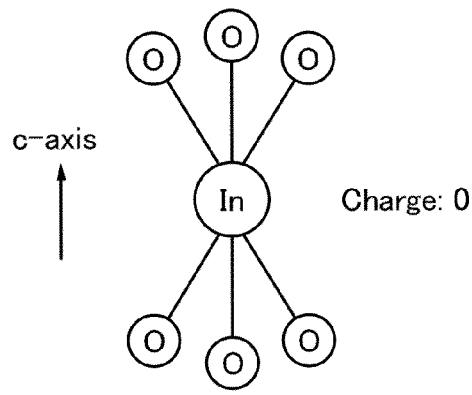
FIGS. 7A to 7E are diagrams of crystal structures of an oxide material which can be used for a transistor.

FIG. 7A shows a structure including one hexacoordinate In atom and six tetracoordinate oxygen (hereinafter referred to as tetracoordinate O) atoms proximate to the In atom. Here, a structure including one metal atom and oxygen atoms proximate thereto is referred to as a small group. The structure in FIG. 7A is actually an octahedral structure, but is shown as a planar structure for simplicity. Note that three tetracoordinate O atoms exist in each of an upper half and a lower half in FIG. 7A. In the small group shown in FIG. 7A, total electric charge is 0.

Figure 7D:
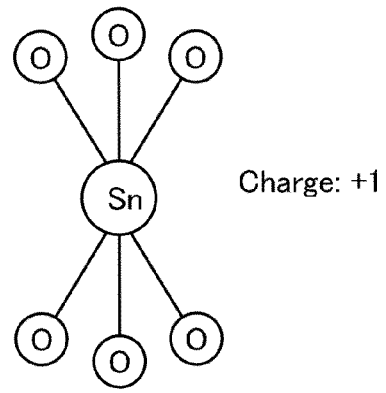
Figure 7B:
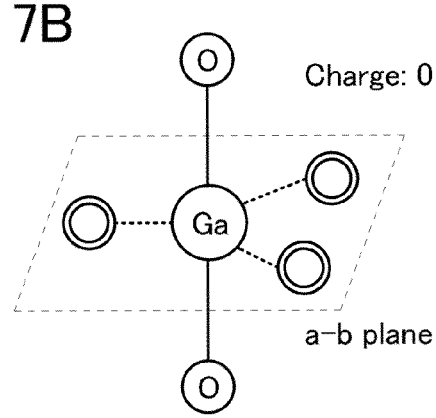

FIG. 7B shows a structure including one pentacoordinate Ga atom, three tricoordinate oxygen (hereinafter referred to as tricoordinate O) atoms proximate to the Ga atom, and two tetracoordinate O atoms proximate to the Ga atom. All the tricoordinate O atoms exist on the a-b plane. One tetracoordinate O atom exists in each of an upper half and a lower half in FIG. 7B. An In atom can also have the structure shown in FIG. 7B because an In atom can have five ligands. In the small group shown in FIG. 7B, total electric charge is 0.

Figure 7E:
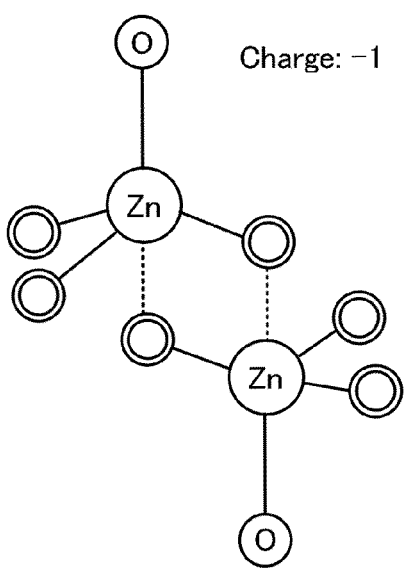
Figure 7C:
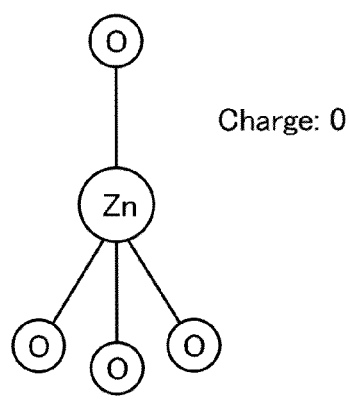

FIG. 7C shows a structure including one tetracoordinate Zn atom and four tetracoordinate O atoms proximate to the Zn atom. In FIG. 7C, one tetracoordinate O atom exists in an upper half and three tetracoordinate O atoms exist in a lower half. Alternatively, three tetracoordinate O atoms may exist in the upper half and one tetracoordinate O atom may exist in the lower half in FIG. 7C. In the small group shown in FIG. 7C, total electric charge is 0.

FIG. 7D shows a structure including one hexacoordinate Sn atom and six tetracoordinate O atoms proximate to the Sn atom. In FIG. 7D, three tetracoordinate O atoms exist in each of an upper half and a lower half In the small group shown in FIG. 7D, total electric charge is +1.

FIG. 7E shows a small group including two Zn atoms. In FIG. 7E, one tetracoordinate O atom exists in each of an upper half and a lower half. In the small group shown in FIG. 7E, total electric charge is −1.

Here, a plurality of small groups form a medium group, and a plurality of medium groups form a large group.

Now, a rule of bonding between the small groups will be described. The three O atoms in the upper half with respect to the hexacoordinate In atom in FIG. 7A each have three proximate In atoms in the downward direction, and the three O atoms in the lower half each have three proximate In atoms in the upward direction. The one O atom in the upper half with respect to the pentacoordinate Ga atom in FIG. 7B has one proximate Ga atom in the downward direction, and the one O atom in the lower half has one proximate Ga atom in the upward direction. The one O atom in the upper half with respect to the tetracoordinate Zn atom in FIG. 7C has one proximate Zn atom in the downward direction, and the three O atoms in the lower half each have three proximate Zn atoms in the upward direction. Similarly, the number of the tetracoordinate O atoms below the metal atom is equal to the number of the metal atoms proximate to and above each of the tetracoordinate O atoms. Since the coordination number of the tetracoordinate O atom is four, the sum of the number of the metal atoms proximate to and below the O atom and the number of the metal atoms proximate to and above the O atom is four. Therefore, when the sum of the number of tetracoordinate O atoms above a metal atom and the number of tetracoordinate O atoms below another metal atom is four, the two kinds of small groups including the metal atoms can be bonded. For example, in the case where the hexacoordinate metal (In or Sn) atom is bonded through three tetracoordinate O atoms in the upper half, it is bonded to the pentacoordinate metal (Ga or In) atom or the tetracoordinate metal (Zn) atom.

A metal atom having the above coordination number is bonded to another metal atom having the above coordination number through a tetracoordinate O atom in the c-axis direction. In addition to the above, a medium group can be formed in a different manner by combining a plurality of small groups so that the total electric charge of the layered structure is 0.

Figure 8A:
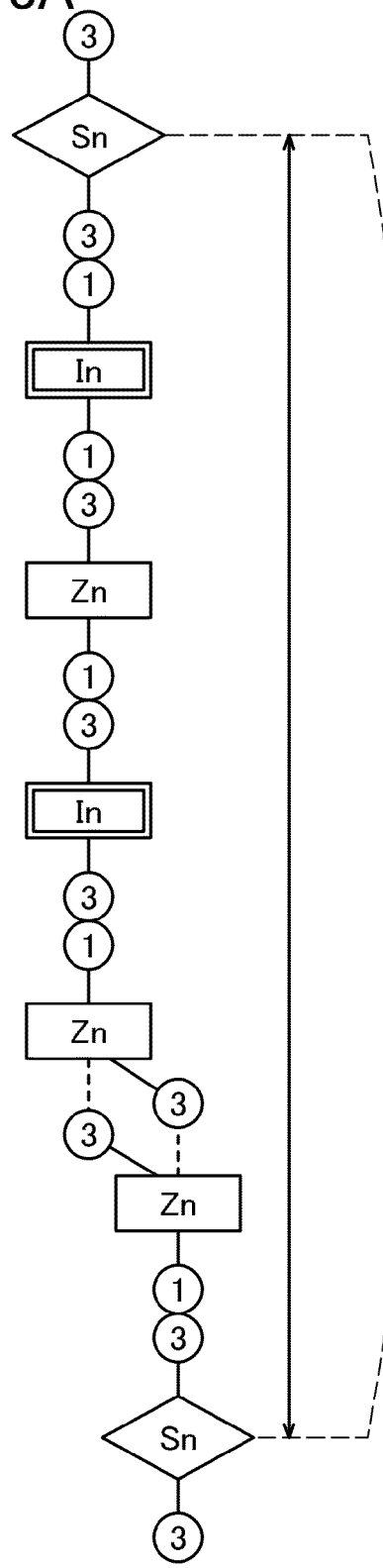
FIGS. 8A to 8C are diagrams of a crystal structure of an oxide material which can be used for a transistor.
Figure 8B:
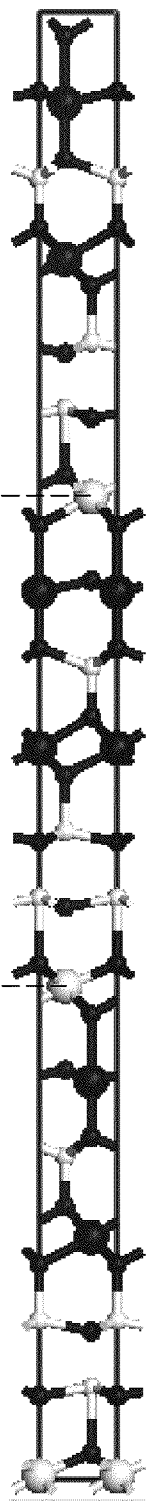
Figure 8C:

FIG. 8A shows a model of a medium group included in a layered structure of an In—Sn—Zn—O system oxide. FIG. 8B shows a large group including three medium groups. Note that FIG. 8C shows an atomic arrangement in the case where the layered structure in FIG. 8B is observed from the c-axis direction.

In FIG. 8A, for simplicity, a tricoordinate O atom is omitted and tetracoordinate O atoms are shown by a circle; the number in the circle shows the number of tetracoordinate O atoms. For example, three tetracoordinate O atoms existing in each of an upper half and a lower half with respect to a Sn atom are denoted by circled 3. Similarly, in FIG. 8A, one tetracoordinate O atom existing in each of an upper half and a lower half with respect to an In atom is denoted by circled 1. FIG. 8A also shows a Zn atom proximate to three tetracoordinate O atoms in an upper half and one tetracoordinate O atom in a lower half, and a Zn atom proximate to one tetracoordinate O atom in an upper half and three tetracoordinate O atoms in a lower half.

In the medium group included in the layered structure of an In—Sn—Zn—O system oxide in FIG. 8A, in the order starting from the top, a Sn atom proximate to three tetracoordinate O atoms in each of an upper half and a lower half is bonded to an In atom proximate to one tetracoordinate O atom in each of an upper half and a lower half, the In atom is bonded to a Zn atom proximate to three tetracoordinate O atoms in an upper half, the Zn atom is bonded to an In atom proximate to three tetracoordinate O atoms in each of an upper half and a lower half through one tetracoordinate O atom in a lower half with respect to the Zn atom, the In atom is bonded to a small group that includes two Zn atoms and is proximate to one tetracoordinate O atom in an upper half, and the small group is bonded to a Sn atom proximate to three tetracoordinate O atoms in each of an upper half and a lower half through one tetracoordinate O atom in a lower half with respect to the small group. A plurality of such medium groups are bonded, so that a large group is formed.

Here, electric charge for one bond of a tricoordinate O atom and electric charge for one bond of a tetracoordinate O atom can be assumed to be −0.667 and −0.5, respectively. For example, electric charge of a (hexacoordinate or pentacoordinate) In atom, electric charge of a (tetracoordinate) Zn atom, and electric charge of a (pentacoordinate or hexacoordinate) Sn atom are +3, +2, and +4, respectively. Accordingly, total electric charge in a small group including a Sn atom is +1. Therefore, electric charge of −1, which cancels +1, is needed to form a layered structure including a Sn atom. As a structure having electric charge of −1, the small group including two Zn atoms as shown in FIG. 7E can be given. For example, with one small group including two Zn atoms, electric charge of one small group including a Sn atom can be cancelled, so that the total electric charge of the layered structure can be 0.

When the large group shown in FIG. 8B is repeated, a crystal of an In—Sn—Zn—O system oxide ($In_2SnZn_3O_8$) can be obtained. Note that the layered structure of an In—Sn—Zn—O system oxide which is obtained can be expressed as a composition formula, $In_2SnZn_2O_7(ZnO)_m$ (m is 0 or a natural number).

The above-described rule also applies to the following oxides: a four-component metal oxide such as an In—Sn—Ga—Zn—O system oxide; a three-component metal oxide such as an In—Ga—Zn—O system oxide (also referred to as IGZO), an In—Al—Zn—O system oxide, a Sn—Ga—Zn—O system oxide, an Al—Ga—Zn—O system oxide, a Sn—Al—Zn—O system oxide, an In—Hf—Zn—O system oxide, an In—La—Zn—O system oxide, an In—Ce—Zn—O system oxide, an In—Pr—Zn—O system oxide, an In—Nd—Zn—O system oxide, an In—Sm—Zn—O system oxide, an In—Eu—Zn—O system oxide, an In—Gd—Zn—O system oxide, an In—Tb—Zn—O system oxide, an In—Dy—Zn—O system oxide, an In—Ho—Zn—O system oxide, an In—Er—Zn—O system oxide, an In—Tm—Zn—O system oxide, an In—Yb—Zn—O system oxide, or an In—Lu—Zn—O system oxide; a two-component metal oxide such as an In—Zn—O system oxide, a Sn—Zn—O system oxide, an Al—Zn—O system oxide, a Zn—Mg—O system oxide, a Sn—Mg—O system oxide, an In—Mg—O system oxide, or an In—Ga—O system oxide; and the like.

As an example, FIG. 9A shows a model of a medium group included in a layered structure of an In—Ga—Zn—O system oxide.

In the medium group included in the layered structure of an In—Ga—Zn—O system oxide in FIG. 9A, in the order starting from the top, an In atom proximate to three tetracoordinate O atoms in each of an upper half and a lower half is bonded to a Zn atom proximate to one tetracoordinate O atom in an upper half, the Zn atom is bonded to a Ga atom proximate to one tetracoordinate O atom in each of an upper half and a lower half through three tetracoordinate O atoms in a lower half with respect to the Zn atom, and the Ga atom is bonded to an In atom proximate to three tetracoordinate O atoms in each of an upper half and a lower half through one tetracoordinate O atom in a lower half with respect to the Ga atom. A plurality of such medium groups are bonded to form a large group.

FIG. 9B shows a large group including three medium groups. Note that FIG. 9C shows an atomic arrangement in the case where the layered structure in FIG. 9B is observed from the c-axis direction.

Here, since electric charge of a (hexacoordinate or pentacoordinate) In atom, electric charge of a (tetracoordinate) Zn atom, and electric charge of a (pentacoordinate) Ga atom are +3, +2, +3, respectively, electric charge of a small group including any of an In atom, a Zn atom, and a Ga atom is 0. As a result, the total electric charge of a medium group having a combination of such small groups is always 0.

In order to form the layered structure of an In—Ga—Zn—O system oxide, a large group can be formed using not only the medium group shown in FIG. 9A but also a medium group in which the arrangement of the In atom, the Ga atom, and the Zn atom is different from that in FIG. 9A.

When the large group shown in FIG. 9B is repeated, a crystal of an In—Ga—Zn—O system oxide can be obtained. Note that the layered structure of an In—Ga—Zn—O system oxide which is obtained can be expressed as a composition formula, $InGaO_3(ZnO)_n$ (n is a natural number).

Figure 10A:
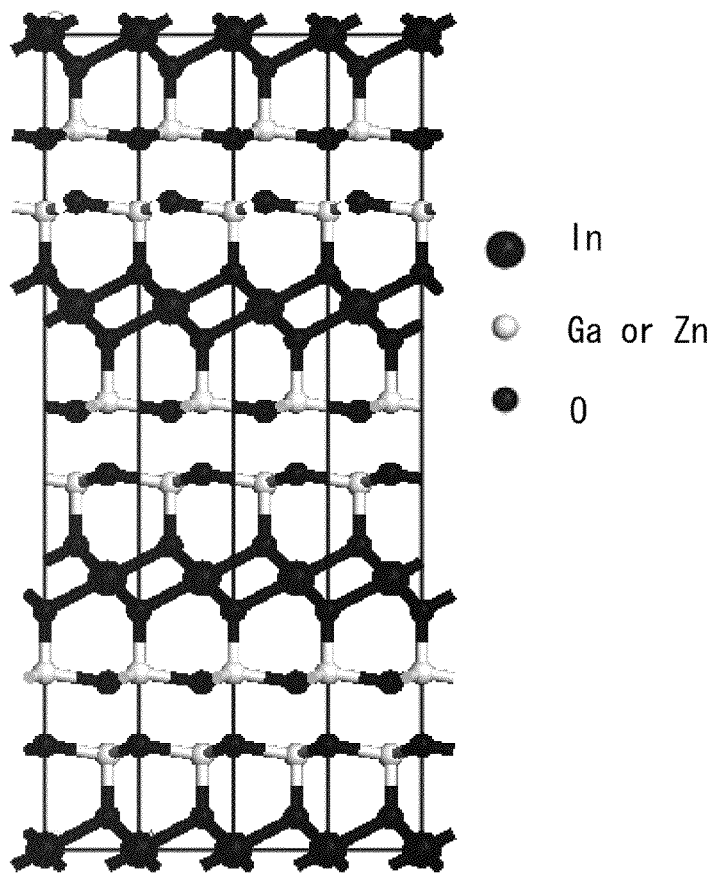
FIGS. 10A and 10B are diagrams of crystal structures of oxide materials which can be used for a transistor.

In the case where n=1 ($InGaZnO_4$), a crystal structure shown in FIG. 10A can be obtained, for example. Note that in the crystal structure in FIG. 10A, a Ga atom and an In atom each have five ligands as described with reference to FIG. 7B, a structure in which Ga is replaced with In can be obtained.

Figure 10B:
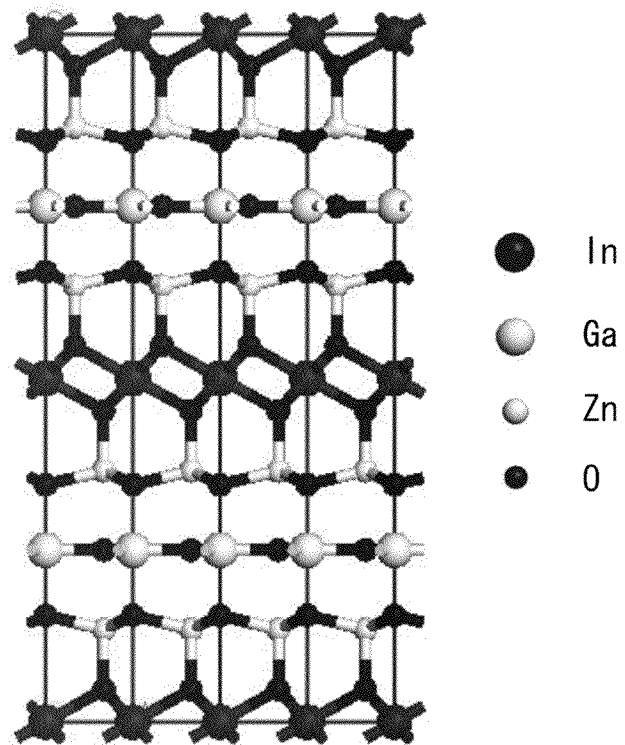

In the case where n=2 ($InGaZn_2O_5$), a crystal structure shown in FIG. 10B can be obtained, for example. Note that in the crystal structure in FIG. 10B, a Ga atom and an In atom each have five ligands as described with reference to FIG. 7B, a structure in which Ga is replaced with In can be obtained.

Here, a method for forming the CAAC-OS film will be described.

First, the oxide semiconductor layer is formed by a sputtering method or the like. Note that by forming an oxide semiconductor layer while keeping the surface where the oxide semiconductor layer is formed at high temperature, the ratio of a crystal part to an amorphous part can be high. At this time, the temperature of the surface where the oxide semiconductor layer is formed may be, for example, higher than or equal to 150° C. and lower than or equal to 450° C., preferably higher than or equal to 200° C. and lower than or equal to 350° C.

Here, the formed oxide semiconductor layer may be subjected to heat treatment. Through this heat treatment, the ratio of a crystal part to an amorphous part can be high. The temperature of this heat treatment is higher than or equal to 200° C. and lower than a temperature at which the surface where the oxide semiconductor layer is formed is not changed in quality or shape, preferably higher than or equal to 250° C. and lower than or equal to 450° C. The time for the heat treatment may be longer than or equal to 3 minutes, and preferably shorter than or equal to 24 hours. This is because the time for the heat treatment decreases the productivity although the ratio of a crystal part to an amorphous part can be high. Note that the heat treatment may be performed in an oxidation atmosphere or an inert atmosphere; however, there is no limitation thereon. This heat treatment may also be performed under a reduced pressure.

The oxidation atmosphere is an atmosphere containing an oxidizing gas. As an example of the oxidizing gas, oxygen, ozone, and nitrous oxide can be given. It is preferable that components (e.g., water and hydrogen) which are not preferably contained in the oxide semiconductor layer be removed from the oxidation atmosphere as much as possible. For example, the purity of oxygen, ozone, or nitrous oxide is higher than or equal to 8N (99.999999%), preferably higher than or equal to 9N (99.9999999%).

The oxidation atmosphere may be an inert gas such as a rare gas containing an oxidizing gas. Note that the oxidation atmosphere contains an oxidizing gas at a concentration of higher than or equal to 10 ppm. An inert atmosphere contains an inert gas (a nitrogen gas, a rare gas, or the like) and contains a reactive gas such as an oxidizing gas at a concentration of less than 10 ppm.

It is sufficient that a rapid thermal anneal (RTA) apparatus is used for all the heat treatments. With the use of an RTA apparatus, only in a short time, the heat treatments can be performed at high temperature. Thus, the oxide semiconductor layer in which the ratio of a crystal part to an amorphous part is high can be formed and a decrease in productivity can be suppressed.

However, the apparatus used for all the heat treatments is not limited to an RTA apparatus; for example, an apparatus provided with a unit that heats an object by thermal conduction or thermal radiation from a resistance heater or the like may be used. For example, an electric furnace or an RTA apparatus such as a gas rapid thermal anneal (GRTA) apparatus or a lamp rapid thermal anneal (LRTA) apparatus can be given as the heat treatment apparatus used for all the heat treatments. An LRTA apparatus is an apparatus for heating an object by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for heating an object using a high-temperature gas as a heat medium.

With the use of an In—Ga—Zn-based metal oxide in which the nitrogen concentration is higher than or equal to $1 \times 10^{17}$ atoms/cm$^3$ and lower than or equal to $5 \times 10^{19}$ atoms/cm$^3$, a metal oxide film having a c-axis-aligned hexagonal crystal structure is formed and one or more layers containing Ga and Zn are provided between two layers of the In—O crystal planes (crystal planes containing indium and oxygen).

In order to form an In—Sn—Zn-based metal oxide, for example, a target in which the atomic ratio of In:Sn:Zn is 1:2:2, 2:1:3, 1:1:1, or 20:45:35 may be used.

As described above, the CAAC-OS film can be formed. The CAAC-OS film has high orderliness of a bond between metal and oxygen as compared to an oxide semiconductor layer having an amorphous. In other words, in the case of an oxide semiconductor layer having an amorphous structure, the number of oxygen atoms coordinated around a metal atom may vary among atoms. In contrast, in the case of the CAAC-OS film, the number of oxygen atoms coordinated around a metal atom is substantially the same. Thus, oxygen deficiency is hardly observed even at a microscopic level, and electric charge transfer and instability of electric conductivity due to hydrogen atoms (including hydrogen ions), alkali metal atoms, or the like can be suppressed.

Thus, when a transistor in which a channel formation region is formed using a CAAC-OS film is formed, the amount of change in the threshold voltage of the transistor before and after light irradiation or a bias-temperature stress (BT) test performed on the transistor can be suppressed, and the transistor can have stable electric characteristics.

As the gate insulating layers 602(a) to 602(d), a film may be formed by, for example, a sputtering method using an insulating material (e.g., silicon nitride, silicon nitride oxide, silicon oxynitride, or silicon oxide). The gate insulating layers 602(a) to 602(d) may be formed to have a single-layer structure of a stacked-layer structure. A stacked-layer structure of two layers in which a silicon oxynitride layer is stacked over a silicon nitride layer is employed here, for example.

A transistor including an oxide semiconductor can have high field effect mobility.

Note that the field-effect mobility of a transistor including the actual oxide semiconductor is lower than the mobility of the bulk. Reduction of the mobility is caused by defects inside a semiconductor or defects at the interface between a semiconductor and an insulating layer. With the Levinson model, theoretical calculation of the field-effect mobility of the transistor on the assumption that no defects exist inside the semiconductor is possible.

Assuming that the original mobility and the measured field-effect mobility of a semiconductor are $\mu_0$ and $\mu$, respectively, and a potential barrier (such as a grain boundary) exists in the semiconductor, the measured field-effect mobility can be expressed as the following formula.

$$\mu = \mu_0 \exp\left(-\frac{E}{kT}\right) \qquad \text{[Formula 3]}$$

Here, E represents the height of the potential barrier, k represents the Boltzmann constant, and T represents the absolute temperature. Assuming that the potential barrier is attributed to a defect, the height of the potential barrier can be expressed as the following formula according to the Levinson model.

$$E = \frac{e^2 N^2}{8\varepsilon n} = \frac{e^3 N^2 t}{8\varepsilon C_{ox} V_g} \qquad \text{[Formula 4]}$$

Here, e represents the elementary charge, N represents the average defect density per unit area in a channel, $\varepsilon$ represents the permittivity of the semiconductor, n represents the number of carriers per unit area in the channel, $C_{ox}$ represents the capacitance per unit area, $V_g$ represents the gate voltage, and t represents the thickness of the channel. In the case where the thickness of the semiconductor layer is less than or equal to 30 nm, the thickness of the channel may be regarded as being the same as the thickness of the semiconductor layer.

The drain current $I_d$ in a linear region can be expressed as the following formula.

$$I_d = \frac{W\mu V_g V_d C_{ox}}{L} \exp\left(-\frac{E}{kT}\right) \quad \text{[Formula 5]}$$

Here, L represents the channel length and W represents the channel width, and L and W are each 10 μm. In addition, $V_d$ represents the drain voltage. When dividing both sides of the above equation by $V_g$ and then taking logarithms of both sides, the following formula can be obtained.

$$\ln\left(\frac{I_d}{V_g}\right) = \ln\left(\frac{W\mu V_d C_{ox}}{L}\right) - \frac{E}{kT} = \ln\left(\frac{W\mu V_d C_{ox}}{L}\right) - \frac{e^3 N^2 t}{8kT\varepsilon C_{ox} V_g} \quad \text{[Formula 6]}$$

The right side of Formula 6 is a function of $V_g$. From formula 6, it is found that the defect density N can be obtained from the slope of a line in which $\ln(I_d/V_g)$ is the ordinate and $1/V_g$ is the abscissa. That is, the defect density can be evaluated from the $I_d$-$V_g$ characteristics of the transistor. The defect density N of an oxide semiconductor in which the ratio of indium (In), tin (Sn), and zinc (Zn) is 1:1:1 is approximately $1\times10^{12}/\text{cm}^2$.

On the basis of the defect density obtained in this manner, or the like, $\mu_0$ can be calculated to be 120 cm²/Vs from Formula (3) and Formula (4). The measured mobility of an In—Sn—Zn oxide with defects is approximately 40 cm²/Vs. However, according to the calculated result, the mobility $\mu_0$ of the oxide semiconductor with no defects inside a semiconductor and at the interface between the semiconductor and an insulating layer is 120 cm²/Vs.

Note that a transport property of the transistor is affected by the scattering at the interface between a channel and a gate insulating layer even when no defect exists inside a semiconductor. In other words, the mobility $\mu_1$ at a position that is distance x away from the interface between the channel and the gate insulating layer can be expressed as the following Formula (7).

$$\frac{1}{\mu_1} = \frac{1}{\mu_0} + \frac{D}{B}\exp\left(-\frac{x}{l}\right) \quad \text{[Formula 7]}$$

Here, D represents the electric field in the gate direction, and B and l are constants. B and l can be obtained from actual measurement results; according to the above measurement results, B is $4.75\times10^7$ cm/s and/is 10 nm (the depth to which the influence of interface scattering reaches). When D is increased (i.e., when the gate voltage is increased), the second term of Formula 7 is increased and accordingly the mobility $\mu_1$ is decreased.

Figure 11:
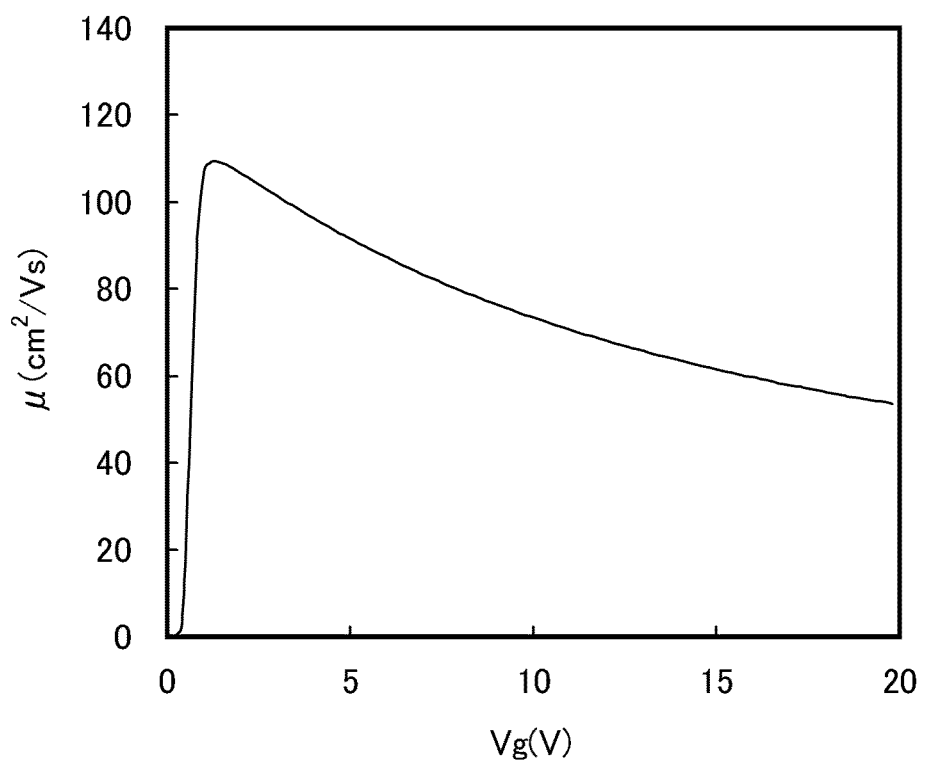
FIG. 11 shows the gate voltage dependence of mobility obtained by calculation.

FIG. 11 shows calculation results of the mobility of a transistor in which an ideal oxide semiconductor without a defect inside the semiconductor is used for a channel. For the calculation, device simulation software Sentaurus Device manufactured by Synopsys, Inc. was used, and the bandgap, the electron affinity, the relative permittivity, and the thickness of the oxide semiconductor were assumed to be 2.8 eV, 4.7 eV, 15, and 15 nm, respectively. In addition, the work functions of a gate, a source, and a drain were assumed to be 5.5 eV, 4.6 eV, and 4.6 eV, respectively. The thickness of a gate insulating layer was assumed to be 100 nm, and the relative permittivity thereof was assumed to be 4.1. The channel length and the channel width were each assumed to be 10 μm, and the drain voltage $V_d$ was assumed to be 0.1 V.

As shown in FIG. 11, the mobility has a peak of more than 100 cm²/Vs at a gate voltage that is a little over 1 V and is decreased as the gate voltage becomes higher because the influence of interface scattering is increased. Note that in order to reduce interface scattering, as described with reference to formula 1 and the like, it is preferable that a surface of the semiconductor layer be flat at the atomic level (atomic layer flatness).

Calculation results of characteristics of minute transistors which are manufactured using an oxide semiconductor having such a mobility are shown in FIGS. 12A to 12C, FIGS. 13A to 13C, and FIGS. 14A to 14C. FIGS. 15A and 15B show cross-sectional structures of the transistors used for the calculation. The transistors shown in FIGS. 15A and 15B each include a semiconductor region 303a and a semiconductor region 303c which have n⁺-type conductivity in an oxide semiconductor layer. In the calculation, the resistivity of the semiconductor region 303a and the semiconductor region 303c was $2\times10^{-3}$ Ωcm.

Figure 15A:
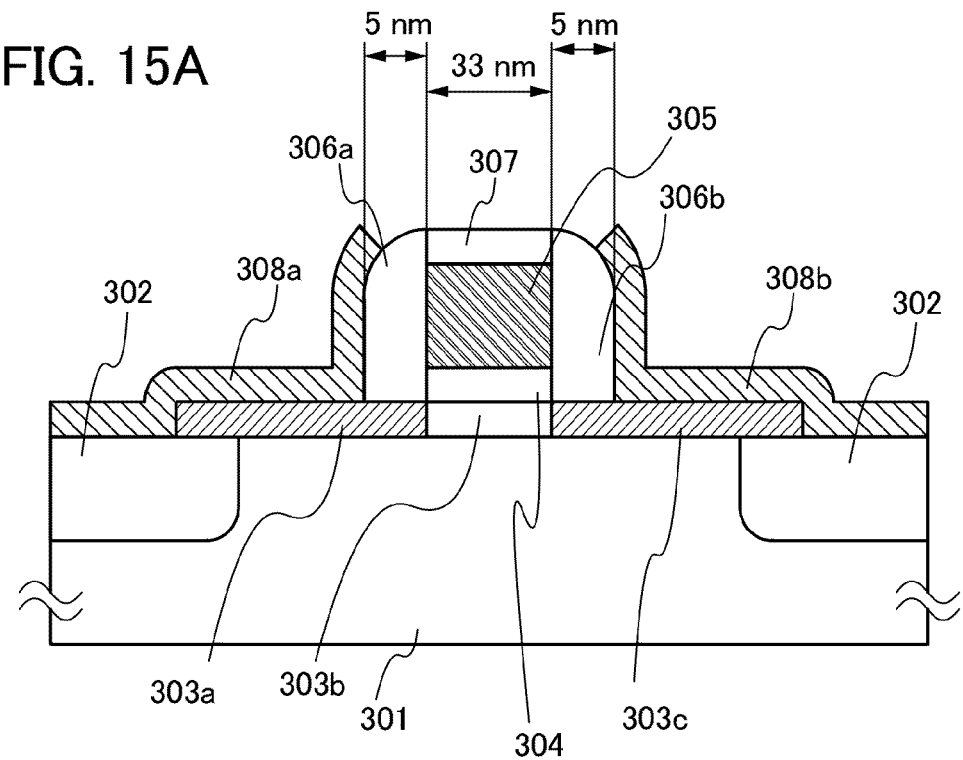
FIGS. 15A and 15B are diagrams of cross-sectional structures of transistors used for calculation.
Figure 15B:
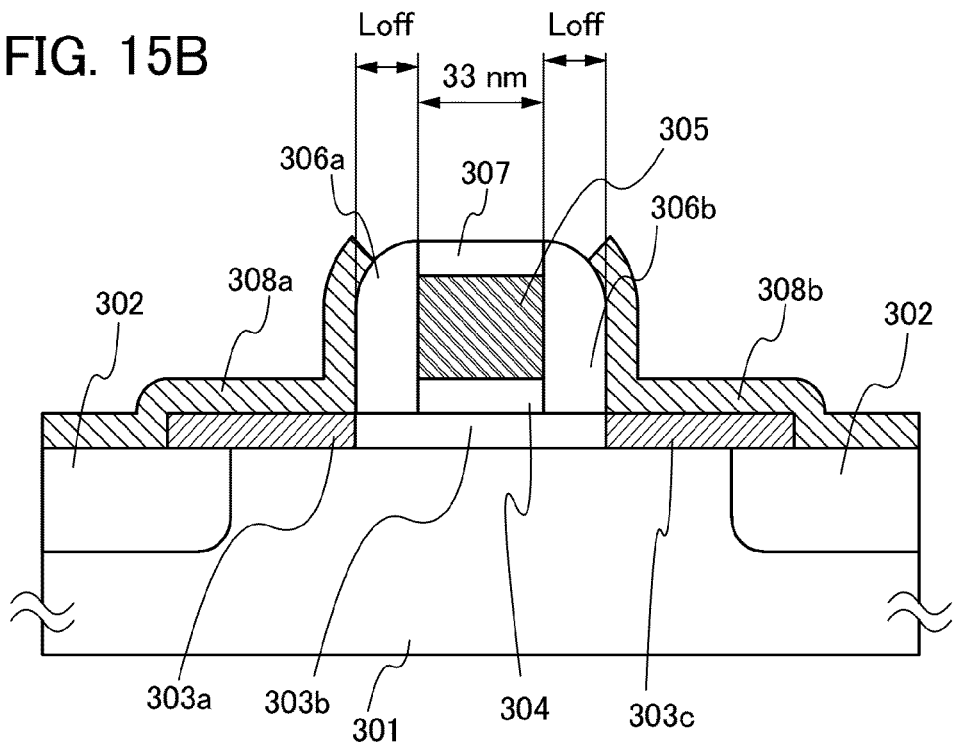
Figure 16A:
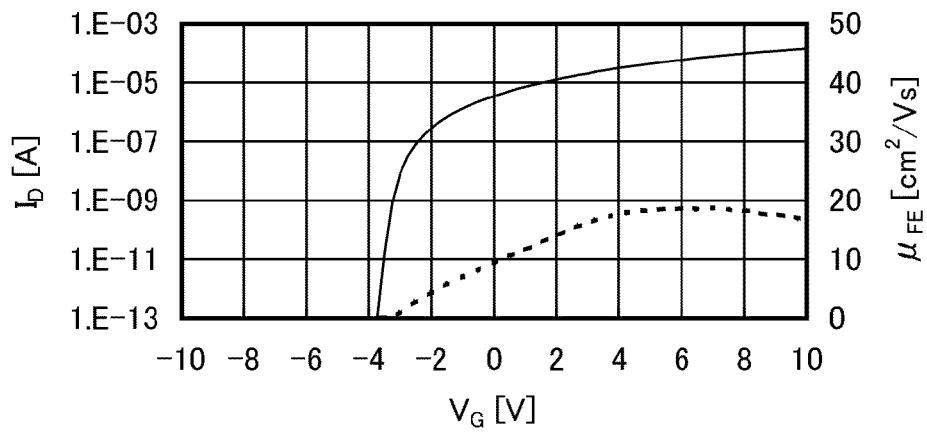
FIGS. 16A to 16C each show the characteristics of a transistor including an oxide semiconductor film.
Figure 16B:
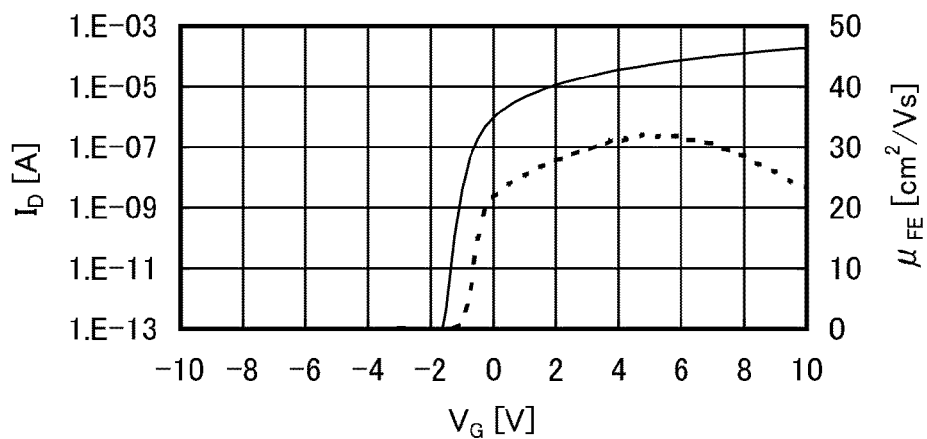

A transistor shown in FIG. 15A corresponds to FIG. 16A described in the above embodiment, and a transistor shown in FIG. 15B corresponds to FIG. 16B described in the above embodiment.

The transistor shown in FIG. 15A is formed over a base insulating layer 301 and an embedded insulator 302 which is embedded in the base insulating layer 301 and formed of aluminum oxide. The transistor includes the semiconductor region 303a, the semiconductor region 303c, an intrinsic semiconductor region 303b serving as a channel region therebetween, and a gate electrode 305. The width of the gate electrode 305 is 33 nm A gate insulating layer 304 is formed between the gate electrode 305 and the semiconductor region 303b. In addition, a sidewall insulator 306a and a sidewall insulator 306b are formed on both side surfaces of the gate electrode 305, and an insulating layer 307 is formed over the gate electrode 305 so as to prevent a short circuit between the gate electrode 305 and another wiring. The width of the sidewall insulator is 5 nm A source electrode 308a and a drain electrode 308b are provided in contact with the semiconductor region 303a and the semiconductor region 303c, respectively.

The transistor of FIG. 15B is the same as the transistor of FIG. 15A in that it is formed over the base insulating layer 301 and the embedded insulator 302 formed of aluminum oxide and that it includes the semiconductor region 303a, the semiconductor region 303c, the intrinsic semiconductor region 303b therebetween, the gate electrode 305 having a width of 33 nm, the gate insulating layer 304, the sidewall insulator 306a, the sidewall insulator 306b, the insulating layer 307, the source electrode 308a, and the drain electrode 308b.

The transistor shown in FIG. 15A is different from the transistor shown in FIG. 15B in the conductivity type of semiconductor regions which are directly below the sidewall insulator 306a and the sidewall insulator 306b. The semiconductor regions directly below the sidewall insulator 306a and the sidewall insulator 306b in the transistor shown in FIG. 15A are regions having n⁺-type conductivity. The semiconductor regions directly below the sidewall insulator 306a and the sidewall insulator 306b in the transistor shown in FIG. 15B are intrinsic semiconductor regions. In other words, in the semiconductor layer of FIG. 15B, a region having a width of $L_{off}$ which overlaps with neither the semiconductor region 303a (the semiconductor region 303c) nor the gate electrode 305 is provided. This region is called an offset region, and the width $L_{off}$ is called an offset length. The offset length is equal to the width of the sidewall insulator 306a (the sidewall insulator 306b).

Figure 12A:
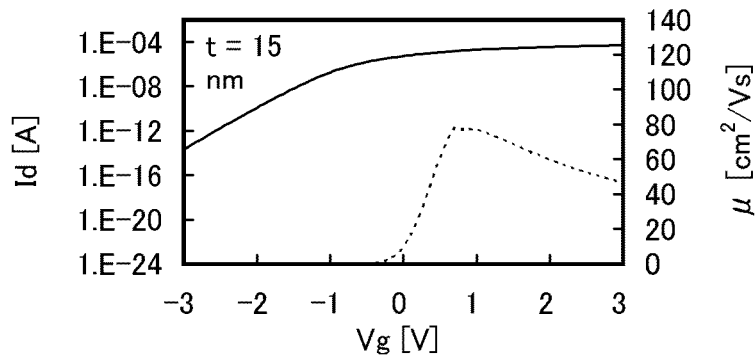
FIGS. 12A to 12C each show the gate voltage dependence of drain current and mobility obtained by calculation.
Figure 12B:
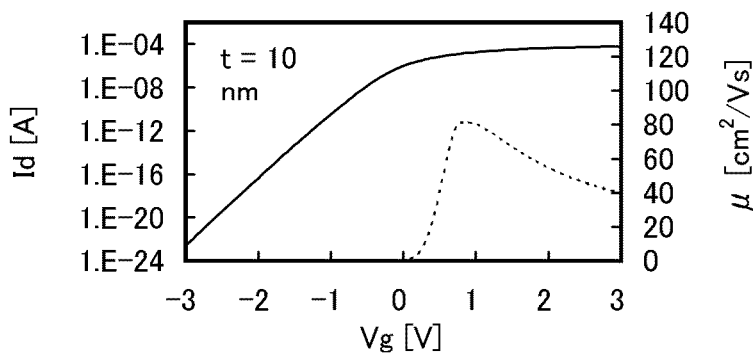
Figure 12C:
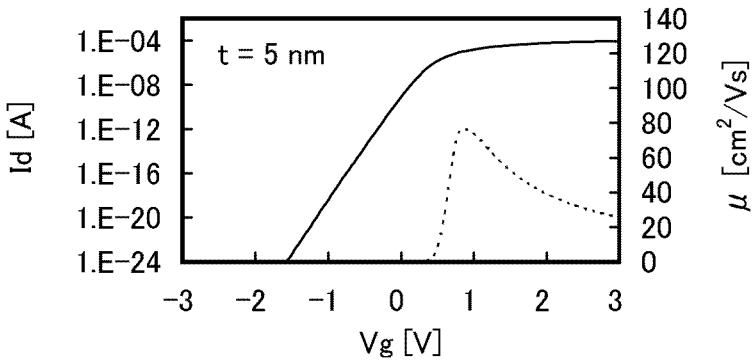

The other parameters used in calculation are as described above. For the calculation, device simulation software Sentaurus Device manufactured by Synopsys, Inc. was used. FIGS. 12A to 12C show the gate voltage ($V_g$: a potential difference between the gate and the source that is a reference potential) dependence of the drain current ($I_d$, a solid line) and the mobility (μ, a dotted line) of the transistor having the structure shown in FIG. 15A. The drain current $I_d$ is obtained by calculation under the assumption that the drain voltage $V_d$ (a potential difference between the drain and the source that is a reference potential) is +1 V, and the mobility μ is obtained by calculation under the assumption that the drain voltage $V_d$ is +0.1 V.

In FIG. 12A, the thickness of the gate insulating layer is 15 nm; in FIG. 12B, 10 nm; and in FIG. 12C, 5 nm As the gate insulating layer is thinner, the drain current $I_d$ (off-state current) particularly in an off state is significantly decreased. In contrast, there is no noticeable change in the peak value of the mobility μ and the drain current $I_d$ (on-state current) in an on state.

Figure 13A:
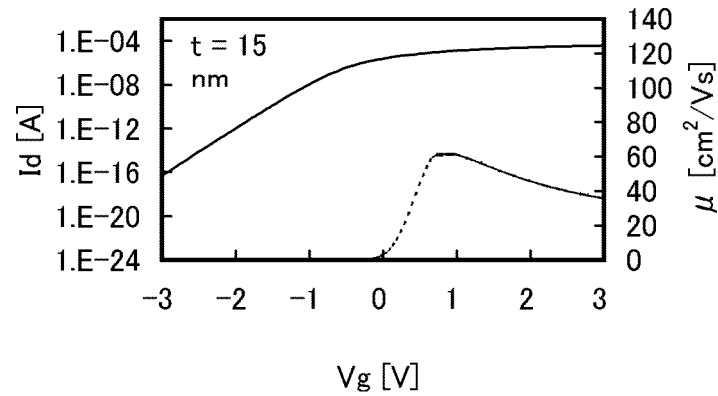
FIGS. 13A to 13C each show the gate voltage dependence of drain current and mobility obtained by calculation.
Figure 13B:
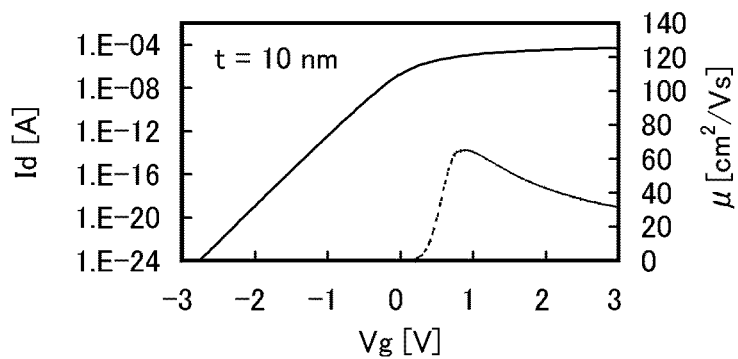
Figure 13C:
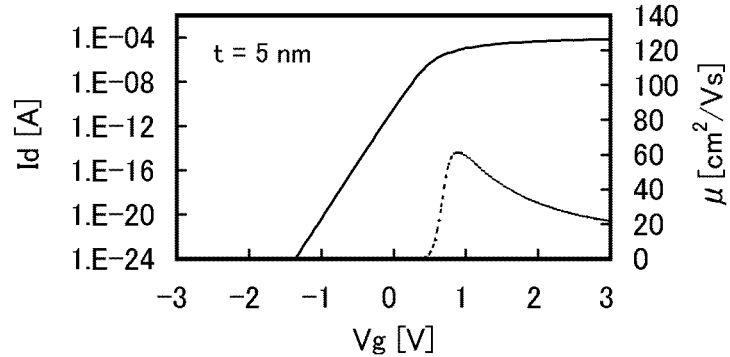

FIGS. 13A to 13C show the gate voltage $V_g$ dependence of the drain current $I_d$ (a solid line) and the mobility μ (a dotted line) of the transistor having the structure shown in FIG. 15B and where the offset length $L_{off}$ is 5 nm. The drain current $I_d$ is obtained by calculation under the assumption that the drain voltage is +1 V and the mobility μ is obtained by calculation under the assumption that the drain voltage is +0.1 V. In FIG. 13A, the thickness of the gate insulating layer is 15 nm; in FIG. 13B, 10 nm; and in FIG. 13C, 5 nm.

Figure 14A:
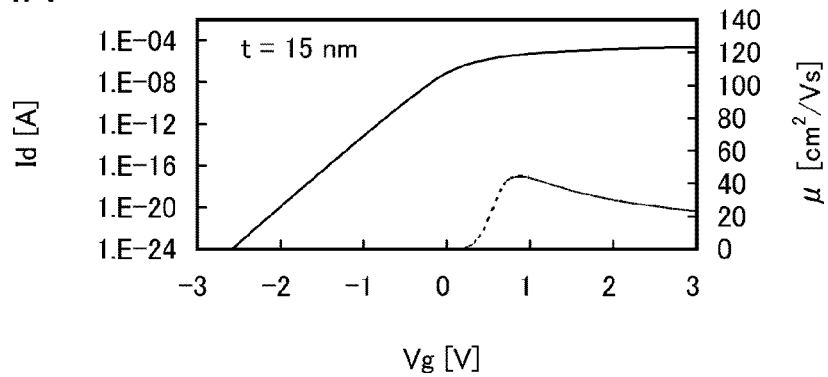
FIGS. 14A to 14C each show the gate voltage dependence of drain current and mobility obtained by calculation.
Figure 14B:
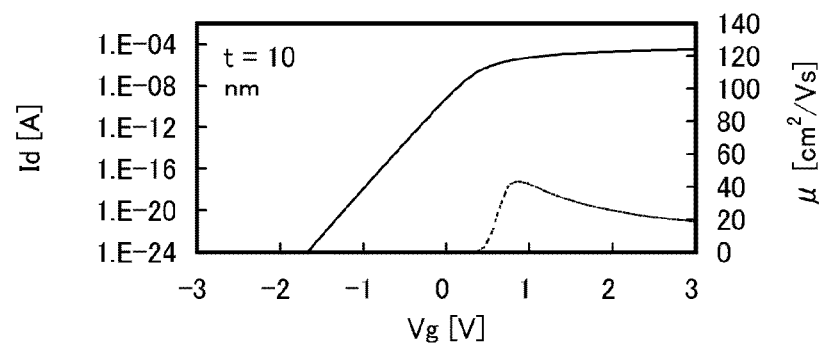
Figure 14C:
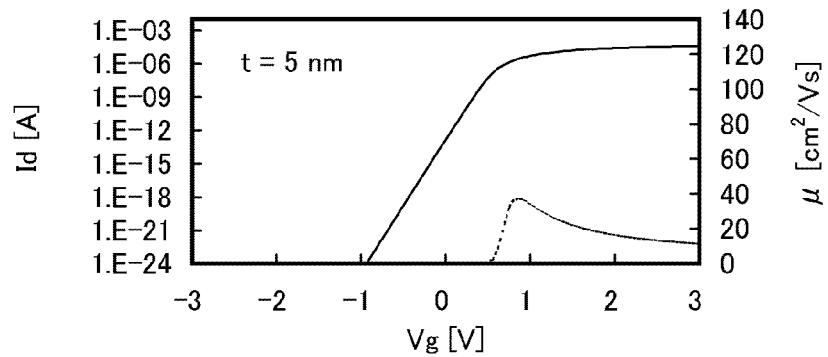

FIGS. 14A to 14C show the gate voltage dependence of the drain current $I_d$ (a solid line) and the mobility μ (a dotted line) of the transistor having the structure shown in FIG. 15B where the offset length $L_{off}$ is 15 nm. The drain current $I_d$ is obtained by calculation under the assumption that the drain voltage is +1 V and the mobility μ is obtained by calculation under the assumption that the drain voltage is +0.1 V. In FIG. 14A, the thickness of the gate insulating layer is 15 nm; in FIG. 14B, 10 nm; and in FIG. 14C, 5 nm In any of the structures, as the gate insulating layer is thinner, the off-state current is significantly decreased, whereas no noticeable change arises in the peak value of the mobility μ and the on-state current.

Note that the peak of the mobility μ is approximately 80 cm²/Vs in FIGS. 12A to 12C, approximately 60 cm²/Vs in FIGS. 13A to 13C, and approximately 40 cm²/Vs in FIGS. 14A to 14C; thus, the peak of the mobility μ is decreased as the offset length $L_{off}$ is increased. Further, the same applies to the off-state current. The on-state current is also decreased as the offset length $L_{off}$ is increased; however, the decrease in the on-state current is much more gradual than the decrease in the off-state current.

As described above, the mobility of a transistor in which an oxide semiconductor is included in a channel can be very high.

The transistor described in this embodiment as a transistor in which an oxide semiconductor is included in a channel is an example, and without limitation thereon, various modes can be employed for the transistor in which an oxide semiconductor is included in a channel.

A transistor in which an oxide semiconductor including In, Sn, and Zn as main components is used as a channel formation region can have favorable characteristics by forming the oxide semiconductor while heating a substrate or by performing heat treatment after an oxide semiconductor film is formed. Note that a main component refers to an element included in composition at 5 atomic % or more.

By intentionally heating the substrate after formation of the oxide semiconductor film including In, Sn, and Zn as main components, the field-effect mobility of the transistor can be improved. Further, the threshold voltage of the transistor can be positively shifted to make the transistor normally off.

Figure 16C:
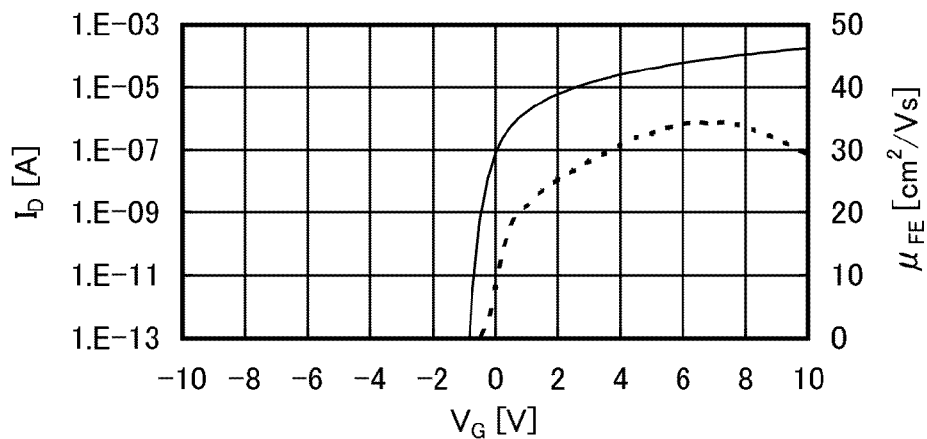

As an example, FIGS. 16A to 16C are graphs each showing characteristics of a transistor in which an oxide semiconductor film containing In, Sn, and Zn as main components and having a channel length L of 3 μm and a channel width W of 10 μm, and a gate insulating layer with a thickness of 100 nm are used. Note that $V_d$ was set to 10V.

FIG. 16A is a graph showing characteristics of a transistor whose oxide semiconductor film containing In, Sn, and Zn as main components was formed by a sputtering method without heating a substrate intentionally. The field-effect mobility of the transistor was 18.8 cm²/Vsec. On the other hand, when the oxide semiconductor film containing In, Sn, and Zn as main components is formed while heating the substrate intentionally, the field-effect mobility can be improved. FIG. 16B shows characteristics of a transistor whose oxide semiconductor film containing In, Sn, and Zn as main components was formed while heating a substrate at 200° C. The field-effect mobility of the transistor was 32.2 cm²/Vsec.

The field-effect mobility can be further improved by performing heat treatment after formation of the oxide semiconductor film containing In, Sn, and Zn as main components. FIG. 16C shows characteristics of a transistor whose oxide semiconductor film containing In, Sn, and Zn as main components was formed by sputtering at 200° C. and then subjected to heat treatment at 650° C. The field-effect mobility of the transistor was 34.5 cm²/Vsec.

The intentional heating of the substrate is expected to have an effect of reducing moisture taken into the oxide semiconductor film during the film formation by sputtering. Further, the heat treatment after film formation enables hydrogen, a hydroxyl group, or moisture to be released and removed from the oxide semiconductor film. In this manner, the field-effect mobility can be improved. Such an improvement in field-effect mobility is presumed to be achieved not only by removal of impurities by dehydration or dehydrogenation but also by a reduction in interatomic distance due to an increase in density. In addition, the oxide semiconductor can be crystallized by being highly purified by removal of impurities from the oxide semiconductor. In the case of using such a highly purified non-single-crystal oxide semiconductor, ideally, a field-effect mobility exceeding 100 cm²/Vsec is expected to be realized.

The oxide semiconductor containing In, Sn, and Zn as main components may be crystallized in the following manner: oxygen ions are implanted into the oxide semiconductor, hydrogen, a hydroxyl group, or moisture included in the oxide semiconductor is released by heat treatment, and the oxide semiconductor is crystallized through the heat treatment or by another heat treatment performed later. A non-single-crystal oxide semiconductor having favorable crystallinity can be obtained by such crystallization treatment or recrystallization treatment.

The intentional heating of the substrate during film formation and/or the heat treatment after the film formation contributes not only to improving field-effect mobility but also to making the transistor normally off. In a transistor in which an oxide semiconductor film which contains In, Sn, and Zn as main components and is formed without heating a substrate intentionally is used as a channel formation region, the threshold voltage tends to be negative. However, when the oxide semiconductor film formed while heating the substrate intentionally is used, the problem of the negative threshold voltage can be solved. That is, the threshold voltage is higher than that in the case where the channel formation layer is not heated; this tendency can be confirmed by comparison between FIGS. 16A and 16B.

Note that the threshold voltage can also be controlled by changing the ratio of In, Sn, and Zn; when the composition ratio of In, Sn, and Zn is 2:1:3, a normally off transistor is expected to be formed. In addition, an oxide semiconductor film having high crystallinity can be obtained by setting the composition ratio of a target as follows: In:Sn:Zn=2:1:3.

The temperature of the intentional heating of the substrate or the temperature of the heat treatment is 150° C. or higher, preferably 200° C. or higher, further preferably 400° C. or higher. When film formation or heat treatment is performed at a high temperature, the transistor can be normally off.

By intentionally heating the substrate during film formation and/or by performing heat treatment after the film formation, the stability against a gate-bias stress can be increased. For example, when a gate bias is applied with an electric field of 2 MV/cm at 150° C. for one hour, drift of the threshold voltage can be less than ±1.5 V, preferably less than ±1.0 V.

A BT test was performed on the following two transistors: Sample 1 on which heat treatment was not performed after formation of an oxide semiconductor film, and Sample 2 on which heat treatment at 650° C. was performed after formation of an oxide semiconductor film.

First, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, $V_g$ was applied so that the intensity of an electric field applied to gate insulating layer was 2 MV/cm, and the condition was kept for one hour. Next, $V_g$ was set to 0 V. Then, $V_g$-$I_d$ characteristics of the transistors were measured at a substrate temperature of 25° C. and $V_d$ of 10 V. This process is called a positive BT test.

In a similar manner, first, $V_g$-$I_d$ characteristics of the transistors were measured at a substrate temperature of 25° C. and $V_d$ of 10 V. Then, the substrate temperature was set to 150° C. and $V_d$ was set to 0.1 V. After that, $V_g$ of −20 V was applied so that the intensity of an electric field applied to the gate insulating layer was −2 MV/cm, and the condition was kept for one hour. Next, $V_g$ was set to 0 V. Then, $V_g$ $I_d$ characteristics of the transistors were measured at a substrate temperature of 25° C. and $V_d$ of 10 V. This process is called a negative BT test.

Figure 17A:
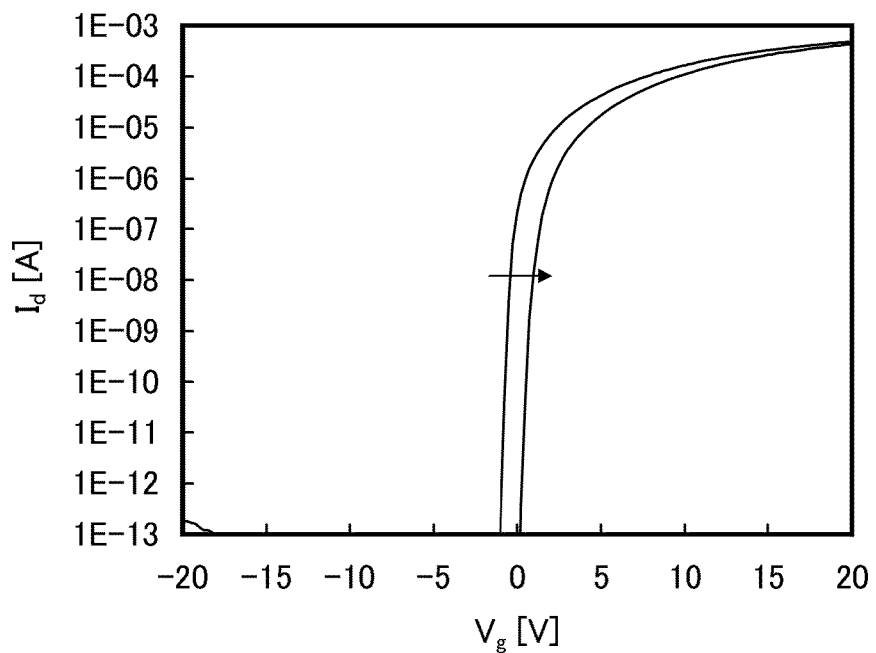
FIGS. 17A and 17B each show the gate voltage dependence of drain current after a BT test of a transistor of Sample 1.
Figure 17B:
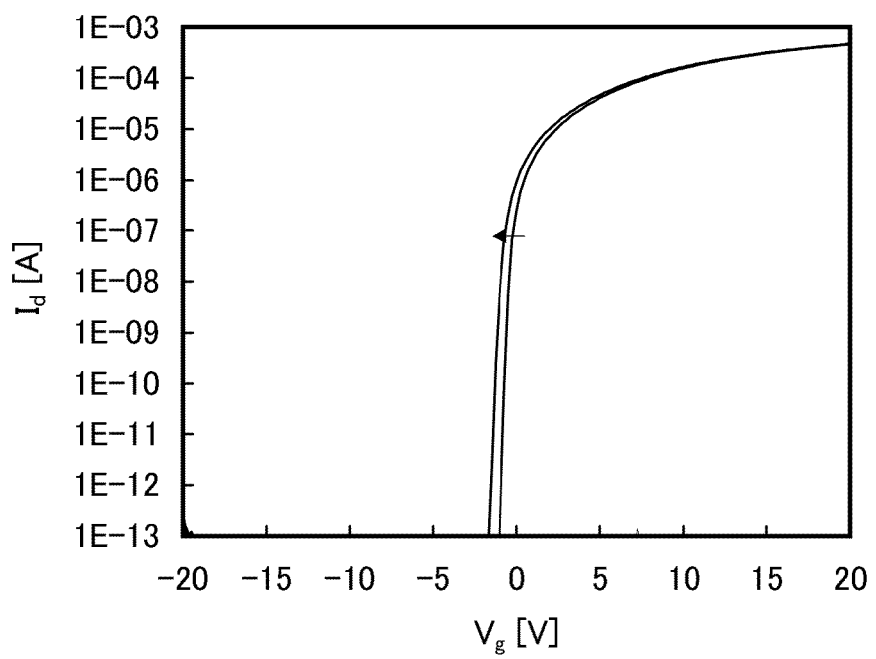
Figure 18A:
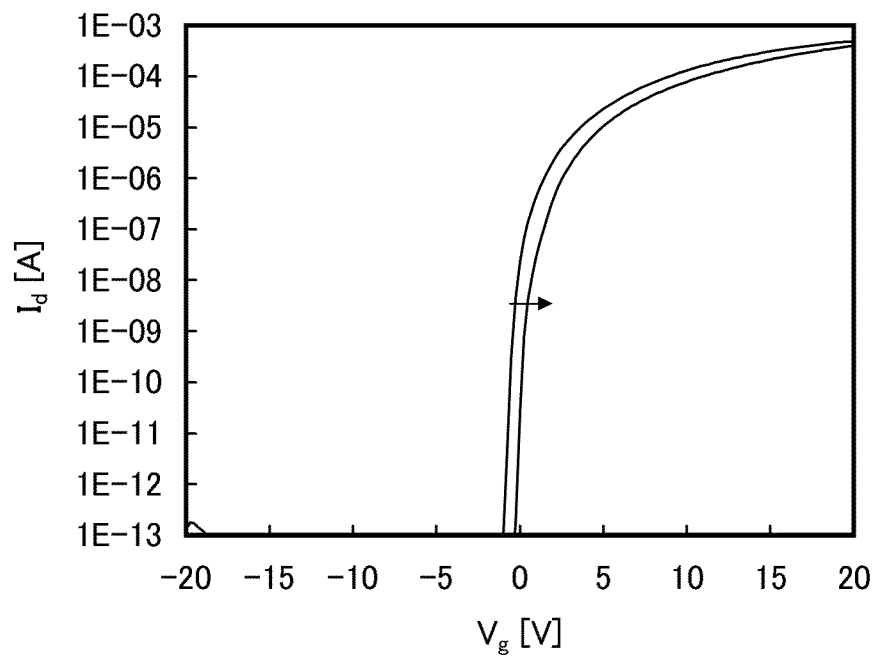
FIGS. 18A and 18B each show the gate voltage dependence of drain current after a BT test of a transistor of Sample 2.
Figure 18B:
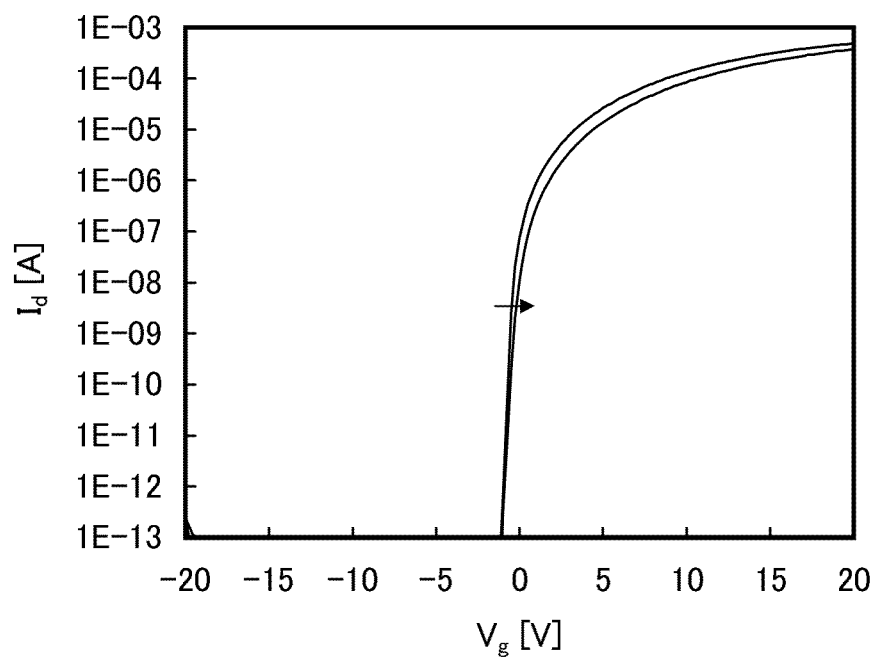

FIGS. 17A and 17B show results of the positive BT test and the negative BT test, respectively, of Sample 1. FIGS. 18A and 18B show results of the positive BT test and the negative BT test, respectively, of Sample 2.

The amount of change in threshold voltage of Sample 1 due to the positive BT test and that due to the negative BT test were 1.80 V and −0.42 V, respectively. The amount of change in threshold voltage of Sample 2 due to the positive BT test and that due to the negative BT test were 0.79 V and 0.76 V, respectively. It is found that, in each of Sample 1 and Sample 2, the amount of change in threshold voltage due to the BT tests is small and the reliability of each transistor is high.

The heat treatment can be performed in an oxygen atmosphere; alternatively, the heat treatment may be performed first in an atmosphere of nitrogen or an inert gas or under reduced pressure, and then in an atmosphere including oxygen. Oxygen is supplied to the oxide semiconductor after dehydration or dehydrogenation, whereby the effect of the heat treatment can be further increased. As a method for supplying oxygen after dehydration or dehydrogenation, a method in which oxygen ions are accelerated by an electric field and implanted into the oxide semiconductor film may be employed.

A defect due to oxygen deficiency is easily caused in the oxide semiconductor or at an interface between the oxide semiconductor and a film in contact with the oxide semiconductor; however, when excess oxygen is included in the oxide semiconductor by the heat treatment, oxygen deficiency caused constantly can be compensated for with excess oxygen. The excess oxygen is mainly oxygen existing between lattices. When the concentration of oxygen is set in the range of $1\times10^{16}/cm^3$ to $2\times10^{20}/cm^3$, excess oxygen can be included in the oxide semiconductor without causing crystal distortion or the like.

When heat treatment is performed so that at least part of the oxide semiconductor includes crystal, a more stable oxide semiconductor film can be obtained. For example, when an oxide semiconductor film which is formed by sputtering using a target having a composition ratio of In:Sn:Zn=1:1:1 without heating a substrate intentionally is analyzed by X-ray diffraction (XRD), a halo pattern is observed. The formed oxide semiconductor film can be crystallized by being subjected to heat treatment. The temperature of the heat treatment can be set as appropriate; when the heat treatment is performed at 650° C., for example, a clear diffraction peak can be observed in X-ray diffraction.

An XRD measurement of an In—Sn—Zn—O film was conducted. The XRD measurement was conducted using an X-ray diffractometer D8 ADVANCE manufactured by Bruker AXS, and measurement was performed by an out-of-plane method.

Sample A and Sample B were prepared and the XRD analysis was performed thereon. A method for manufacturing Sample A and Sample B will be described below.

An In—Sn—Zn—O film with a thickness of 100 nm was formed over a quartz substrate that had been subjected to dehydrogenation treatment.

The In—Sn—Zn—O film was formed with a sputtering apparatus with a power of 100 W (DC) in an oxygen atmosphere. An In—Sn—Zn—O target having an atomic ratio of In: Sn: Zn=1:1:1 was used as a target. Note that the substrate heating temperature in film formation was set at 200° C. A sample manufactured in this manner was used as Sample A.

Next, a sample manufactured by a method similar to that of Sample A was subjected to heat treatment at 650° C. As the heat treatment, heat treatment in a nitrogen atmosphere was first performed for one hour and heat treatment in an oxygen atmosphere was further performed for one hour without lowering the temperature. A sample manufactured in this manner was used as Sample B.

Figure 21:
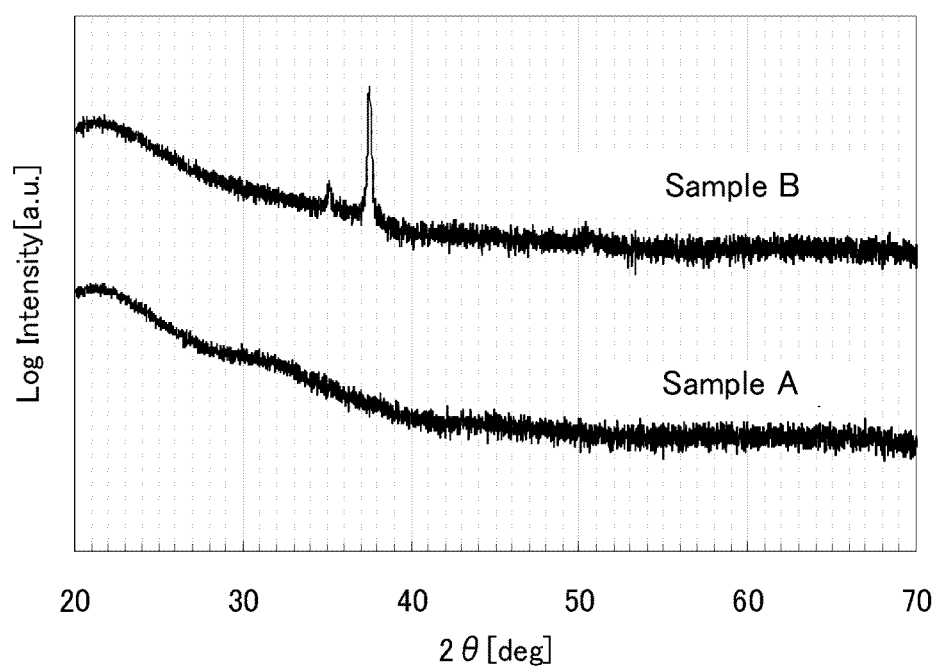
FIG. 21 shows XRD spectra of Sample A and Sample B.

FIG. 21 shows XRD spectra of Sample A and Sample B. No peak derived from crystal was observed in Sample A, whereas peaks derived from crystal were observed when 2θ was around 35 deg. and at 37 deg. to 38 deg. in Sample B.

As described above, by intentionally heating a substrate during film formation of an oxide semiconductor containing In, Sn, and Zn as main components and/or by performing heat treatment after the film formation, characteristics of a transistor can be improved.

These substrate heating and heat treatment have an effect of preventing hydrogen and a hydroxyl group, which are unfavorable impurities for an oxide semiconductor, from being included in the film or an effect of removing hydrogen and a hydroxyl group from the film. That is, an oxide semiconductor can be highly purified by removing hydrogen serving as a donor impurity from the oxide semiconductor, whereby a normally-off transistor can be obtained. The high purification of an oxide semiconductor enables the off-state current of the transistor to be 1 aA/μm or lower. Here, the unit of the off-state current represents current per micrometer of a channel width.

Figure 22:
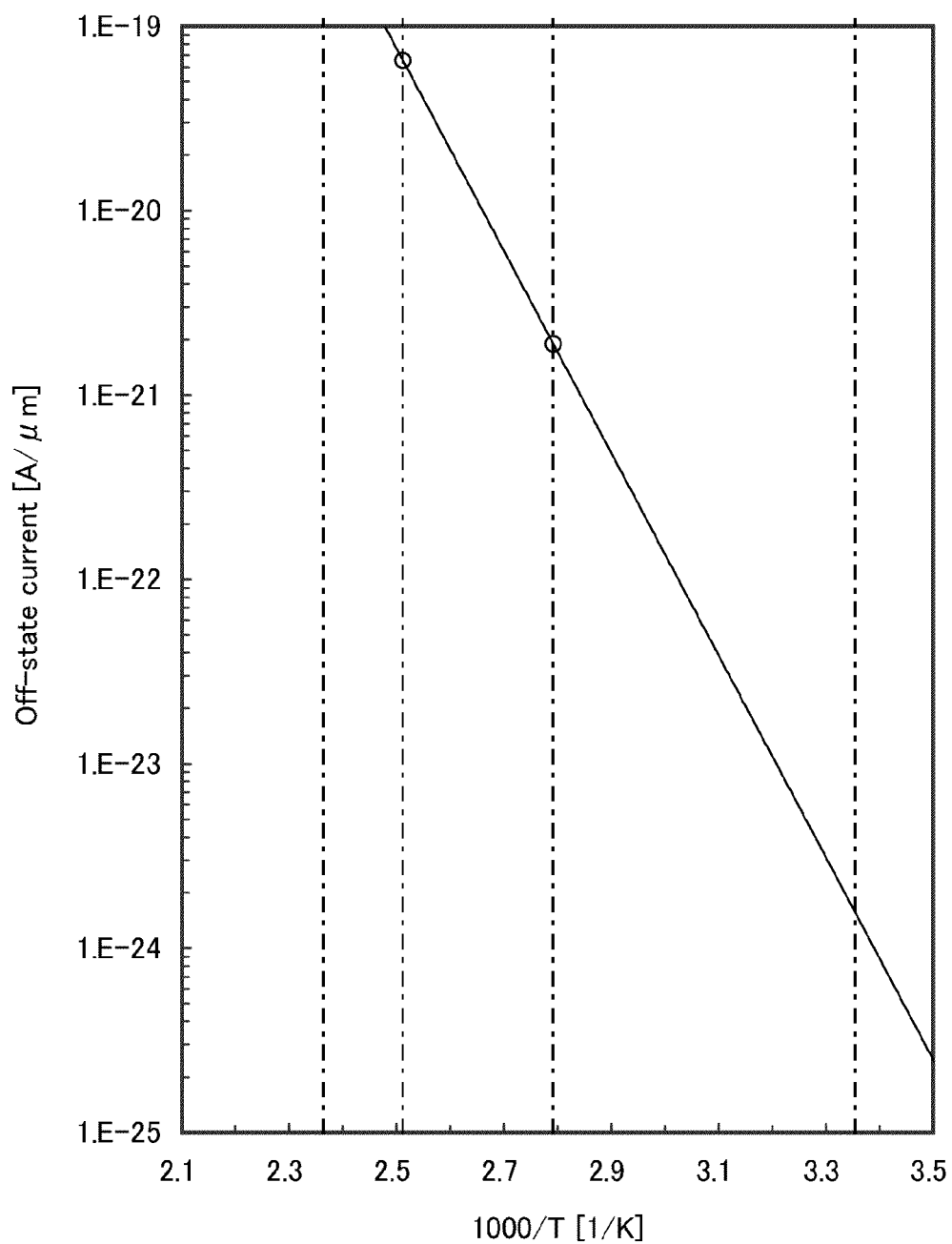
FIG. 22 shows the relation between off-state current and substrate temperature in measurement of a transistor.

FIG. 22 shows a relation between the off-state current of a transistor and the inverse of substrate temperature (absolute temperature) at measurement. Here, for simplicity, a value (1000/T) obtained by multiplying the inverse of substrate temperature at measurement by 1000 is indicated in the horizontal axis.

Specifically, as shown in FIG. 22, the off-state current can be 1 aA/μm ($1 \times 10^{-18}$ A/μm) or lower, 100 zA/μm ($1 \times 10^{-19}$ A/μm) or lower, and 1 zA/μm ($1 \times 10^{-21}$ A/μm) or lower when the substrate temperature is 125° C., 85° C., and room temperature (27° C.), respectively. Preferably, the off-state current can be 0.1 aA/μm ($1 \times 10^{-19}$ A/μm) or lower, 10 zA/μm ($1 \times 10^{-20}$ A/μm) or lower, and 0.1 zA/μm ($1 \times 10^{-22}$ A/μm) or lower at 125° C., 85° C., and room temperature, respectively.

Note that in order to prevent hydrogen and moisture from being included in the oxide semiconductor film during formation thereof, it is preferable to increase the purity of a sputtering gas by sufficiently suppressing leakage from the outside of a deposition chamber and degasification through an inner wall of the deposition chamber. For example, a gas with a dew point of −70° C. or lower is preferably used as the sputtering gas in order to prevent moisture from being included in the film. In addition, it is preferable to use a target which is highly purified so as not to include impurities such as hydrogen and moisture. Although it is possible to remove moisture from a film of an oxide semiconductor including In, Sn, and Zn as main components by heat treatment, a film which does not include moisture originally is preferably formed because moisture is released from the oxide semiconductor including In, Sn, and Zn as main components at a higher temperature than from an oxide semiconductor including In, Ga, and Zn as main components.

The relation between the substrate temperature and electric characteristics of a transistor of a sample, on which heat treatment at 650° C. was performed after formation of the oxide semiconductor film, was evaluated.

The transistor used for the measurement has a channel length L of 3 μm, a channel width W of 10 μm, Lov of 0 μm, and dW of 0 μm. Note that $V_d$ was set to 10 V. Note that the substrate temperature was −40° C., −25° C., 25° C., 75° C., 125° C., and 150° C. Here, in a transistor, the width of a portion where a gate electrode overlaps with one of a source electrode and a drain electrodes in the channel length direction is referred to as Lov.

Figure 19:
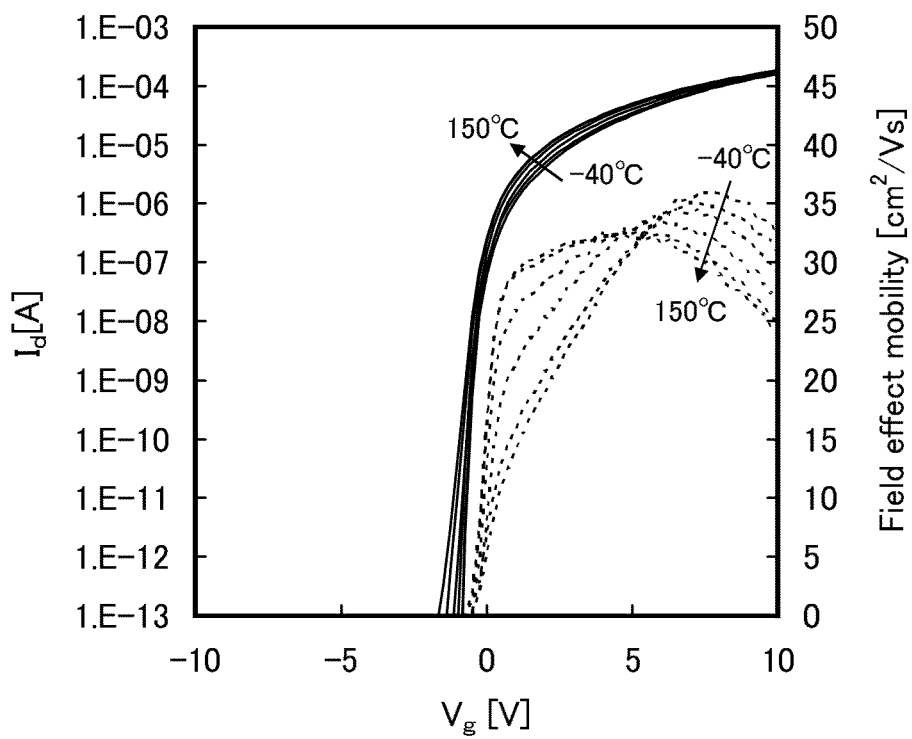
FIG. 19 shows the gate voltage dependence of drain current and mobility.
Figure 20A:
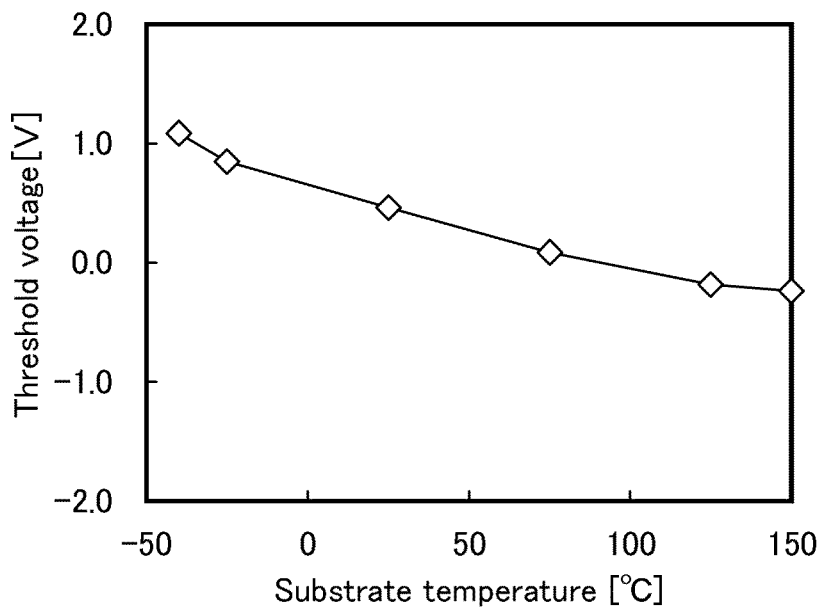
FIG. 20A shows the relation between substrate temperature and threshold voltage and FIG. 20B shows the relation between substrate temperature and field-effect mobility.

FIG. 19 shows the $V_g$ dependence of $I_d$ (a solid line) and field-effect mobility (a dotted line). FIG. 20A shows a relation between the substrate temperature and the threshold voltage, and FIG. 20B shows a relation between the substrate temperature and the field-effect mobility.

From FIG. 20A, it is found that the threshold voltage gets lower as the substrate temperature increases. Note that the threshold voltage is decreased from 1.09 V to −0.23 V in the range from −40° C. to 150° C.

Figure 20B:
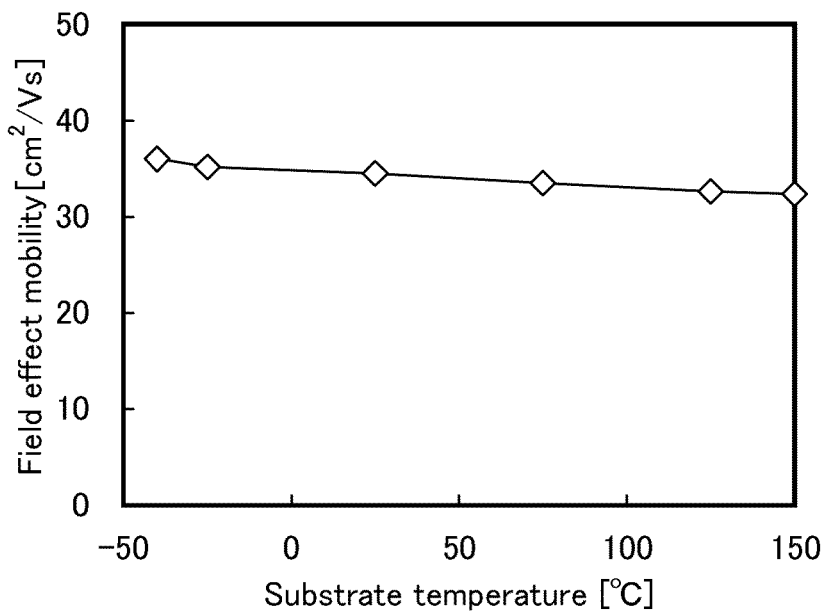

From FIG. 20B, it is found that the field-effect mobility gets lower as the substrate temperature increases. Note that the field-effect mobility is decreased from 36 cm²/Vs to 32 cm²/Vs in the range from −40° C. to 150° C. Thus, it is found that change in electric characteristics is small in the above temperature range.

In a transistor in which such an oxide semiconductor containing In, Sn, and Zn as main components is used as a channel formation region, a field-effect mobility of 30 cm²/Vsec or higher, preferably 40 cm²/Vsec or higher, further preferably 60 cm²/Vsec or higher can be obtained with the off-state current maintained at 1 aA/μm or lower, which can achieve on-state current needed for an LSI. For example, in an FET where L/W is 33 nm/40 nm, an on-state current of 12 μA or higher can flow when the gate voltage is 2.7 V and the drain voltage is 1.0 V. In addition, sufficient electrical characteristics can be ensured in a temperature range needed for operation of a transistor.

This embodiment can be combined with any of the other embodiments as appropriate.

Embodiment 3

In this embodiment, a configuration of a CPU, which is one of signal processing circuits according to one embodiment of the present invention, will be described.

Figure 24:
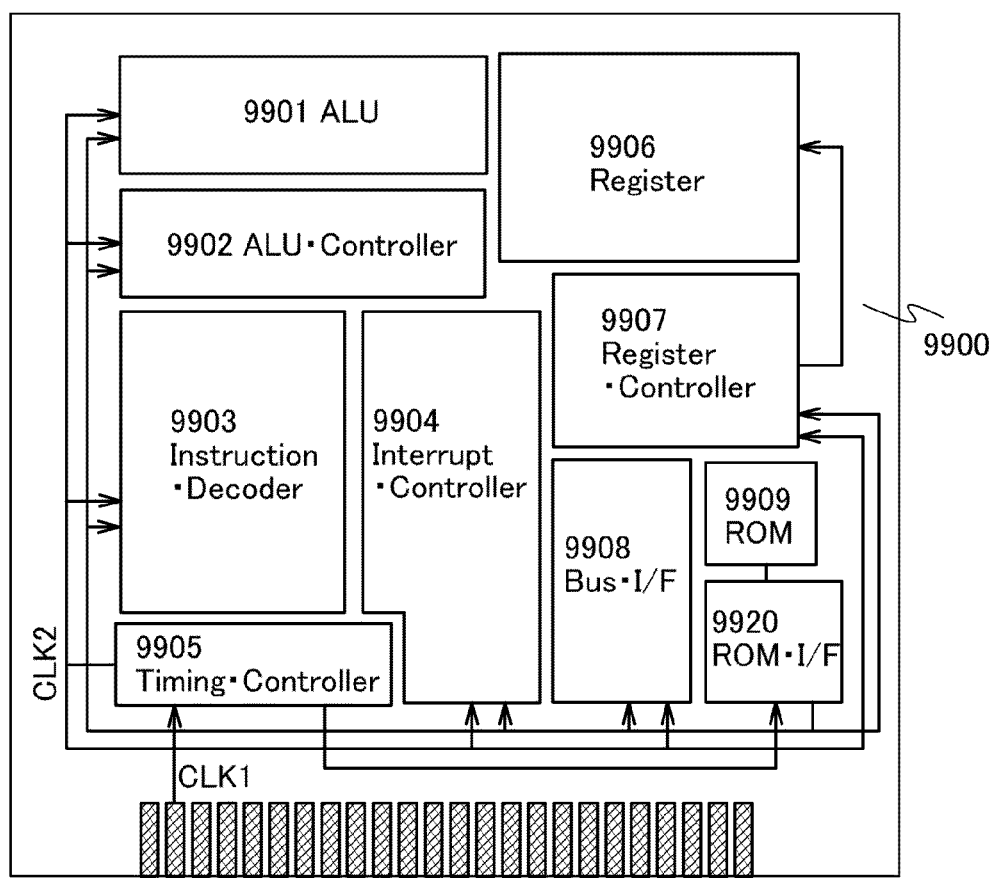
FIG. 24 is a diagram of a signal processing circuit according to one embodiment of the present invention.

FIG. 24 shows the configuration of the CPU of this embodiment. The CPU in FIG. 24 mainly includes an ALU) 9901, an ALU controller 9902, an instruction decoder 9903, an interrupt controller 9904, a timing controller 9905, a register 9906, a register controller 9907, a bus I/F 9908, a rewritable ROM 9909, and a ROM I/F 9920, over a substrate 9900. Note that "ALU" means "arithmetic logic unit", "bus I/F" means "bus interface", and "ROM I/F" means "ROM interface". Further, the ROM 9909 and the ROM I/F 9920 may be provided over another chip. Naturally, the CPU shown in FIG. 24 is only an example in which the configuration is simplified, and an actual CPU may have various configurations depending on the uses.

An instruction which is input to the CPU through the Bus I/F 9908 is input to the instruction decoder 9903 and decoded therein, and then, input to the ALU controller 9902, the interrupt controller 9904, the register controller 9907, and the timing controller 9905.

The ALU controller 9902, the interrupt controller 9904, the register controller 9907, and the timing controller 9905 perform various controls based on the decoded instruction. Specifically, the ALU controller 9902 generates signals for controlling the drive of the ALU 9901. While the CPU is executing a program, the interrupt controller 9904 processes an interrupt request from an external input/output device or a peripheral circuit based on its priority or a mask state. The register controller 9907 generates an address of the register 9906, and reads or writes data from/to the register 9906 depending on the state of the CPU.

The timing controller 9905 generates signals for controlling operation timings of the ALU 9901, the ALU controller 9902, the instruction decoder 9903, the interrupt controller 9904, and the register controller 9907. For example, the timing controller 9905 is provided with an internal clock generator for generating an internal clock signal CLK2 on the basis of a reference clock signal CLK1, and inputs the clock signal CLK2 to the above circuits.

In the CPU of this embodiment, a semiconductor memory device having the structure described in any of the above embodiments is provided in the register 9906. In response to an instruction from the ALU 9901, the register controller 9907 can stop the supply of power supply voltage in the semiconductor memory device of the register 9906 without the necessity of saving and returning a data signal.

In such a manner, even in the case where the operation of the CPU is temporarily stopped and the supply of the power supply voltage is stopped, a data signal can be held and power consumption can be reduced. Specifically, for example, while a user of a personal computer does not input data to an input device such as a keyboard, the operation of the CPU can be stopped, so that the power consumption can be reduced.

Although the example of the CPU is described in this embodiment, the signal processing circuit of the present invention is not limited to the CPU and can be applied to an LSI such as a microprocessor, an image processing circuit, a digital signal processor (DSP), or a field programmable gate array (FPGA).

This application is based on Japanese Patent Application serial no. 2011-114084 filed with Japan Patent Office on May 20, 2011, the entire contents of which are hereby incorporated by reference.

What is claimed is:

1. A semiconductor device comprising:
   a register circuit including a flip-flop circuit, a selection circuit, and a nonvolatile memory circuit electrically connected to the flip-flop circuit through the selection circuit;
   a bit line; and
   a data line,
   wherein the data line is electrically connected to the flip-flop circuit,
   wherein the bit line is electrically connected to the nonvolatile memory circuit through the selection circuit, and
   wherein the selection circuit selectively stores data, which is based on a potential of the data line or a potential of the bit line, in the nonvolatile memory circuit.

2. The semiconductor device according to claim 1, wherein the selection circuit selects any of a first operation mode for storing data based on a potential of the data line in the nonvolatile memory circuit through the flip-flop circuit, a second operation mode for supplying data stored in the nonvolatile memory circuit to the flip-flop circuit, a third operation mode for storing data based on the bit line in the nonvolatile memory circuit, and a fourth operation mode for supplying data stored in the nonvolatile memory circuit to the bit line.

3. The semiconductor device according to claim 1,
   wherein the nonvolatile memory circuit includes a transistor including an oxide semiconductor in a channel formation region and a capacitor including one electrode electrically connected to a first electrode of the transistor and the other electrode that is grounded, and
   wherein a potential of the data line or a potential of the bit line is stored in a node where the first electrode of the transistor and the one electrode of the capacitor are electrically connected to each other.

4. A semiconductor device comprising:
   a register circuit including a flip-flop circuit, a selection circuit, and a nonvolatile memory circuit electrically connected to the flip-flop circuit through the selection circuit;
   a bit line;
   a data line;
   a word line; and
   a memory write enable line,
   wherein the word line and the memory write enable line are electrically connected to the selection circuit,
   wherein the data line is electrically connected to the flip-flop circuit,
   wherein the bit line is electrically connected to the nonvolatile memory circuit through the selection circuit, and
   wherein the selection circuit includes a first switch for determining electrical connection between the nonvolatile memory circuit and the word line or the memory write enable line, and a second switch for determining electrical connection between the nonvolatile memory circuit and the data line or the bit line.

5. The semiconductor device according to claim 4, wherein the selection circuit selects any of a first operation mode for storing data based on a potential of the data line in the nonvolatile memory circuit through the flip-flop circuit, a second operation mode for supplying data stored in the nonvolatile memory circuit to the flip-flop circuit, a third operation mode for storing data based on the bit line in the nonvolatile memory circuit, and a fourth operation mode for supplying data stored in the nonvolatile memory circuit to the bit line.

6. The semiconductor device according to claim 4,
   wherein the nonvolatile memory circuit includes a transistor including an oxide semiconductor in a channel formation region and a capacitor including one electrode electrically connected to a first electrode of the transistor and the other electrode that is grounded, and
   wherein a potential of the data line or a potential of the bit line is stored in a node where the first electrode of the transistor and the one electrode of the capacitor are electrically connected to each other.

7. A semiconductor device comprising:
   a plurality of register circuits provided in a matrix;
   a bit line; and
   a data line,
   wherein each of the register circuits includes a flip-flop circuit, a selection circuit, and a nonvolatile memory circuit electrically connected to the flip-flop circuit through the selection circuit,
   wherein the data line is electrically connected to the flip-flop circuit,
   wherein the bit line is electrically connected to the nonvolatile memory circuit through the selection circuit, and
   wherein the selection circuit selectively stores data, which is based on a potential of the data line or a potential of the bit line, in the nonvolatile memory circuit.

8. The semiconductor device according to claim 7, wherein the selection circuit selects any of a first operation mode for storing data based on a potential of the data line in the nonvolatile memory circuit through the flip-flop circuit, a second operation mode for supplying data stored in the nonvolatile memory circuit to the flip-flop circuit, a third operation mode for storing data based on the bit line in the nonvolatile memory circuit, and a fourth operation mode for supplying data stored in the nonvolatile memory circuit to the bit line.

9. The semiconductor device according to claim 7,
   wherein the nonvolatile memory circuit includes a transistor including an oxide semiconductor in a channel formation region and a capacitor including one electrode electrically connected to a first electrode of the transistor and the other electrode that is grounded, and
   wherein a potential of the data line or a potential of the bit line is stored in a node where the first electrode of the transistor and the one electrode of the capacitor are electrically connected to each other.

10. A semiconductor device comprising:
    a plurality of register circuits provided in a matrix;
    a bit line;
    a data line;
    a word line; and
    a memory write enable line,
    wherein each of the register circuits includes a flip-flop circuit, a selection circuit, and a nonvolatile memory circuit electrically connected to the flip-flop circuit through the selection circuit, wherein the word line and the memory write enable line are electrically connected to the selection circuit, wherein the data line is electrically connected to the flip-flop circuit, wherein the bit line is electrically connected to the nonvolatile memory circuit through the selection circuit, and wherein the selection circuit includes a first switch for determining electrical connection between the nonvolatile memory circuit and the word line or the memory write enable line, and a second switch for determining electrical connection between the nonvolatile memory circuit and the data line or the bit line.

11. The semiconductor device according to claim 10, wherein the selection circuit selects any of a first operation mode for storing data based on a potential of the data line in the nonvolatile memory circuit through the flip-flop circuit, a second operation mode for supplying data stored in the nonvolatile memory circuit to the flip-flop circuit, a third operation mode for storing data based on the bit line in the nonvolatile memory circuit, and a fourth operation mode for supplying data stored in the nonvolatile memory circuit to the bit line.

12. The semiconductor device according to claim 10, wherein the nonvolatile memory circuit includes a transistor including an oxide semiconductor in a channel formation region and a capacitor including one electrode electrically connected to a first electrode of the transistor and the other electrode that is grounded, and wherein a potential of the data line or a potential of the bit line is stored in a node where the first electrode of the transistor and the one electrode of the capacitor are electrically connected to each other.

* * * * *